(12) United States Patent
Toshima et al.

(10) Patent No.: US 7,191,785 B2
(45) Date of Patent: Mar. 20, 2007

(54) SUBSTRATE PROCESSING APPARATUS FOR RESIST FILM REMOVAL

(75) Inventors: Takayuki Toshima, Yamanashi-Ken (JP); Kinya Ueno, Nirasaki (JP); Miyako Yamasaka, Yamanashi-ken (JP); Hideyuki Tsutsumi, Kawasaki (JP); Tadashi Iino, Nirasaki (JP); Yuji Kamikawa, Kumamoto-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/606,135

(22) Filed: Jun. 25, 2003

(65) Prior Publication Data
US 2005/0011537 A1    Jan. 20, 2005

Related U.S. Application Data

(63) Continuation of application No. 09/628,235, filed on Jul. 28, 2000, now Pat. No. 6,613,692.

(30) Foreign Application Priority Data

| Jul. 30, 1999 | (JP) | ................................. 11-216675 |
| Nov. 15, 1999 | (JP) | ................................. 11-323869 |
| Dec. 14, 1999 | (JP) | ................................. 11-354800 |
| Jan. 6, 2000 | (JP) | ................................. 2000-000982 |
| Jan. 25, 2000 | (JP) | ................................. 2000-015816 |
| Apr. 20, 2000 | (JP) | ................................. 2000-119249 |

(51) Int. Cl.
*B08B 3/10* (2006.01)

(52) U.S. Cl. ................ 134/58 R; 134/102.1; 134/105; 134/902

(58) Field of Classification Search .............. 134/58 R, 134/95.2, 98.1, 99.1, 102.1, 102.3, 105, 200, 134/902
See application file for complete search history.

(56) References Cited

U.S. PATENT DOCUMENTS

| 4,341,592 | A | * | 7/1982 | Shortes et al. .................. 134/2 |
| 4,917,123 | A | * | 4/1990 | McConnell et al. ....... 134/95.2 |
| 5,710,079 | A | | 1/1998 | Sukharev |
| 5,727,578 | A | | 3/1998 | Matthews |
| 5,863,348 | A | * | 1/1999 | Smith et al. .................. 134/18 |
| 5,911,837 | A | | 6/1999 | Matthews |
| 5,940,985 | A | | 8/1999 | Kamikawa et al. |
| 5,967,156 | A | | 10/1999 | Rose et al. |
| 6,001,191 | A | | 12/1999 | Kamikawa et al. |
| 6,030,460 | A | | 2/2000 | Sukharev |
| 6,242,165 | B1 | * | 6/2001 | Vaartstra ..................... 430/329 |
| 6,267,125 | B1 | | 7/2001 | Bergman et al. |
| 6,273,108 | B1 | | 8/2001 | Bergman et al. |

FOREIGN PATENT DOCUMENTS

DE          19723918         5/1998

(Continued)

*Primary Examiner*—Joseph L. Perrin
(74) *Attorney, Agent, or Firm*—Morrison & Foerster LLP

(57) ABSTRACT

Semiconductor wafers are cleaned by placing the semiconductor wafers in a processing vessel, forming a pure water film on the surfaces of the wafers, forming an ozonic water film by dissolving ozone gas in the pure water film, and removing resist films formed on the wafers by the agency of the ozonic water film. The pure water film is formed by condensing steam on the surfaces of the wafers. The resist films formed on the surfaces of the wafers can be removed by also using hydroxyl radicals produced by interaction between steam and ozone gas supplied into the processing vessel. Thus, the resist films can be removed highly effectively.

14 Claims, 30 Drawing Sheets

FOREIGN PATENT DOCUMENTS

| | | |
|---|---|---|
| DE | 69129850 | 12/1998 |
| DE | 19832038 | 1/1999 |
| DE | 19801360 | 7/1999 |
| DE | 69511639 | 1/2000 |
| DE | 69327176 | 5/2000 |
| JP | 05-109686 | 4/1993 |
| JP | 7-79100 | 8/1995 |
| JP | 08-115895 | 5/1996 |
| JP | 08-236497 | 9/1996 |
| JP | 2000-100686 | 4/2000 |
| JP | 2000-147793 | 5/2000 |

\* cited by examiner

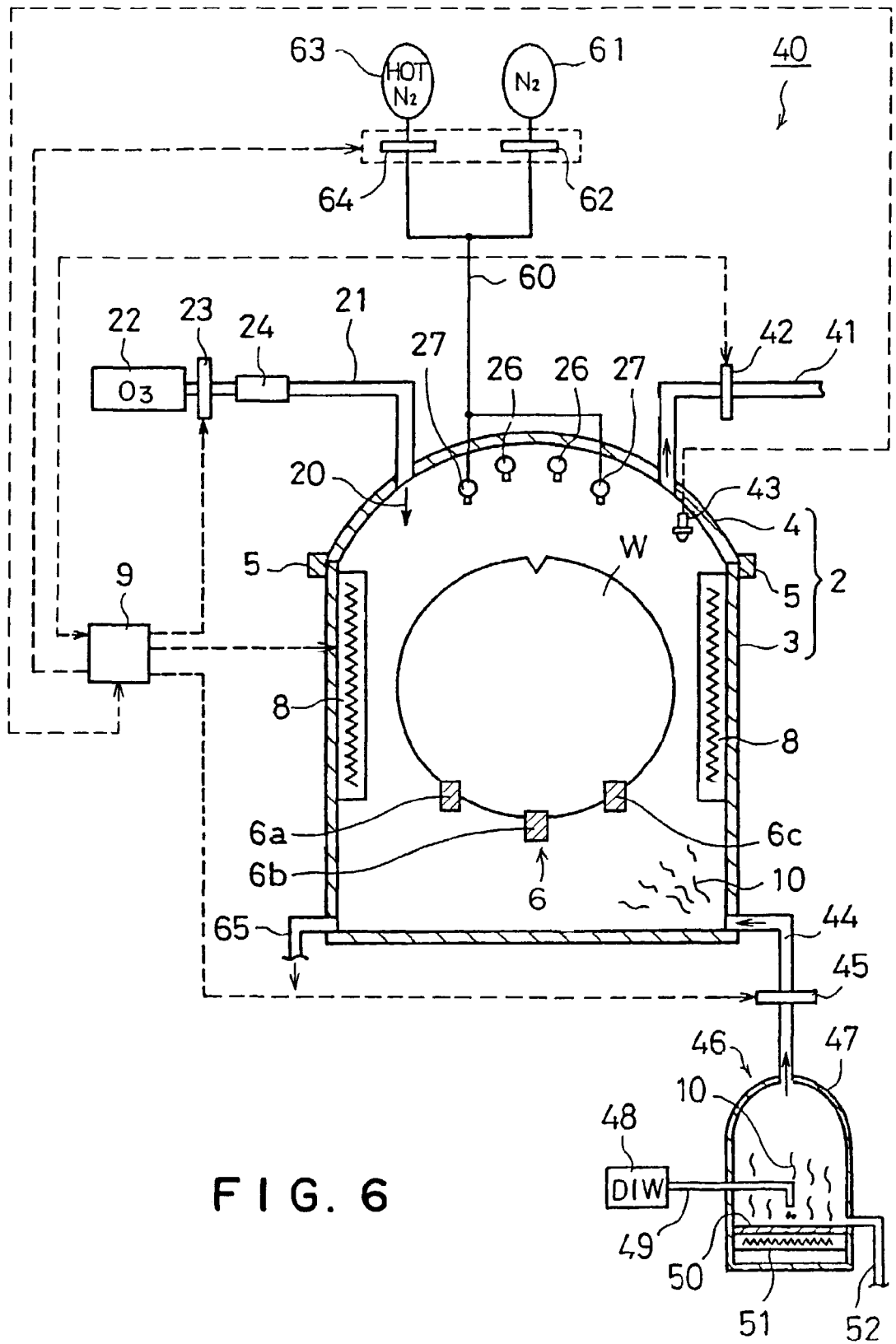
F I G. 6

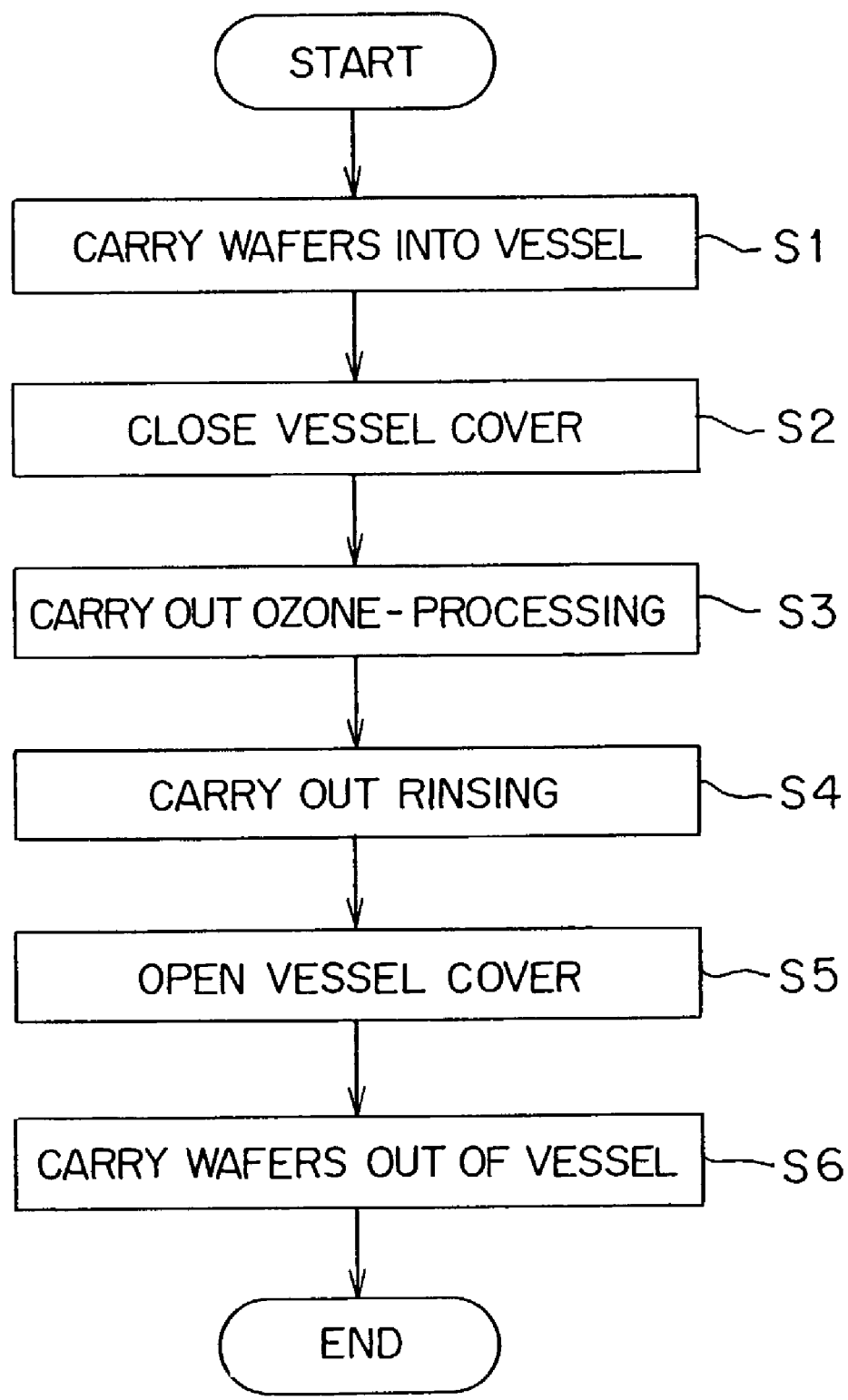
F I G. 13

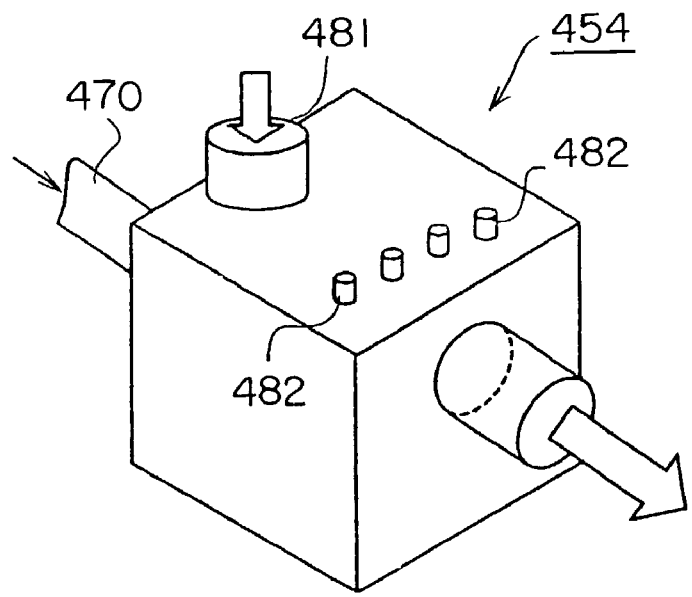
F I G. 32
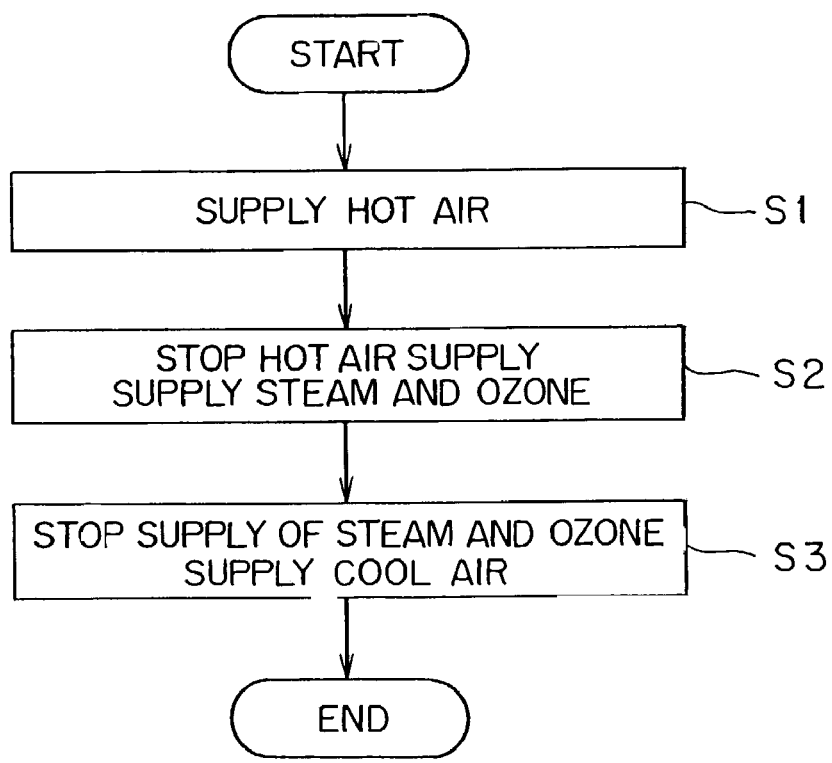
F I G. 33

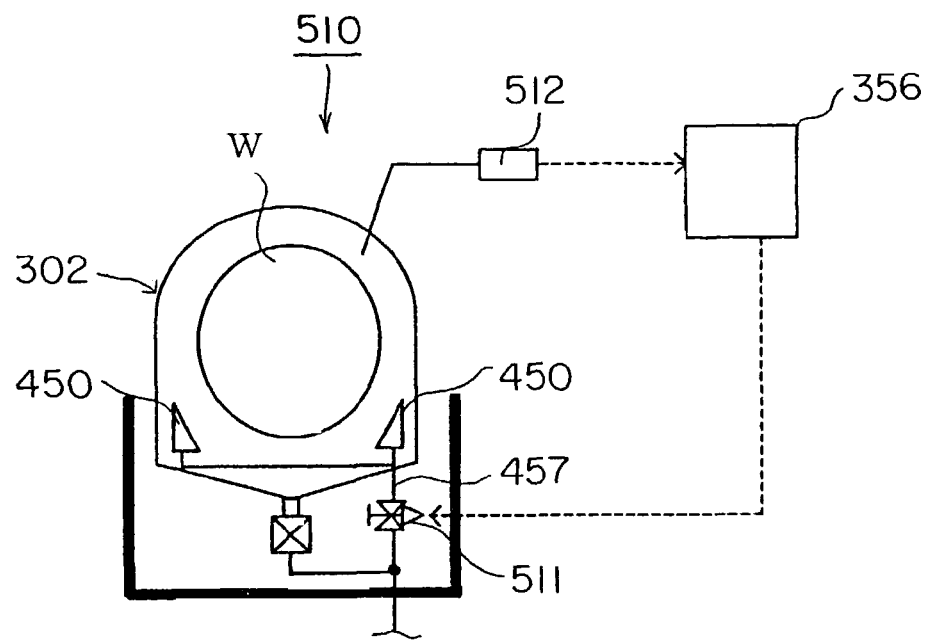
F I G. 34
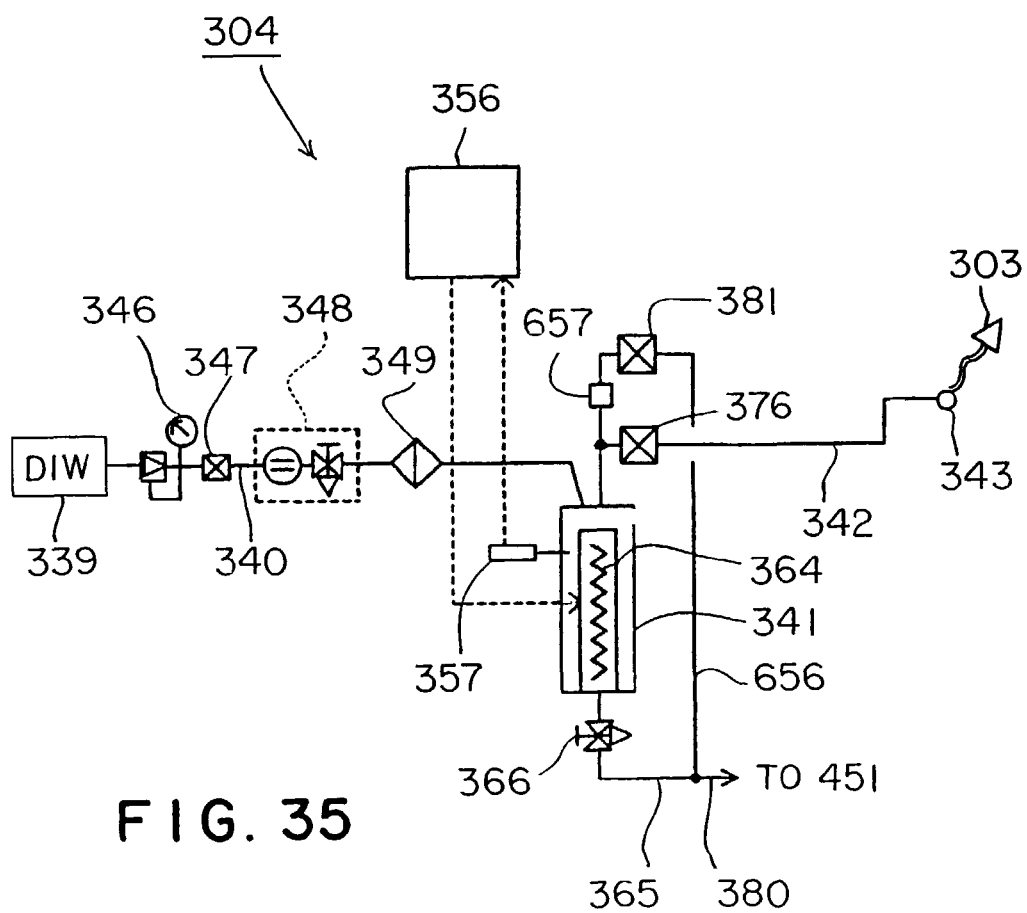
F I G. 35

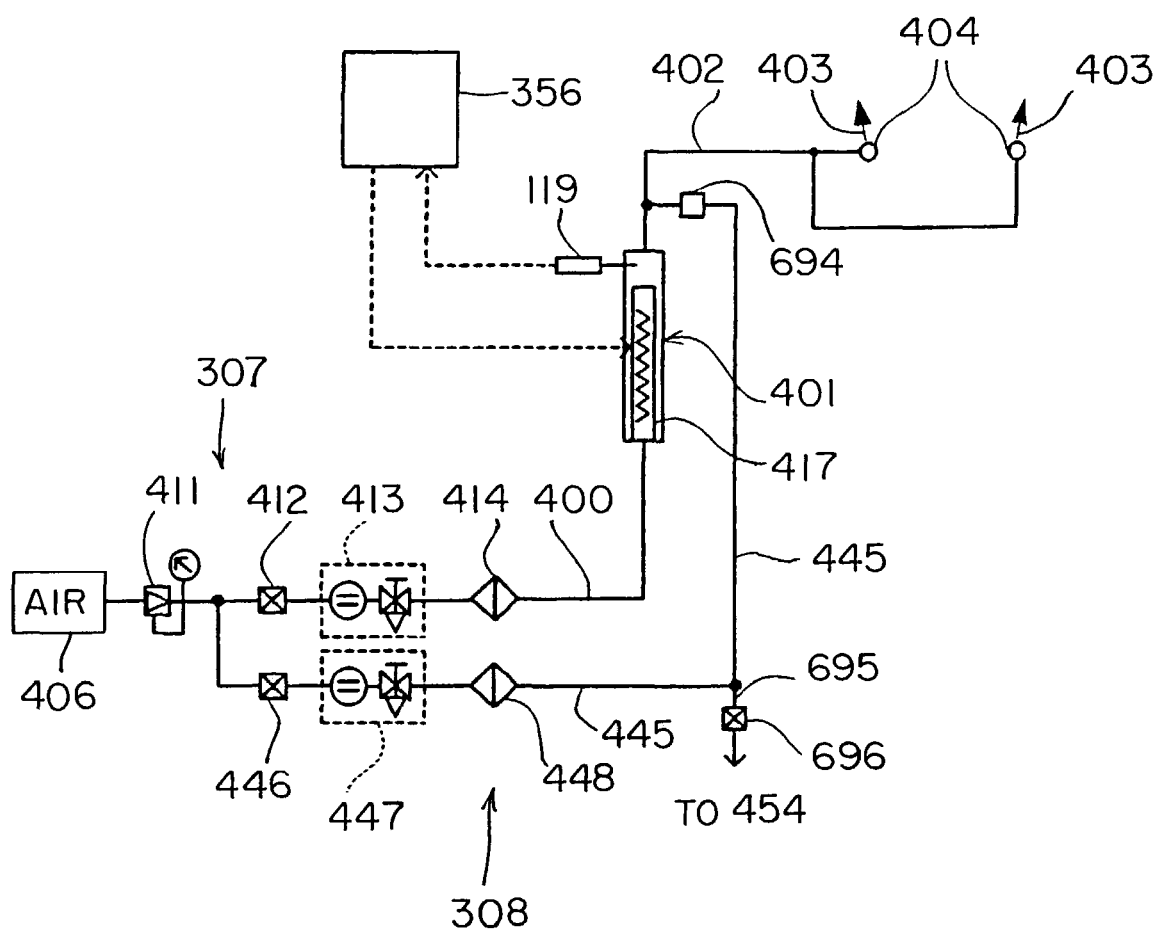
F I G. 36

SUBSTRATE PROCESSING APPARATUS FOR RESIST FILM REMOVAL

CROSS-REFERENCE TO RELATED APPLICATIONS

This is a continuation of U.S. patent application Ser. No. 09/628,235, filed Jul. 28, 2000 now U.S. Pat. No. 6,613,692. The content of that application is hereby incorporated by reference herein in its entirety.

BACKGROUND OF THE INVENTION

1. Field of the Invention

The present invention relates to a substrate processing method of and a substrate processing apparatus for processing substrates, such as semiconductor wafers, by, for example, a cleaning process.

2. Description of the Related Art

When processing a semiconductor wafer by, for example, a photolithographic process, a resist film is formed on a surface of the wafer, the surface of the wafer coated with the resist film is exposed to light in a desired pattern, and the wafer is subjected to a developing process to develop the image of the pattern, and then unnecessary portions of the resist film are removed.

A cleaning apparatus is employed for removing the unnecessary portions of the resist film. The cleaning apparatus immerses the wafer in a cleaning tank containing a chemical liquid called SPM (an $H_2SO_4/H_2O_2$ mixed liquid) to remove the portions of the resist film. In view of the protection of the environment, it is desired to remove the resist film by using ozonic water capable of being easily disposed of by a liquid disposal process instead of a chemical liquid. When ozonic water is used, the wafer is immersed in a cleaning tank containing ozonic water and the resist forming the resist film is decomposed into carbon dioxide, water, etc. by an oxidizing interaction between oxygen radicals contained in the ozonic water and the resist film.

Normally, ozonic water is prepared by dissolving a high-concentration ozone gas in pure water by bubbling. The ozone of the ozonic water contained in the cleaning tank escapes from the ozonic water and the ozone concentration of the ozonic water decreases gradually with time. Since the cleaning ability of the ozonic water is dependent on its ozone concentration, the cleaning ability of the ozonic water decreases as the ozone concentration decreases and the ozonic water having an insufficient ozone concentration is often unable to remove the resist film satisfactorily. Since the rate of interaction between ozone and the resist film is very high, only insufficient ozone can be supplied to the surface of the resist film if the wafer is merely immersed in the ozonic water and hence the interaction between the ozone and the resist film cannot be carried out at a high rate. The interaction between ozone and the resist film must be carried out at a high temperature. Therefore, in some cases, high-temperature ozonic water is prepared by dissolving ozone in pure water of, for example, 80° C. by bubbling. However, since the solubility of a gas in pure water at high temperature is low, ozonic water of high ozone concentration cannot be produced and hence the interaction between ozone and the resist film at a high reaction rate cannot be achieved.

Accordingly, it is an object of the present invention to provide a substrate processing method and a substrate processing apparatus capable of exercising a high processing ability in processing substrates.

SUMMARY OF THE INVENTION

To achieve the object, the present invention provides a substrate processing method comprising the steps of: placing a substrate in a processing vessel; forming a film of a solvent over a surface of the substrate; and dissolving a process gas in the film of the solvent.

To achieve the object, the present invention further provides a substrate processing method including the steps of: placing a substrate in a processing vessel; supplying a vapor of a solvent into the processing vessel; supplying a process gas into the processing vessel; producing a reactive substance by interaction between the vapor of the solvent and the process gas; and processing the substrate with the reactive substance.

The step of processing the wafers with the reactive substance may include a step of forming a film of the solvent over the surfaces of the substrates and a step of dissolving the process gas in the liquid film.

The step of producing the reactive substance by interaction between the vapor of the solvent and the process gas may be a step of forming a molecular layer of a mixture of molecules of the solvent and those of the process gas.

The reactive substance contains atoms, molecules and radicals, the reactive substance produced in a processing chamber is used immediately for processing the substrate before the reactive substance disappears and hence the reactive substance is able to exercise a high processing ability. When this substrate processing method using the reactive substance is used for, for example, removing resist films formed on substrates, the resist films can be properly converted into water-soluble films by hydroxyl radicals produced by interaction between steam, i.e., a solvent, and ozone gas, i.e., a process gas. The process gas may be any suitable gas other than ozone gas, such as chlorine gas, fluorine gas, hydrogen gas, chlorine gas containing reactive radicals, fluorine gas containing radicals and hydrogen gas containing radicals.

To achieve the object, the present invention also provides a substrate processing apparatus including a processing vessel defining a processing chamber in which substrates are processed, a process gas supply section for supplying a process gas into the processing chamber in the processing vessel, a solvent vapor supply section for supplying a vapor of a solvent into the processing chamber of the processing vessel, and a substrate holding member for holding substrates in the processing chamber in the processing vessel.

Desirably, the substrate processing apparatus further includes a substrate temperature adjusting system for adjusting the temperature of the substrates held by the substrate holding member in the processing space in the processing vessel. The substrate temperature adjusting system may be a heater incorporated into the processing vessel or a temperature adjusting gas supply system for supplying a gas of a regulated temperature into the processing space in the processing vessel.

BRIEF DESCRIPTION OF THE DRAWINGS

FIG. 6 is a schematic vertical sectional view of a cleaning apparatus in another embodiment of the present invention;

FIG. 13 is a flow chart of a method to be carried out by the cleaning apparatus shown in FIG. 12;

FIG. 32 is a perspective view of a discharge header;

FIG. 33 is a flow chart of a cleaning method to be carried out by the cleaning apparatus shown in FIG. 16;

FIG. 34 is a diagrammatic view for explaining a discharging unit in a modification;

FIG. 35 is a piping diagram of a modification of the steam generator of the cleaning apparatus shown in FIG. 16;

FIG. 36 is a piping diagram of a modification of the ozone generating unit of the cleaning apparatus shown in FIG. 16;

DESCRIPTION OF THE PREFERRED EMBODIMENTS

Preferred embodiments of the present invention will be described hereafter with reference to the accompanying drawings.

Figure 1:
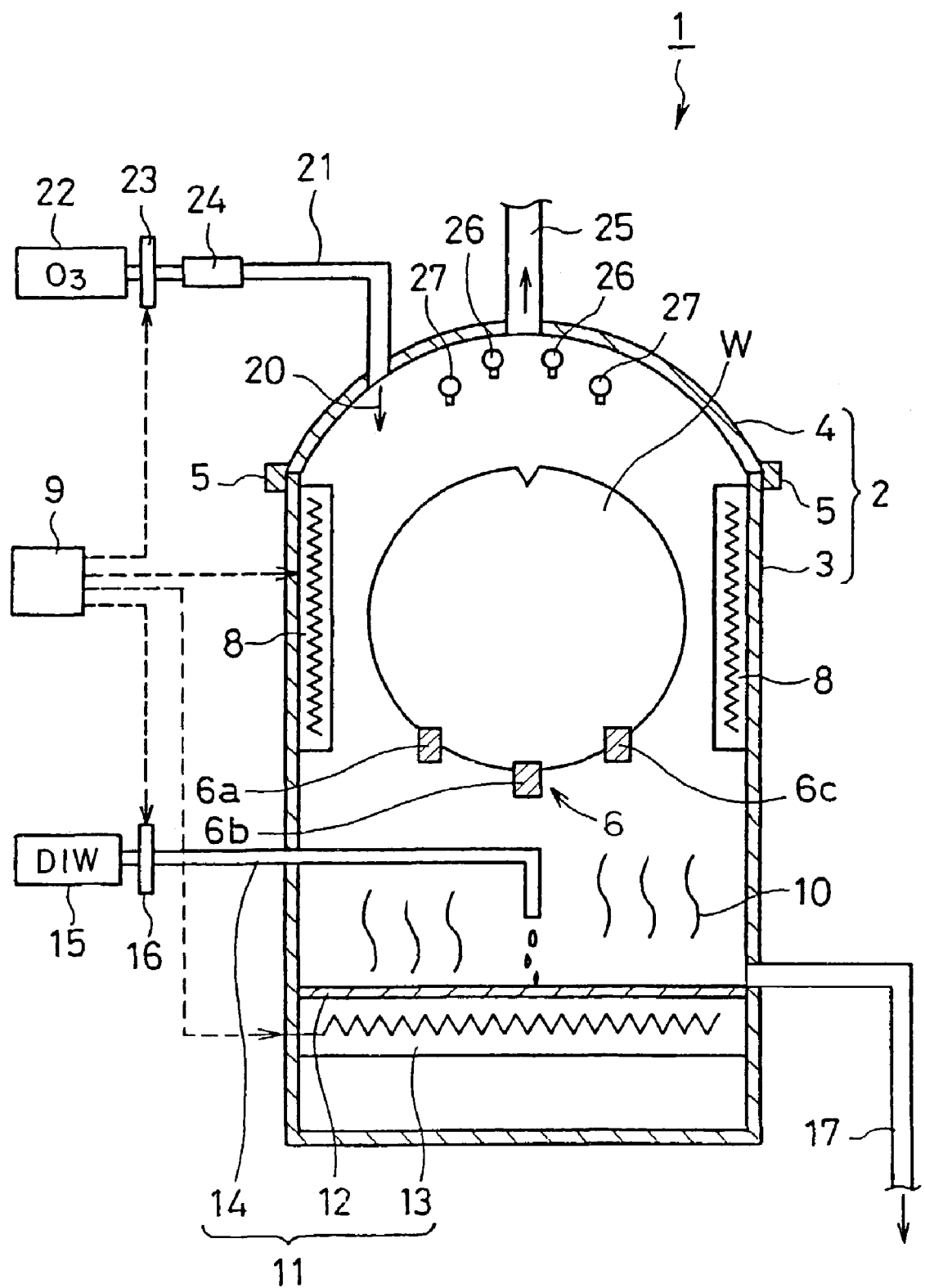
FIG. 1 is a schematic vertical sectional view of a cleaning apparatus in an embodiment of the present invention.

FIG. 1 shows a cleaning apparatus 1 in an embodiment of the present invention capable of cleaning, for example, twenty-five wafers in a batch. The cleaning apparatus 1 uses ozone gas to remove resist films from wafers W. Referring to FIG. 1, the cleaning apparatus 1 has a processing vessel 2 in which wafers W, are cleaned. The processing vessel 2 has a vessel body 3 having a capacity sufficient to contain, for example twenty-five wafers W, and a top cover 4 detachably mounted on top of the vessel body 3 so as to open the upper end of the vessel body 3. A sealing member 5, such as an O ring, is interposed between the upper end of the vessel body 3 and the top cover 4 as shown in FIG. 1 to seal the gap between the vessel body 3 and the top cover 4 so that the atmosphere in the vessel body 3 may not leak outside.

Figure 2:
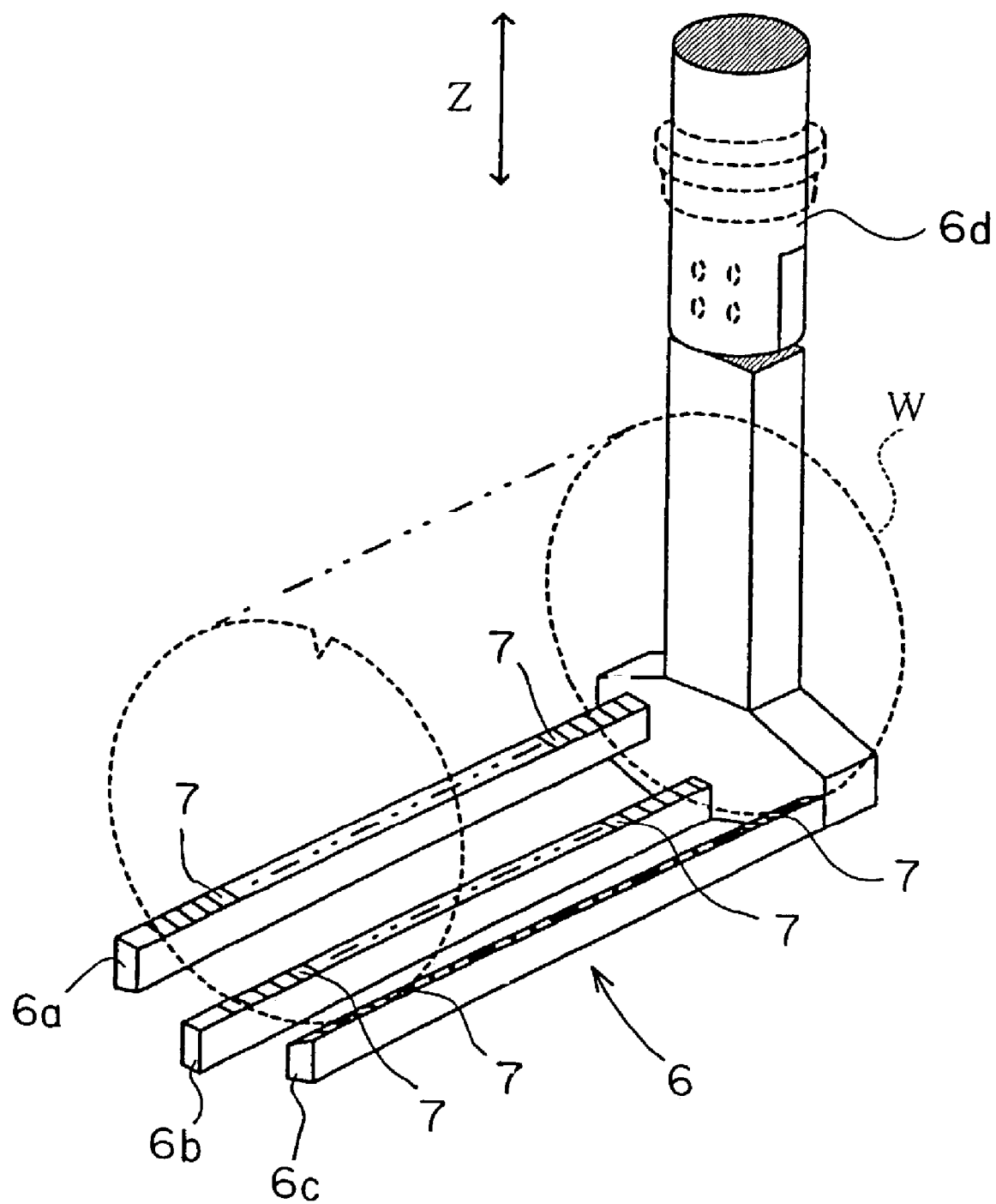
FIG. 2 is a perspective view of a wafer boat serving as a wafer holding member.

A wafer boat 6, i.e., a wafer holding member, is placed in the vessel body 3 to hold wafers W in an upright attitude. The wafer boat 6 has three, horizontal, parallel holding members 6a, 6b and 6c. As shown in FIG. 2, each of the holding members 6a, 6b and 6c are provided with twenty-five grooves 7 formed at equal intervals. The holding members 6a, 6b and 6c receive lower peripheral portions of wafers W in the grooves 7 to hold the wafers W thereon. Thus, the vessel body 3 is able to contain twenty-five wafers W arranged at equal intervals. The wafer boat 6 has a shaft 6d for moving the holding bars 6a, 6b and 6c downward in the direction of the arrow Z to carry wafers W into the vessel body 3 and for moving the same upward in the direction of the arrow Z to carry wafers W out of the vessel body 3. A stationary wafer boat having holding members fixedly disposed in the processing vessel 2 may be used instead of the wafer boat 6.

Referring again to FIG. 1, a heater 8 is attached to an upper region of the inner surface of the vessel body 3 so as to surround wafers W held on the wafer boat 6 in the vessel body 3. The heater 8 is controlled by a control unit 9. The control unit 9 provides a control signal to adjust the heat generating rate of the heater 8 so that the wafers W placed in the processing vessel 2 and the atmosphere around the wafers W at a predetermined temperature.

A steam supply unit 11 is disposed in a bottom section of the vessel body 3 to supply steam 10 into the processing vessel 2. The steam supply unit 11 has a hot plate 12 fixed to the inner surface of the side wall of the vessel body 3, a heating device 13 attached to the lower surface of the hot plate 12, and a pure water supply line 14 for dripping pure water onto the upper surface of the hot plate 12. The control unit 9 provides a control signal to adjust the heat generating rate of the heater 13. The inlet end of the pure water supply line 14 is connected to a pure water (distilled water) source (DIW source) 15 and the outlet end of the same is located above the hot plate 12. A flow controller 16 is placed in the pure water supply line 14. The control unit 9 provides a control signal to control the flow controller 16 to regulate the flow rate of pure water in the pure water supply line 14. When pure water is dripped by the pure water supply line 14 onto the hot plate 12 heated by the heater 13, pure water is vaporized into steam 10 to fill up the interior of the processing vessel 2 with the steam 10. The pure water dripped onto the hot plate 12 and not vaporized is collected in the bottom of the vessel body 3 and is drained through a drain pipe 17.

An ozone gas supply line 21 is connected to the top cover 4 to supply ozone gas 20 into the processing vessel 2. The ozone gas supply line 21 has an inlet end connected to an ozone gas source 22. A flow controller 23 and a UV lamp (ultraviolet lamp) 24 are placed in the ozone gas supply line 21. The flow controller 23 is connected to the control unit 9. The control unit 9 provides a control signal to control the flow rate of the ozone gas 20 flowing through the ozone gas supply line 21 by controlling the flow controller 23. The UV lamp 24 irradiates the ozone gas 20 flowing through the ozone gas supply line 21 with UV rays to activate ozone. And is charge line 25 is connected to the top cover 4 to evacuate the processing vessel 2.

The steam 10 condenses in pure water films on the surfaces of the wafers W in the cleaning apparatus 1. The control unit 9 gives a control signal to the heater 13 to adjust the heat generating rate of the heater 13 so that the steam 10 is generated sufficiently and gives a control signal to the heater 8 to heat the wafers W at a temperature lower than that of the steam 10. Thus, the difference between the temperature of the wafers W and the dew point of the steam 10 is controlled to make the steam 10 condense in an optimum state on the surfaces of the wafers W. The ozone gas 20 dissolves in the pure water films formed on the surfaces of the wafers W to form ozonic water films on the surfaces of the wafers W. The surfaces of the wafers ware cleaned with the ozonic water films. The control unit 9 executes the following control operations. The control unit 9 gives a control signal to the flow controller 16 to adjust the thickness of the pure water films by adjusting the rate of generation of the steam 10. The control unit 9 gives a control signal to the flow controller 23 to adjust the flow rate of the ozone gas 20 according to the thickness of the pure water film so that a condition in which the ozone gas 20 dissolves only in surface layers of the pure water films may be avoided and the ozone gas 20 may surely dissolve properly in the entire pure water films.

The cleaning apparatus 1 is provided, in addition to the foregoing members and units, with a pure water supplying nozzles 26 that eject pure water against the surfaces of the wafers W for rinsing, and inert gas supplying nozzles 27 that ejects nitrogen ($N_2$) gas (an inert gas) against the surfaces of the wafers W for drying.

A cleaning method to be carried out by the cleaning apparatus 1 will be explained below. Resist films 30 are formed on surfaces of the wafers Was shown in FIG. 3. Twenty-five wafers W each having a surface coated with the resist film 30 are placed in the processing vessel 2 as shown in FIG. 1. The resist films 30 are, for example, 1200 nm in thickness.

The heater 13 is driven to heat the hot plate 12 at, for example, 120° C., pure water is dripped onto the hot plate 12 by the pure water supply line 14 to generate the steam 10 of 120° C. in the processing vessel 2. Ozone gas 20 having an ozone concentration of, for example, about 192 g/m³ (Normal) (about 9% by volume)is supplied through the ozone gas supply line 21 into the processing vessel 2. Thus, the steam 10 and the ozone gas 20 are supplied by separate means, respectively.

Figure 4:
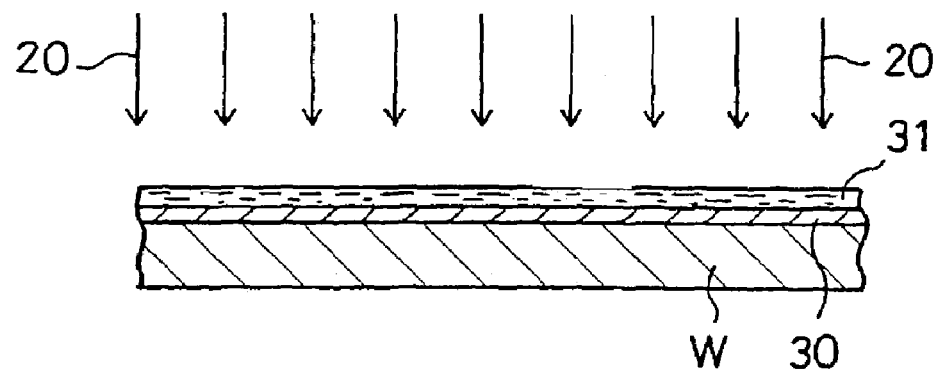
FIG. 4 is a sectional view for explaining a second step of the cleaning method according to the present invention.

The heater 8 is energized to heat the wafers W placed in the processing vessel 2 at a predetermined temperature. The predetermined temperature of the wafers W is set to be lower than the dew point of the steam 10 and to be suitable for an optimum cleaning method using ozone. Since the temperature of the wafers W is lower than the dew point of the steam 10, the steam 10 condenses on the surfaces of the wafers W to form pure water films 31 on the surfaces of the wafers W as shown in FIG. 4. The ozone gas 20 dissolves in the pure water films 31.

Figure 5:
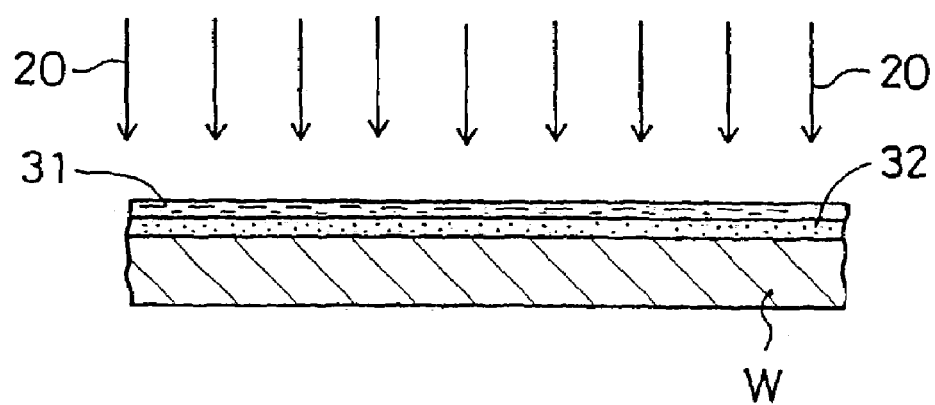
FIG. 5 is a sectional view for explaining a third step of the cleaning method according to the present invention.

Thus the ozone gas 20 dissolves in the pure water films 31 to produce ozonic water films containing many oxygen radicals on the surfaces of the wafers W. The oxygen radicals produced on the surfaces of the wafers W cause an oxidation reaction before the same disappear, whereby the resist forming the resist films is decomposed into a carboxylic acid, carbon dioxide, water and such. Then, as shown in FIG. 5, the resist films 30 are oxidized and the resist forming the resist film is decomposed thoroughly by the ozonic water films and the resist films 30 are altered into water-soluble films 32. The water-soluble films 32 can be easily removed by a subsequent rinsing step using pure water.

This cleaning method forms the pure water films 31 on the surfaces of the wafers W and makes the ozone gas 20 dissolve in the pure water films 31. Consequently, the pure water films 31 can be altered into the ozonic water films capable of removing the resist films 30. Since the ozonic water films are thus formed on the wafers W immediately before reaction, a high processing ability of the ozonic water films can be used for removing the resist films 30 before the ozone concentration thereof decreases with time. Thus, the wafers W having surfaces coated with the resist films can be effectively processed by using ozone.

Furthermore, since the steam 10 is supplied onto the surfaces of the wafers W maintained at a temperature lower than the dew point of the steam 10, condensation of the steam 10 on the surfaces of the wafers W is ensured and the thin pure water films 31 can be surely and easily formed on the surfaces of the wafers W. The thin pure water films 31 can be altered into the ozonic water films of high ozone concentration and hence the cleaning method using ozone can be quickly carried out. The ozone gas 20 is supplied continuously through the ozone gas supply line 21 to replenish the pure water films 31 with ozone by continuously dissolving the oxygen gas 20 in the pure water films 31. Consequently, sufficient ozone can be supplied through the thin pure water films 31 to the resist films 30 to maintain a high reaction rate. Desirably, the pure water films 31 and the ozonic water films are formed in a thickness slightly greater than a drop forming thickness. The wafers W are maintained at a temperature that is lower than the dew point of the steam 10 and effective in promoting active oxidation reaction, so that the cleaning process using ozone can be promoted.

After the wafers W have been cleaned, pure water is ejected through the pure water supplying nozzles 26 against the surfaces of the wafers W to wash off the water-soluble films 32 for rinsing, and then $N_2$ gas (inert gas) is ejected through the inert gas supplying nozzles 27 to remove liquid drops from the wafers W for drying. Subsequently, the top cover 4 is removed to open the vessel body 3 and the wafers W are taken out of the cleaning apparatus 1. The wafers W may be taken out of the cleaning apparatus 1 immediately after the resist films 30 have been removed and the wafers W may be rinsed and dried by a rinsing apparatus and a drying apparatus instead of rinsing and drying the same in the cleaning apparatus 1.

The cleaning method according to the present invention forms the ozonic water films having high cleaning ability on the surfaces of the wafers W immediately before cleaning. Consequently, the wafers W can be effectively processed by the cleaning process using ozone and the resist films 30 can be thoroughly removed. The cleaning apparatus 1 in this embodiment of the invention is capable of properly carrying out the foregoing cleaning method.

The present invention is not limited in its practical application to the foregoing embodiment. For example, it is preferable to supply a small amount of catalyst gas, such as $NO_x$ gas, into the processing vessel to promote the production of oxygen radicals in the liquid films for the activation of oxidation reaction. Although the steam supply unit is disposed inside the processing vessel to generate steam inside the cleaning apparatus in this embodiment, the steam generated outside the cleaning apparatus may be supplied into the processing vessel. When the steam is supplied by an external steam generator, the processing vessel does not need to contain the steam supply unit therein and hence the cleaning apparatus can be formed in compact construction.

A cleaning apparatus 40 in another embodiment of the invention will be described with reference to FIG. 6, in which parts like or corresponding to those of the cleaning apparatus 1 will be denoted by the same reference characters and the description thereof will be omitted to avoid duplication.

The cleaning apparatus 1 in the above described embodiment discharges the gas in the processing vessel 2 freely through the discharge line 25. As shown in FIG. 6, the cleaning apparatus 40 has a discharge line 41 provided with a flow controller 42 to control pressure in a processing vessel 12. The flow controller 42 is controlled by a control unit 9. A pressure sensor 43 is disposed inside the processing vessel 2. The pressure sensor 43 gives a pressure signal to the control unit 9. The control unit 9 controls the flow controller 42 on the basis of the pressure signal to control the flow of the gas flowing through the discharge line 41. An ozone gas source 22 supplies the ozone gas at a supply pressure of 196 kPa. Thus, the interior of the processing vessel 2 is maintained at a predetermined positive pressure of, for example, 196 kPa.

As shown in FIG. 6, the cleaning apparatus 40 includes a steam supply line 44 having an inlet end connected to a steam source 46 and an outlet end connected to the bottom of the processing vessel 2. The steam supply line 44 is provided with a flow controller 45. The steam source 46 includes a steam generating vessel 47, a pure water (distilled water) source 48, a pure water supply line 49, a hot plate 50, a heater 51 and a drain pipe 52. The control unit 9 controls the flow controller 45 to control the flow of the steam 10 through the steam supply line 44.

A $N_2$ gas supply line 60 is connected to inert gas supplying nozzles 27. The $N_2$ gas supply line 60 is bifurcated into first and second branch lines. The first branch line is connected through a flow controller 62 to a $N_2$ container 61 containing $N_2$ gas. The second branch line is connected through a flow controller 64 to a hot $N_2$ container 63 containing $N_2$ gas heated at, for example, 150° C. The controller 9 controls the flow controllers 62 and 64 to supply the $N_2$ gas or the hot $N_2$ gas to the inert gas supplying nozzles 27. A drain pipe 65 is connected to a lower part of the processing vessel 2.

A cleaning method to be carried out by the cleaning apparatus 40 will be described. Wafers W of an ordinary temperature (23° C.) are placed in the processing vessel 2. The heater 8 is driven, for example, at 115° C. to heat the wafers W at a predetermined temperature. The ozone gas 20 is supplied at a supply pressure of 196 kPa through the ozone gas supply line 21 into the processing vessel 2 and, at the same time, the hot $N_2$ gas of, for example, 150° C. is ejected through the inert gas supplying nozzles 27 against the surfaces of the wafers W. Consequently, the wafer W can be immediately heated at the predetermined temperature.

After the wafers W have been heated at the predetermined temperature, the supply of the not $N_2$ gas is stopped, and the steam 10 is supplied through the steam supply line 44 into the processing vessel 20 so as to apply the steam 10 to the surfaces of the wafers W. The flow controller 42 of the discharge line 41 is controlled to discharge the gas at a low discharge rate from the processing vessel 2 so that the interior of the processing vessel 20 is maintained at 196 kPa. The ozone concentration of the ozone gas 20 is increased in the processing vessel 20.

The steam 10 condenses on the surfaces of the wafers W in pure water films 31. The ozone gas 20 supplied into the processing vessel 2 dissolves in the pure water films 31 to form ozonic water films 32. A cleaning process using ozone can be quickly carried out by the agency of the ozonic water films formed on the surfaces of the wafers W.

When the steam 10 is applied to the wafers W maintained at the ordinary temperature, the steam 10 condenses excessively on the surfaces of the wafers W and a large number of water drops form on the surfaces of the wafers W because the difference between the temperature of the wafers W and the dew point of the steam 10 is large. If pure water films 31 are formed in such a great thickness, the processing ability of the cleaning apparatus 40 will be reduced.

The steam 10 can be condensed in pure water films 31 of an appropriate thickness by introducing the steam 10 onto the surfaces of the wafers W after heating the wafers at the predetermined temperature as mentioned above. Thus, the thin pure water films 31 can be surely formed on the surfaces of the wafers W, so that the reduction of the processing ability can be avoided. Since the wafers W are placed in an atmosphere of 196 kPa, an increased amount of the ozone gas 20 can be dissolved in the pure water films 31, so that the ozonic water films having a very high ozone concentration can be formed. Consequently, the processing ability can be further enhanced.

After resist films 30 formed on the wafers W have been removed, the wafers W are taken out of the processing vessel 2, the wafers W are carried to a rinsing apparatus and a drying apparatus sequentially for rinsing and drying. The supply of the steam 10 and the ozone gas 20 into the processing vessel 2 is stopped. Liquids remaining in the processing vessel 2 are drained through the drain pipe 65, the flow controller 42 is fully opened, $N_2$ gas is supplied through the inert gas supplying nozzles 27 into the processing vessel 2 for $N_2$ gas purging. Consequently, the processing vessel 2 is purged of the steam 10 and the ozone gas 20, and the interior of the processing vessel 2 is dried. After the processed wafers W have been taken out of the processing vessel 2, wafers W of an ordinary temperature to be processed by the next processing cycle are carried into the processing vessel 2. If the wafers W of the ordinary temperature are placed in the processing vessel 2 with some of the steam 10 remaining in the processing vessel 2, the surfaces of the wafers W are wetted with a large amount of pure water. Since the steam source 46 is separate from the processing vessel 2, the atmosphere in the processing vessel 2 can be easily changed and hence the surfaces of the wafers W can be kept dry until the wafers W are heated at a predetermined temperature and the steam is supplied into the processing vessel 2.

This cleaning method shortens the time necessary to heat the wafers W at the predetermined temperature by using the hot $N_2$ gas and shortens the time necessary to form the ozonic water films 32 by supplying the ozone gas 20 into the processing vessel 2 before supplying the steam 10 into the processing vessel 2. Therefore, the cleaning process using ozone can be quickly carried out and the cleaning apparatus 40 is able to operate at a high throughput. Since the wafers W are processed in the pressurized atmosphere, ozone dissolves in the pure water films 20 in a high ozone concentration. Consequently, the resist films can be removed from the wafers W at high efficiency and the effect of the cleaning process using ozone can be further enhanced.

The cleaning apparatus 40 supplies the steam 10 through the steam supply line 44 into the processing vessel 2. Therefore, the moisture content of the atmosphere in the processing vessel 2 can be easily adjusted and the atmosphere in the processing vessel 2 can be dried. Since the heater 51 generates heat in the steam source 46, the wafers W placed in the processing chamber 2 are not affected by the thermal influence of the heater 51. Accordingly, the wafers W are not heated excessively beyond a necessary temperature and hence it is possible to prevent, for example, an undesirable situation in which the wafers W are heated at a temperature higher than the dew point of the steam 10, the steam 10 has difficulty in condensing on the wafers W, pure water films cannot be formed and the cleaning process using ozone cannot be achieved. The cleaning apparatus 1 shown in FIG. 1, as well as the cleaning apparatus 40, may be provided with a flow controller placed in the discharge line 25 and the wafers may be processed in a pressurized atmosphere in the processing vessel 2.

EXAMPLE 1

Results of experimental operation of the cleaning apparatus 40 in the above embodiment will be explained.

Figure 7:
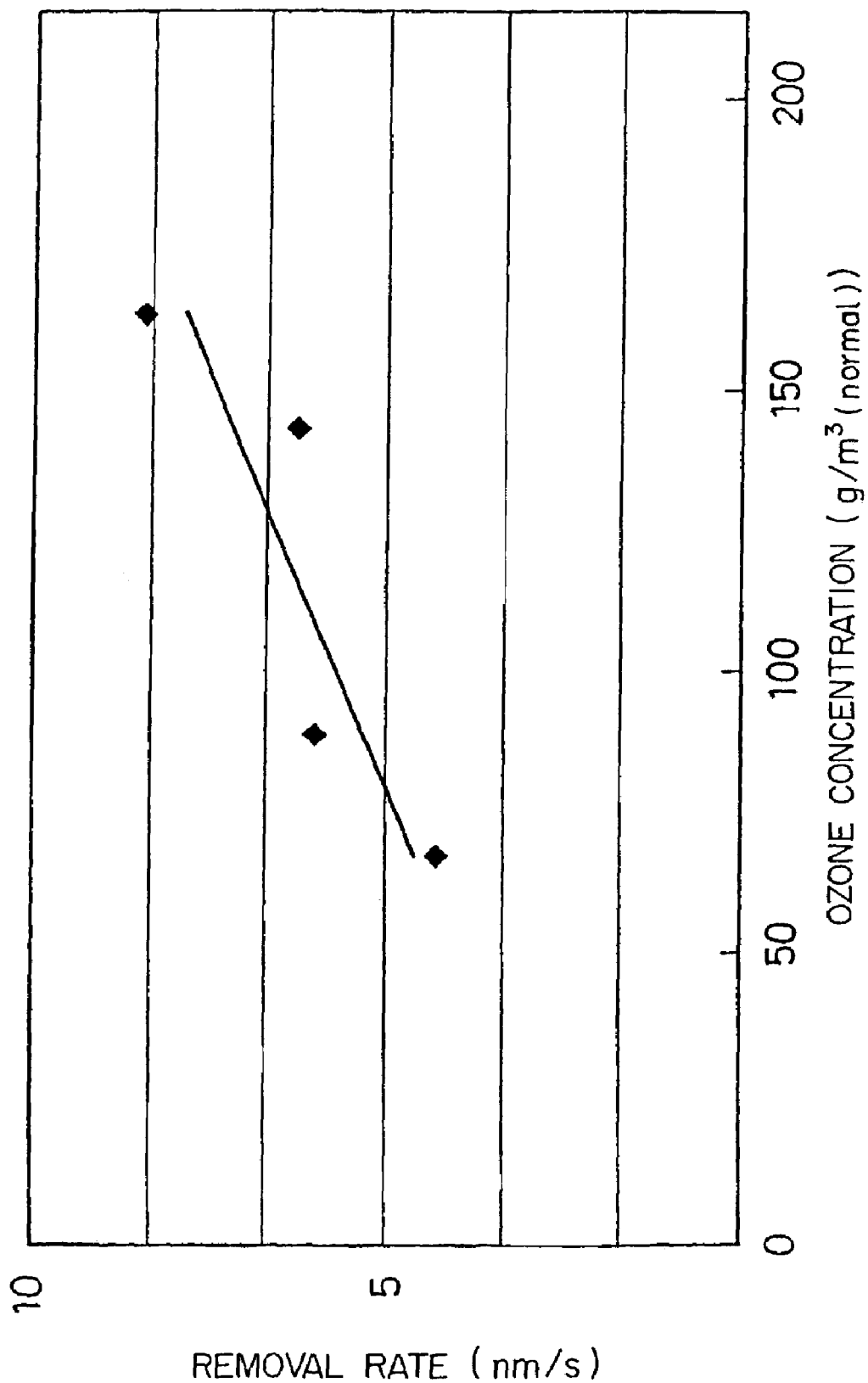
FIG. 7 is a graph showing the dependence of resin removal rate on ozone concentration.

Wafers coated with a film of an organic material (BARC) was subjected to a cleaning process. The dependence of film removal rate on the ozone concentration of ozone gas was examined. Measured results are shown in FIG. 7, in which ozone concentration ($g/m^3$(normal)) is measured on the horizontal axis and film removal rate (nm/s) is measured on the vertical axis. As obvious from FIG. 7, the film removal rate increased with increase of the ozone concentration.

Wafers coated with an organic film were subjected to a cleaning process using ozone in a pressurized atmosphere in the processing vessel to examine the processing ability of the cleaning apparatus 40. Ozone gas having an ozone concentration of about 162 $g/m^3$ (normal) (about 7.6% by volume) was used. The process time was 3 min and the initial thickness of the organic film was 67.4 nm. Since the atmosphere in the processing vessel is pressurized, the boiling point of pure water rises in the processing vessel. The dependence of the thickness of the film remaining after processing and the temperature of the wafer for pure water temperatures, i.e., steam temperatures 80° C., 90° C., 100° C. and 120° C. is shown in FIG. 8, in which the temperature (° C.) of the wafer is measured on the horizontal axis and the thickness (nm) of the film remaining after processing is measured on the vertical axis.

Figure 8:
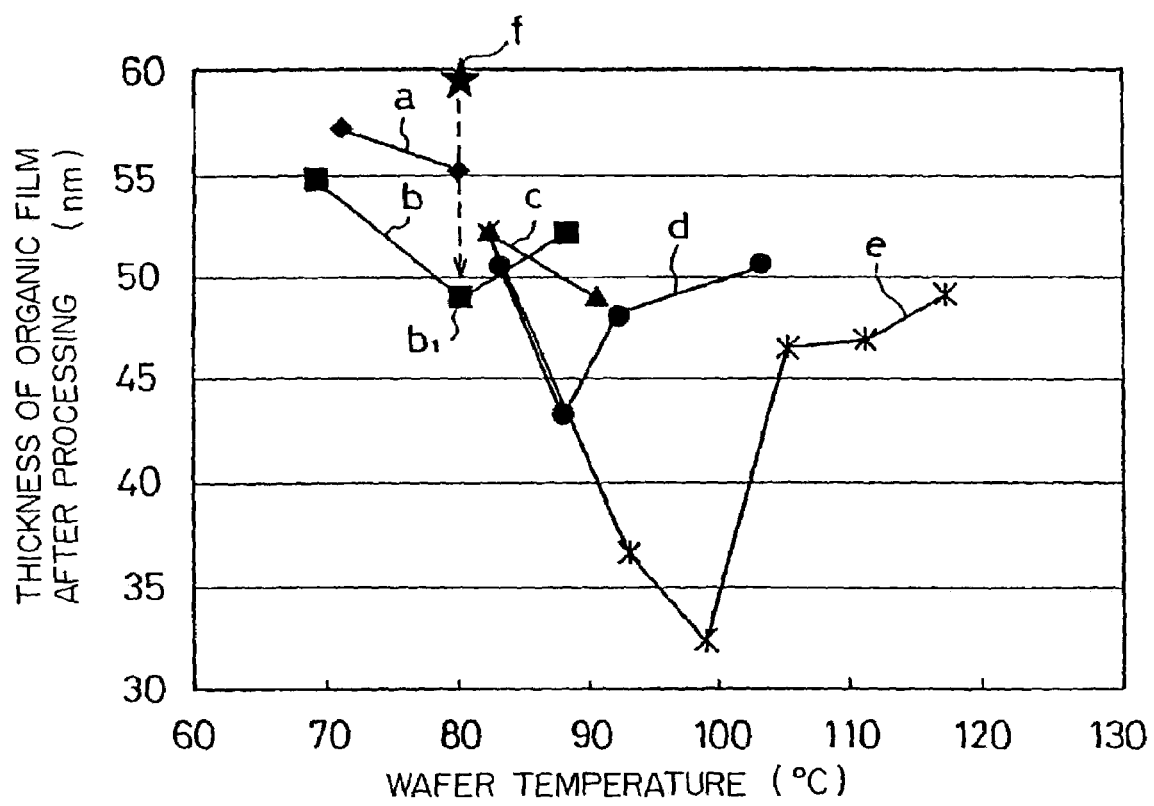
FIG. 8 is a graph showing the organic substance removing characteristic of a process of processing wafers using ozone in a pressurized atmosphere.

In FIG. 8, a curve a is for 80° C. in pure water temperature, a curve b is a curve for 90° C. in pure water temperature, a curve c is for 100° C. in pure water temperature, a curve d is for 110° C. in pure water temperature and a curve e is for 120° C. in pure water temperature.

As obvious from the curves a to e in FIG. 8, the higher the temperature of pure water, the smaller is the thickness of the remaining film. It is known from this fact that the organic film removing performance is satisfactory when pure water of a high temperature is used, the reaction rate increases according to the increase of the temperature of pure water and the cleaning process using ozone is activated. It is known from the curves b, d and e that the amount of the removed organic film increases with the increase of the temperature of the wafer, and the steam condenses properly and an optimum, thin pure water film is formed when the temperature of the wafer approaches the temperature of the steam and the difference between the respective temperatures of the wafer and the steam decreases. It is inferred that the thinner the pure water film, the ozone gas is able to penetrate deeper into the pure water film to form an ozonic water film of high ozone concentration and the organic film can be efficiently removed by the ozonic water film. It is also inferred that the ozonic water film of high ozone concentration increased film removing rate as mentioned above in connection with FIG. 7. The amount of the removed organic film decreases with the increase of the wafer temperature when the wafer temperature increases beyond about 80° C. in the curve b, beyond about 90° C. in the curve d, and beyond about 100° C. in the curve e. It is inferred from the curves b, d and e that it is difficult to form a pure water film when the wafer temperature is excessively close to the temperature of the steam, and consequently the cleaning process using ozone cannot be promoted.

Wafers coated with an organic film were subjected to a cleaning process using ozone and pure water of 90° C. in a not pressurized atmosphere. The result of this process is indicated at a point f in FIG. 8. When the same wafers were subject to the same process in an atmosphere of 196 kPa, the point f shifted to a point $b_1$ on the curve b; that is, the amount of the removed organic film is doubled by the atmosphere of 196 kPa. It is known from this fact that the pressurized atmosphere in which the wafers are processed enhances the processing ability of the ozonic water film.

Since the ozonic water film having a high processing ability is formed on the surfaces of the wafers immediately before starting the cleaning process, the wafers can be effectively processed. Consequently, matters adhering to the surfaces of wafers, such as organic substances, metallic substances, particles and natural oxides, can be thoroughly removed.

A cleaning apparatus 100 in a further embodiment of the invention will be described with reference to FIG. 9. The cleaning apparatus 100 is capable of processing fifty wafers W in a batch. The cleaning apparatus 100 is intended to remove resist films from the surfaces of wafers W by using ozone gas.

Figure 9:
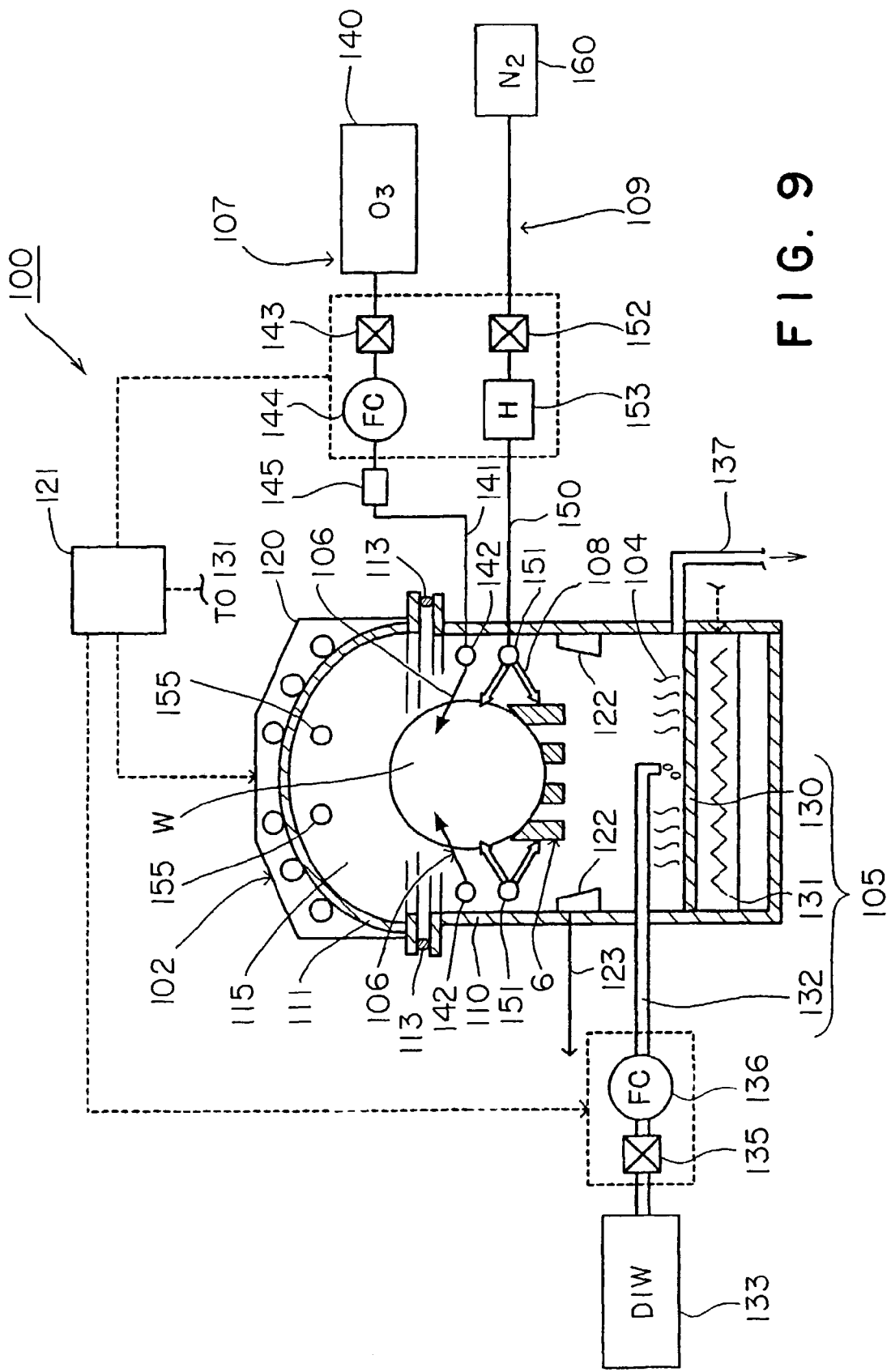
FIG. 9 is a schematic vertical sectional view of a cleaning apparatus in a further embodiment of the present invention.

Referring to FIG. 9, the cleaning apparatus includes a processing vessel 102 in which wafers W are processed, a wafer boat 6, i.e., a wafer holding member, for holding wafers W in the processing vessel 102, a steam supply unit 105, i.e., a solvent steam supply system, for supplying steam 104 into the processing vessel 102, an ozone gas supply unit 107, i.e., a process gas supply system, for supplying ozone gas 106 into the processing vessel 102, and a $N_2$ gas supply unit 109, i.e., a drying gas supply system, for supplying hot $N_2$ gas (drying gas) into the processing vessel 102.

The processing vessel 102 has a vessel 110 capable of containing, for example, fifty wafers W, and a removable top cover 111 covering the open upper end of the vessel body 110. A lip O ring 113 is interposed between the open upper end of the vessel body 110 and the top cover 111 as shown to seal the gap between the vessel body 110 and the top cover 111 so that the atmosphere in an ozone-processing chamber 115 defined by the vessel body 110 may not leak outside.

A lamp heater 120 is mounted on the outer surface of the upper wall of the top cover 111. A control unit 121 controls power to be supplied to the lamp heater 120 to control heat generated by the lamp heater 120 so as to heat wafers W and the atmosphere surrounding the wafers W at a predetermined temperature.

Discharge headers 122 are disposed in the processing vessel 2 to suck the atmosphere in the ozone-processing chamber 115 and to discharge the same to the outside. A discharge pipe 123 connected to an exhaust system of the plant is connected to the discharge headers 122.

The wafer boat 6 is similar to that shown in FIG. 2 and is capable of holding, for example, fifty wafers W arranged at equal intervals in vertical attitude. The steam supply unit 105 is disposed in a bottom section of the vessel body 110. The steam supply unit 105 has a hot plate 130 fixed to the inner surface of the side wall of the vessel body 110, a heating device 131 attached to the lower surface of the hot plate 130, and a pure water supply line 132 for dripping pure water onto the upper surface of the hot plate 130. The control unit 121 controls power supply to the heater 131 to control heat generating rate of the heater 131. The inlet end of the pure water supply line 132 is connected to a pure water source 133 and the outlet end of the same is located above the hot plate 130. A shutoff valve 135 and a flow controller 136 are placed in the pure water supply line 132. The control unit 121 controls the shutoff valve 135 and the flow controller 136. The control unit 121 provides a control signal to open or close the shutoff valve 135 and provides a control signal to adjust the flow rate of pure water through the pure water supply line 132 by controlling the opening of the flow controller 136. When pure water is dripped by the pure water supply line 132 onto the heated hot plate 130 heated by the heater 131, pure water is vaporized into steam 104. The interior of the processing vessel 102 is filled with the steam 104. The pure water dripped onto the hot plate 12 and not vaporized is collected in the bottom of the vessel body 110 and is drained through a drain pipe 137.

The ozone gas supply unit 107 has an ozone source 140 that produces and supplies the ozone gas 106, an ozone gas supply line 141 for carrying the ozone gas 106 provided by the ozone gas source 140 and ozone gas ejecting nozzles 142 for ejecting the ozone gas 106 carried by the ozone gas supply line 141 into the processing vessel 102. The ozone gas supply line 141 is provided with a shutoff valve 143, a flow controller 144 and a UV lamp 145. The shutoff valve 143 and the flow controller 144 are controlled by the control unit 121. The control unit 121 provides a control signal to open or close the shutoff valve 143. The control unit 121 provides a control signal for controlling the flow controller 144 to adjust the flow rate of the ozone gas 106 in the ozone gas supply line 141. The UV lamp 145 irradiates the ozone gas 106 flowing through the ozone gas supply line 141 with UV rays to activate ozone.

The inert gas supply unit 109 has a $N_2$ gas supply line 150 for carrying $N_2$ gas or hot $N_2$ gas 108 and $N_2$ gas supplying nozzles 151 for ejecting $N_2$ gas or hot $N_2$ gas 108 supplied through the inert gas supply line 150. The inlet end of the inert gas supply line 150 is connected to an inert gas source 160. The inert gas supply line 150 is provided with a shutoff valve 152 and a heater 153 for heating $N_2$ gas. The shutoff valve 152 and the heater 153 are controlled by the control unit 121. When the control unit 121 opens the shutoff valve 152 and actuates the heater 153, $N_2$ gas of an ordinary temperature supplied from the inert gas source 160 is heated and hot $N_2$ gas 108 can be ejected through the $N_2$ gas supplying nozzles 151. The wafer boat 6 can be quickly dried by ejecting the hot $N_2$ gas 108 against the wafer boat 6.

The cleaning apparatus 100 forms a water molecule layer ($H_2O$ layer), i.e., a solvent layer, over the surfaces of wafers W. The control unit 121 energizes the heater 131 and adjusts the heat generating rate of the heater 131 so that the steam 104 can be sufficiently generated, and energizes the lamp heater 120 so as to heat the wafers W at a temperature higher than the dew point of the steam 104 to control properly the difference between the temperature of the wafers W and the dew point of the steam 104. Thus, a high-density water molecule layer can be formed over the surfaces of the wafers W. Ozone molecules are mixed in the water molecule layer formed on the surfaces of the wafers W to form an ozone-water molecular layer of high ozone concentration. Thus, a cleaning process using ozone is carried out. The control unit 121 controls the flow controller 136 to adjust the rate of generation of the steam 104 so that the water molecule layer is formed properly. The control unit 121 controls the flow controller 144 to control the flow rate of the ozone gas 106 according to the degree of formation of the water molecule layer so that ozone dissolves properly in the water molecule layer.

Pure water supplying nozzles 155 are disposed in the top cover 111 to eject pure water against the wafers W for rinsing. The wafers W can be dried by ejecting hot $N_2$ gas against the wafers W through the inert gas supplying nozzles 151.

Figure 3:
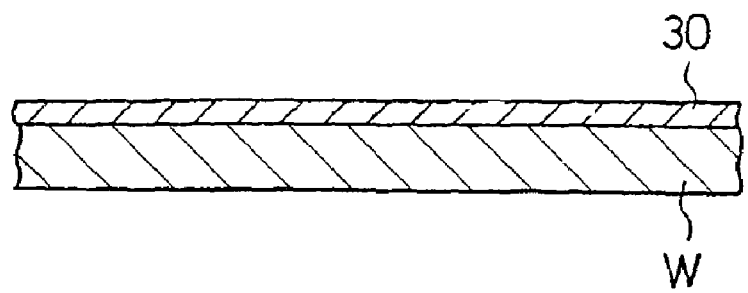
FIG. 3 is a sectional view for explaining a first step of a cleaning method according to the present invention.

A cleaning method to be carried out by the cleaning apparatus 100 will be described below. The cleaning apparatus 100 supplies the steam 104 and the ozone gas 106 into the processing vessel 102 containing wafers W to process the wafers W by hydroxyl radicals produced by interaction between the steam 104 and the ozone gas 106. Fifty wafers W having surfaces coated with resist films 30 as shown in FIG. 3 are disposed in the processing vessel 102, respectively, in a manner as mentioned in connection with the description of the above described embodiments. The thickness of the resist films 30 is, for example, 1200 nm.

The heater 131 is energized so as to heat the hot plate 130 at, for example, 120° C. Pure water is dripped from the pure water supply line 132 onto the hot plate 130 to generate the steam 104 of 120° C., and the steam 104 is supplied into the processing vessel 102. Meanwhile, the ozone gas 106 having an ozone concentration of, for example, about 192 $g/m^3$ (normal), i.e., about 9% by volume, is supplied through the ozone gas supply line 141 and is ejected through the ozone gas supplying nozzles 142 into the processing vessel 102. Thus, the steam 104 and the ozone gas 106 are supplied individually.

The lamp heater 120 is energized to heat the wafers W at a predetermined temperature, which is in a temperature range optimum for a cleaning process using ozone, higher than the dew point of the steam 104 and lower than the temperature of the steam 104. Since the wafers W are heated at the predetermined temperature higher than the dew point of the steam 104, the steam 104 as supplied into the processing chamber 102 does not condense on the wafers W; that is, the steam 104 does not condense in a pure water film on the surfaces of the wafers W, and a high-density water molecule layer of water molecules ($H_2O$ molecules) 161 can be surely formed.

Ozone molecules ($O_3$ molecules) 162 are mixed in the water molecule layer of water molecules 161 to form an ozone-water molecular layer containing water molecules 161 and ozone molecules 162. The water molecules 161 and the ozone molecules 162 interact in the ozone-water molecular layer to produce a large amount of reactive substances, such as oxygen radicals and hydroxyl radicals (OH radicals), in the vicinity of the surfaces of the wafers W. The hydroxyl radicals thus produced on the surfaces of the wafers W do not disappear, cause an oxidation reaction immediately, and decompose the resist forming the resist films 160 into a carboxylic acid, carbon dioxide, water and such. Consequently, the resist forming the resist films 160 is thoroughly oxidized and decomposed and the resist films 160 are altered into water-soluble films 160a. The water-soluble films 160a can be easily removed by rinsing using pure water.

Thus, this cleaning method forms the high-density water molecule layer of water molecules 161 on the surfaces of the wafers W and mixes ozone molecules 162 into the water molecule layer. Consequently, the water molecule layer of water molecules 161 can be altered into the ozone-water molecular layer containing water molecules 161 and ozone molecules 162. The ozone-water molecular layer is formed on the surfaces of the wafers W immediately before reaction, the ozone-water molecular layer is used before its ozone concentration decreases with time, hydroxyl radicals are produced in the ozone-water molecular layer, and substantially all the hydroxyl radicals produced in the processing vessel 102 are used effectively for the cleaning process. Thus, the cleaning method exercises a high processing ability. Thereafter, the cleaning apparatus according to the present invention is able to process wafers W effectively at a high removal rate that is 1.5 times or above the removal rate at which the conventional cleaning apparatus operates.

Since the steam 104 is applied to the wafers W which is heated at a temperature higher than the dew point of the steam 104 and lower than the temperature of the steam 104, the steam 104 does not condense in a pure water film on the surfaces of the wafers. Hydroxyl radicals produced in the ozone-water molecular layer containing water molecules 161 and ozone molecules 162 react more quickly and actively with the resist films 160 formed on the surfaces of the wafers W than hydroxyl radicals produced by dissolving the ozone gas 106 in the pure water film.

The high-density water molecule layer of water molecules 161 can be easily formed. When ozone molecules 162 are mixed properly in the high-density water molecule layer of water molecules 161, an active reaction occurs, the water molecules 161 and the ozone molecules 162 are mixed and a large number of hydroxyl radicals are produced in the ozone-water molecular layer. The dissolving power of the pure water film decreases with the increase of temperature and it is difficult to dissolve the ozone gas 106 in a high-temperature pure water film. On the other hand, the capacity of the water molecule layer of water molecules 161 to contain ozone molecules 162 does not decrease significantly even if the temperature of the wafers W and the atmosphere surrounding the wafers W is high. The cleaning process using the water molecule layer containing water molecules and ozone molecules can be carried out in an atmosphere of a temperature higher than that of an atmosphere in which the process using the ozonic water film formed by dissolving the ozone gas 106 in a pure water film can be carried out. An atmosphere of a higher temperature makes the production of hydroxyl radicals and the chemical action of hydroxyl radicals more active. Consequently, the cleaning process using ozone can be quickly carried out at high reaction rate.

The ozone gas 106 is supplied continuously through the ozone gas supply line 141 to supply ozone molecules continuously to the water molecule layer. Thus, the water molecule layer is replenished with ozone molecules and hydroxyl radicals as the ozone molecules and the hydroxyl radicals contained in the water molecule layer are consumed. Consequently, sufficient new ozone molecules and sufficient new hydroxyl radicals can be quickly supplied to process the resist films 160 and hence a high reaction rate can be maintained. Preferably the water molecule layer and the ozone-water molecular layer are formed in a density that will not form water drops. The cleaning process using ozone can be promoted by heating the wafers W at a temperature higher than the dew point of the steam 104 and in a temperature range in which oxidation reaction proceeds actively.

After the resist films 160 have been altered into water-soluble films, pure water is ejected through the pure water supplying nozzles 155 against the water-soluble films for rinsing, and $N_2$ gas (inert gas) is ejected through the inert gas supplying nozzles 151 against the wafers W to remove water drops from the wafers W for drying. Subsequently, the wafers W are taken out of the cleaning apparatus 100. The wafers W may be taken out of the cleaning apparatus 100 after the resist films 160 have been removed without rinsing and drying the same, and the wafers W may be rinsed by a rinsing apparatus and may be dried by a drying apparatus. After the processed wafers W have been taken out of the cleaning apparatus 100, fifty wafers W to be processed by the next processing cycle are carried into the cleaning apparatus 100 and are subjected to the cleaning process using ozone.

It is possible that the steam 104 condense in water drops on the wafer boat 6 or the wafer boat 6 is wetted with water drops when the wafer W held on the wafer boat 6 re transferred to the next processing apparatus, such as a rinsing apparatus after the completion of the cleaning process using ozone. If the wafer boat 6 thus wetted with water is used for holding wafers W to be processed, the surfaces of the wafers W will be wetted with water. As mentioned above, hydrogen radicals produced in the ozone-water molecular layer including water molecules 161 and ozone molecules 162 reacts more effectively with the resist films 160 than those produced in ozonic water film formed by dissolving the ozone gas 106 in the pure water film. To avoid holding wafers W to be processed on the wafer boat 6 wetted with water, the inert gas supply unit 109 applies hot $N_2$ gas 108 to the wafer boat 6 to dry the wafer boat 6 before new fifty wafers W are loaded on the wafer boat 6. Consequently, water drops remaining on the wafer boat 6 are removed and the dissolution of the ozone gas 106 in pure water films can be avoided.

Thus, the cleaning method forms the high-density ozone-water molecular layer containing water molecules 161 and ozone molecules 162 on the surfaces of the wafers W immediately before processing the wafers W and uses substantially all the hydroxyl radicals produced in the ozone-water molecular layer before the hydroxyl radicals disappear. Consequently, the wafers W can be effectively processed by the cleaning process using ozone. The high-temperature atmosphere activates interaction between the water molecules 161 and the ozone molecules 162 to promote the production of hydroxyl radicals and the reaction of hydroxyl radicals with the resist films 160 in the cleaning process using ozone. Thus, the resist films 160 can be thoroughly removed. The cleaning apparatus 100 embodying the present invention is capable of properly carrying out the foregoing cleaning method.

In the process of carrying out the cleaning method of the present invention using ozone, various reactions are performed in addition to the mixing of water molecules 161 and ozone molecules 162. For example, the steam 104 and the ozone gas 106 are mixed in the processing vessel 102 to produce a mixed gas. A large number of free hydroxyl radicals and the like are produced in the mixed gas by thermal decomposition and collision. When the mixed gas touches the resist films 160 formed on the surfaces of the wafers W, the mixed gas, similarly to the ozone-water molecular layer including water molecules 161 and ozone molecules 162, decomposes the resist forming the resist films 160 by oxidation reaction into a carboxylic acid, carbon dioxide, water and such. Thus, a large number of hydroxyl radicals are produced in the mixed gas immediately before the mixed gas comes into contact with the wafers W, and the hydroxyl radicals react directly with the resist films 160 to exercise a high processing ability.

A cleaning apparatus 170 in a still further embodiment of the present invention will be described with reference to FIG. 11, in which parts like or corresponding to those shown in FIG. 9 are denoted by the same reference characters and description thereof will be omitted to avoid duplication.

In the cleaning apparatus 100 shown in FIG. 9, the atmosphere in the processing vessel 102 is discharged through the discharge pipe 123 connected to the discharge headers 122. The cleaning apparatus 170 shown in FIG. 11 has a discharge pipe 123 connected to a processing vessel 102 and provided with a flow controller 171 for optionally adjusting pressure in the processing vessel 102. The flow controller 171 is controlled by a control unit 121. A pressure sensor 172 set on the processing vessel 102 measures pressure in the processing vessel 102 and gives a pressure signal representing the pressure in the processing vessel 102 to the control unit 121. The control unit 121 controls the flow controller 171 on the basis of the pressure measured by the pressure sensor 172 to regulate the flow rate of a gas flowing through the discharge pipe 123. An ozone gas source 140 supplies ozone gas at a supply pressure of 196 kPa. Thus, a pressurized atmosphere of 196 kPa is maintained in the processing vessel 102.

In the cleaning apparatus 170, the steam 104 is generated outside the processing vessel 102 and the steam 104 is supplied into the processing vessel 102. A steam supply unit 175 includes a steam source 176 that generates the steam 104, a steam supply line 177 for carrying the steam 104 to the processing vessel 102, and steam supplying nozzles 178 through which the steam 104 is ejected into the processing vessel 102. The steam source 176, similarly to those in the foregoing embodiments, includes a hot plate, a heater and such. The steam supply line 177 is provided with a shutoff valve 179 and a flow controller 180. The control unit 121 controls the shutoff valve 179 and the flow controller 180 to regulate the flow rate of the steam 104 through the steam supply line 177. Since any steam supply means does not need to be disposed in the processing vessel 102, the cleaning apparatus 170 can be formed in compact construction.

A bottom cover 181 is joined to the lower open end of the processing vessel 102 with a gasket 182 sandwiched between the processing vessel 102 and the bottom cover 181. A drain pipe 183 provided with a drain valve 184 is connected to the bottom cover 181.

A cleaning method to be carried out by the cleaning apparatus 170 will be described hereafter. Wafers W of an ordinary temperature of, for example, 23° C. is placed in the processing vessel 102. The wafers W are heated at a predetermined temperature by a lamp heater 120 that radiates heat of, for example, 115° C. Ozone gas 106 of, for example, 196 kPa is supplied by the ozone gas supply unit 107 into the processing vessel 102. At the same time, hot $N_2$ gas 108 of, for example, 150° C., is applied to the wafers W by an inert gas supply unit 109 to heat the wafers W quickly at the predetermined temperature.

The supply of hot $N_2$ gas is stopped after the wafers W have been heated at the predetermined temperature, and the steam 104 is supplied into the processing vessel 102 by the steam supply unit 175. The control unit 121 controls the flow controller 171 placed in the discharge pipe 123 to discharge an atmosphere in the processing vessel 102 at a low discharge rate to maintain the interior of the processing vessel 102 at 196 kPa. Ozone gas 106 is thus supplied to increase the ozone concentration of the atmosphere in the processing vessel 102.

Figure 10:
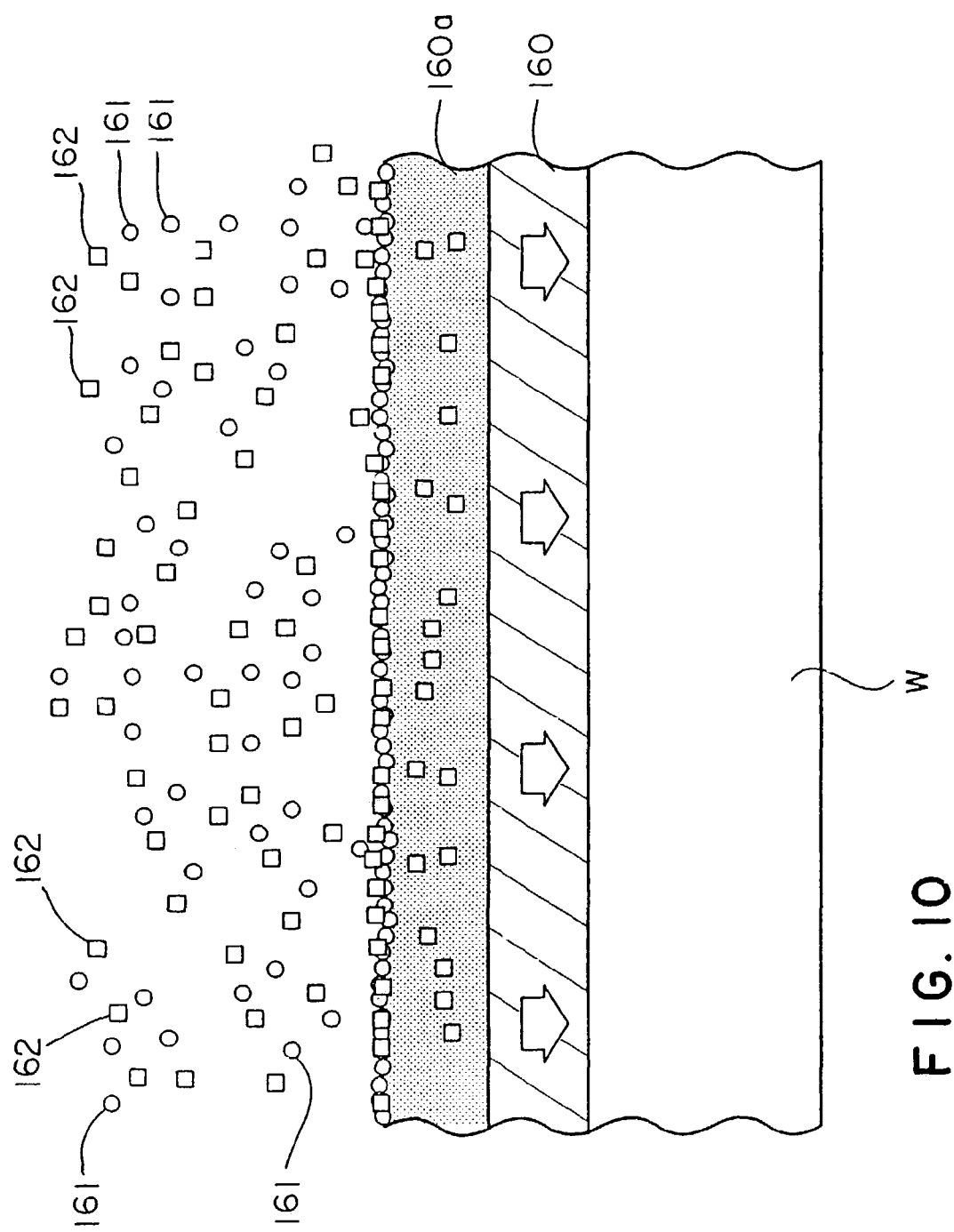
FIG. 10 is a sectional view for explaining a process to be carried out by the cleaning apparatus shown in FIG. 9.

A high-density water molecule layer of water molecules 161 is formed on the surfaces of the wafers W as mentioned previously in connection with FIG. 10. Since the ozone gas 106 is supplied beforehand into the processing vessel 102, ozone molecules 162 are mixed immediately into the water molecule layer of water molecules 161. Thus, an ozone-water molecular layer can be formed and a large number of hydroxyl radicals can be produced in the ozone-water molecular layer. The hydroxyl radicals produced in the ozone-water molecular layer work effectively in quickly carrying out the cleaning process using ozone.

When the steam 104 is applied to the wafers W maintained at the ordinary temperature, the steam 104 condenses on the surfaces of the wafers W and a large number of water drops form on the surfaces of the wafers W because the difference between the temperature of the wafers W and the dew point of the steam 104 is large. The water drops form a thick pure water film on the surfaces of the wafers W to reduce processing ability. However, since the steam 104 is applied to the wafers W after heating the wafers W at the predetermined temperature, a high-density water molecule layer of water molecules 161 can be surely formed and the reduction of processing ability can be prevented. Since the wafers W is placed in the atmosphere of 196 kPa, an increased number of ozone molecules 162 can be mixed in the water molecule layer of water molecules 161 to produce an increased number of hydroxyl radicals. The cleaning process using ozone can be carried out in, an atmosphere of an elevated temperature, which further increases processing ability.

After resist films 160 formed on the surfaces of the wafers W have been altered into water-soluble films 160a, the wafers W are taken out of the processing vessel 102 and are carried to a rinsing apparatus and a drying apparatus sequentially for rinsing and drying. Meanwhile, the supply of the steam 104 and the ozone gas 106 into the processing vessel 102 is stopped, liquids remaining in the processing vessel 102 are drained through the drain pipe 183, the flow controller 171 is fully opened, and $N_2$ gas is blown into the processing vessel 102 by the inert gas supply unit 109 to purge the processing vessel 102 of the ozone gas 106 and to dry the interior of the processing vessel 102. As mentioned above, a wafer boat 6 is dried. Then, wafers W of an ordinary temperature to be processed by the next cleaning cycle are placed in the processing vessel 102. If the steam 104 remains in the processing vessel 102, a large amount of water drops will form on the wafers W of the ordinary temperature. Since the processing vessel 102 and the steam source 176 are separate from each other and the atmosphere in the processing vessel 102 can be easily replaced, formation of water drops on the surfaces of the wafers W of the ordinary temperature placed in the processing vessel 102 can be prevented and the surfaces of the wafers W can be kept dry until the steam 104 is supplied into the processing vessel 102.

As apparent from the foregoing description, the cleaning method uses hot $N_2$ gas 108 to heat the wafers W quickly to a predetermined temperature, and supplies the ozone gas 106 into the processing vessel 102 before the steam 104 is supplied into the processing vessel 102 to form an ozone-water molecular layer and to produce hydroxyl radicals in a short time. Consequently, the cleaning process using ozone can be quickly carried out and the throughput of the cleaning apparatus can be increased. The atmosphere surrounding the wafers W is pressurized to increase the amount of ozone molecules 162 mixed into the water molecule layer of water molecules 161 and to enable processing the wafers W in an atmosphere of an elevated temperature. Consequently, the resist films 160 can be removed from the wafers W at an increased removing efficiency and the effect of the cleaning process using ozone can be further enhanced.

The cleaning apparatus 170 supplies the steam 104 into the processing vessel 102 through the steam supply line 177. Therefore, the amount of moisture contained in the processing vessel 102 can be easily adjusted and the interior of the processing vessel 102 can be dried. The wafers W placed in the processing chamber 102 are not affected by the thermal influence of the heater of the steam source 176. Accordingly, the wafers W are not heated and the temperature of the wafers W does not increase excessively beyond a necessary temperature. Therefore, it is possible to prevent, for example, an undesirable condition in which the wafers W are heated at an excessively high temperature, water molecules 161 have difficulty in adhering to the surfaces of the wafers W, the water molecule layer cannot be formed and the cleaning process using ozone cannot be achieved. The cleaning apparatus 170, similarly to the cleaning apparatus 100 shown in FIG. 9, is able to dry the wafer boat 6 to prevent the dissolution of the ozone gas 106 in water drops. The discharge pipe 123 of the cleaning apparatus 100, similarly to the discharge pipe 123 of the cleaning apparatus 170, may be provided with a flow controller 171 to regulate the pressure in the processing vessel 102 so that the atmosphere surrounding the wafer W is pressurized.

Figure 12:
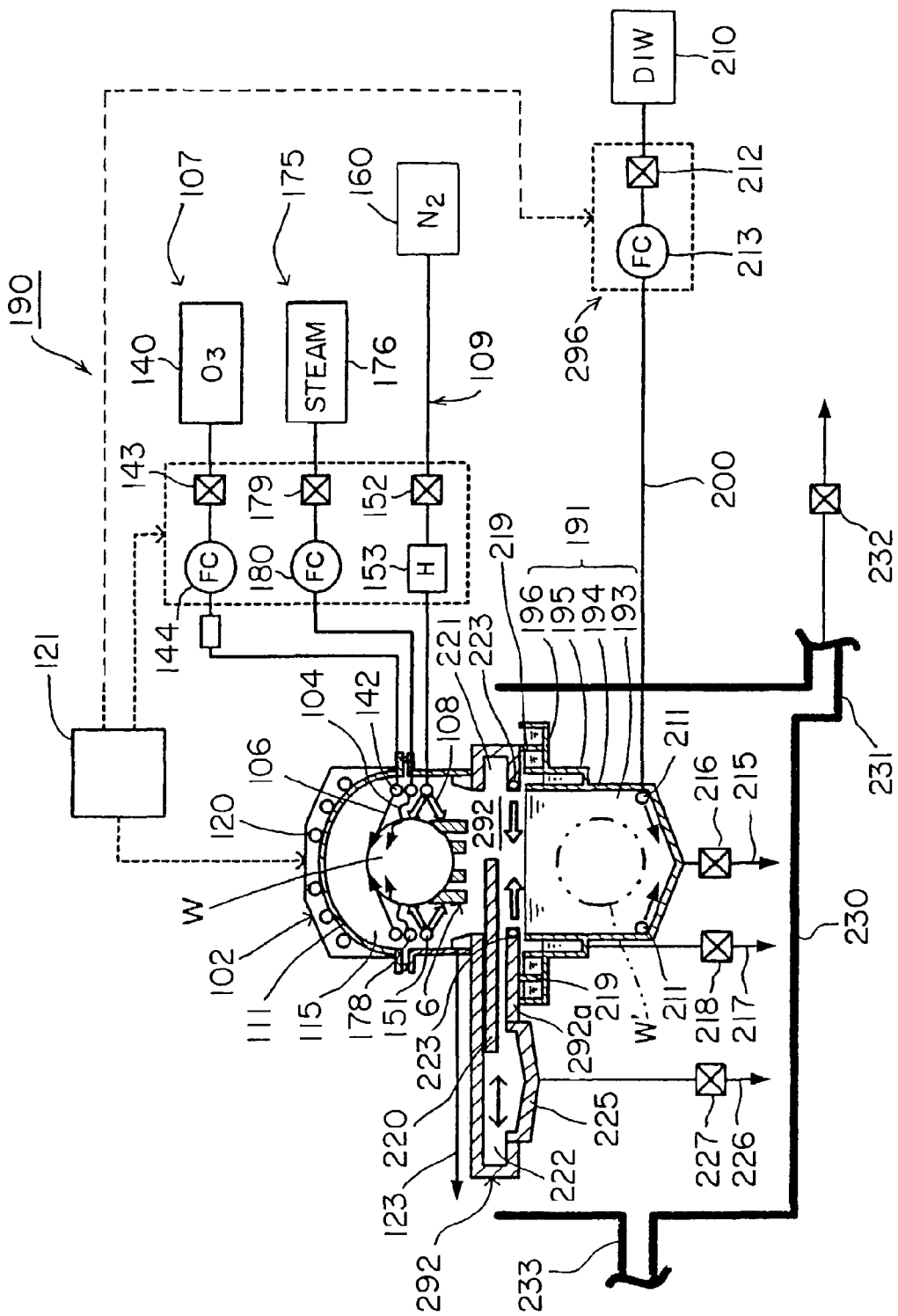
FIG. 12 is a schematic vertical sectional view of a cleaning apparatus in another embodiment of the present invention.

A cleaning apparatus 190 in another embodiment of the present invention will be described hereafter with reference to FIG. 12. As shown in FIG. 12, the cleaning apparatus 190 includes a processing vessel 102, a rinsing tank 191 and a passage unit 292 disposed between the processing vessel 102 and the rinsing tank 191. The cleaning apparatus 190 is capable of carrying out a cleaning process using ozone and a rinsing process.

An ozone gas supply unit 107, a steam supply unit 175 and an inert gas supply unit 109 are connected to the processing vessel 102 to supply the ozone gas 106, the steam 104, and $N_2$ gas or hot $N_2$ gas into a processing chamber (first processing chamber) 115 defined by the processing vessel 102. The processing vessel 102 has an open bottom end opening into a passage space 221 formed in the passage unit 292.

The rinsing tank 191 includes an inner tank 194 defining a rinsing chamber (second processing chamber) 193, a middle tank 195 surrounding an upper end part of the inner tank 194, and an outer tank 196 surrounding an upper end part of the middle tank 195.

A pure water supply unit 296, i.e., a processing liquid supply system, supplies pure water (DIW), i.e., a processing liquid, into the rinsing chamber 193. The pure water supply unit 296 includes a pure water supply line 200 for carrying pure water, and pure water supplying nozzles 211 for ejecting pure water carried through the pure water supply line 200 into the rinsing chamber 193. The pure water supply line 200 has an inlet end connected to a pure water source 210. The pure water supply line 200 is provided with a shutoff valve 212 and a flow controller 213. A control unit 121 controls the shutoff valve 212 and the flow controller 213.

The open upper end of the inner tank 194 opens into the passage space 221 formed in the passage unit 292. A drain pipe 215 provided with a shutoff valve 216 is connected to a central part of the bottom wall of the inner tank 194 to drain used pure water from the rinsing chamber 193. The middle tank 195 collects pure water overflowed the inner tank 194 and discharges the same through an overflow pipe 217 provided with a shutoff valve 218 and connected to its bottom. Pure water is contained at all times in the outer tank 196. The outer tank 196 is provided with an annular sealing plate 219. The upper end of the sealing plate 219 is in close contact with the bottom surface of a structural member of the passage unit 292. Thus, the outer tank 196 serves as a sealing member using pure water to isolate the interior of the rinsing tank 191 from the external space.

The passage unit 292 is provided with a shutter 220 to isolate the ozone-processing chamber 115 and the rinsing chamber 193 from each other. The shutter 220 is capable of being vertically and horizontally moved by a shutter operating mechanism, not shown. The interior of the passage unit 292 is divided roughly into the passage space 221 and a shutter storing space 222 into which the shutter 220 is moved to open the passage space 221. When shutter operating mechanism moves the shutter 220 to the passage space 221, the ozone-processing chamber 115 and the rinsing chamber 193 are isolated from each other. When the shutter operating mechanism moves the shutter 220 to the shutter storing space 222, the ozone-processing chamber 115 and the rinsing chamber 193 are connected.

Inert gas supplying nozzles 223 are embedded in portions of an edge defining an opening in the bottom wall 292a of the passage unit 292. A $N_2$ gas curtain is formed over the rinsing chamber 193 by ejecting $N_2$ gas through the inert gas supplying nozzles 223. The shutter 220 and the $N_2$ gas curtain prevent the diffusion of an atmosphere in the ozone-processing chamber 115 into the rinsing chamber 193 and the flow of miss from the rinsing chamber 193 into the ozone-processing chamber 115.

The passage unit 292 has a draining part 225 underlying the shutter storing space 222. A drain pipe provided with a shutoff valve 227 is connected to the draining part 225. Even if a vapor produced in the rinsing tank 191 condenses in liquid drops on the bottom surface of the shutter 220 as located at a closing position, the liquid drops can be drained to the outside through a drain passage, not shown, formed in the passage unit 292. When the shutter 220 wetted with liquid drops is located at an open position in the shutter storing space 222, the liquid drops drip onto the draining part 225 and are drained through the drain pipe 226.

A wafer boat 6 can be vertically moved by a lifting mechanism, not shown, to move wafers W held on the wafer boat 6 between the ozone-processing chamber 115 and the rinsing chamber 193. The wafers W held on the wafer boat 6 raised to an upper position in the ozone-processing chamber 115 are indicated by solid line in FIG. 12. The wafers W held on the wafer boat 6 lowered to a lower position in the rinsing chamber 193 are indicated by two-dot chain line. The cleaning apparatus 190 moves the wafer boat 6 vertically to locate the wafers W in either the ozone-processing chamber 115 or the rinsing chamber 193. The cleaning apparatus 190 carries out a cleaning process using ozone and rinsing process continuously in a closed space.

The processing vessel 102 and the rinsing tank 191 are contained in a casing 230. The outlets of the drain pipes 215, 217 and 226 open into the casing 230. A drain line 231 provided with a shutoff valve 232 is connected to the bottom wall of the casing 230. The drain line 231 is connected to a drain system of the plant. When the shutoff valve 232 is opened, pure water drained through the drain pipes 215, 217 and 226 into the casing 230 is drained through the drain line 231 into the drain system of the plant. A discharge duct 233 is connected to the casing 230 to discharge an atmosphere surrounding the processing vessel 102 and the rinsing tank 191 from the casing 230. For instance, when a top cover 111 is removed to carry wafers W into or carry wafers W out of the processing vessel 102, the diffusion of an atmosphere in the ozone-processing chamber 115 and mists produced in the rinsing chamber 193 into the external space can be prevented.

A wafer processing method to be carried out by the cleaning apparatus 190 will be described hereinafter with reference to a flow chart shown in FIG. 13. The top cover 111 is removed and fifth wafers W having surfaces coated, respectively, with, for example, resist films 160 (FIG. 10) are carried into the processing vessel 102 of the cleaning apparatus 190 in step S1. The top cover 111 is put on the processing vessel 102 to close the processing vessel 102 in step S2. Then, the shutter 220 is closed, and a $N_2$ gas curtain is formed by ejecting $N_2$ gas through the inert gas supplying nozzles 223 to isolate an atmosphere in the ozone-processing chamber 115 and an atmosphere in the rinsing chamber 193 from each other.

Subsequently, a cleaning process using ozone is carried out in the ozone-processing chamber 115 in step S3. The wafers W are heated at the predetermined temperature by the lamp heater 120. The steam supply unit 175 supplies the steam 104 into the ozone-processing chamber 115 to form a water molecule layer containing water molecules 161 on the surfaces of the wafers W. The ozone gas supply unit 107 supplies the ozone gas 106 into the ozone-processing chamber 115. Consequently, ozone molecules 162 are mixed into the water molecule layer and a large number of hydroxyl radicals are produced and the resist forming the resist films 160 is thoroughly decomposed by oxidation reaction to alter the resist films 160 into water-soluble films.

The supply of the steam 104 and the ozone gas 106 is stopped to terminate the cleaning process using ozone. Then, the wafers W are transferred to the rinsing chamber 193 and are subjected to a rinsing process in step S4. The pure water supply unit 296 supplies pure water beforehand through the pure water supplying nozzles 211 into the rinsing chamber 193 to fill up the rinsing chamber 193 with pure water. Then, the shutter 220 is opened, the wafer boat 6 is lowered to place the wafers W quickly in the rinsing chamber 193 with the cleaning apparatus 190 kept closed. Thus, the wafers W can be immersed in pure water in a short time without being exposed to the atmosphere and a rinsing process is started.

As mentioned above, since the resist films 160 are altered into the water-soluble films 160a, the water-soluble films 160a can be easily removed in the rinsing chamber 193. After the completion of the rinsing process, the wafer boat 6 is raised to transfer the wafers W to the ozone-processing chamber 115. Then, the top cover 11 is removed in step S5, the wafers W are taken out of the processing vessel 102 and the wafers W are carried away from the cleaning apparatus 190 in step S6. When the top cover 111 is removed, the atmosphere surrounding the processing vessel 102 and the rinsing tank 191 is sucked through the casing 230 to prevent the diffusion of the atmosphere in the ozone-processing chamber 115 and the atmosphere in the rinsing chamber 193 into the ambiance. Then, $N_2$ gas of an ordinary temperature is supplied into the ozone-processing chamber 115 by the inert gas supply unit 109 to replace the atmosphere in the ozone-processing chamber 115 with $N_2$ gas and hot $N_2$ gas is applied to the wafer boat 6 to dry the same in preparation for processing other fifty wafers by the next processing cycle.

The wafers W are carried from the cleaning apparatus 190 to a different wafer processing apparatus, which carries out, for example, a chemical liquid treatment process, a final rinsing process and a drying process. The wafers W are rinsed in a rinsing tank. The chemical liquid treatment process is, for example, an SC1 process (ammonia process) that applies ammonia vapor ($NH_4OH$ vapor) and steam to the wafers W to remove particles and organic impurities from the surfaces of the wafers W. The different wafer processing apparatus carries out the SC1 process in a processing vessel, carries out the rinsing process in a rinsing tank, and carries out the final rinsing process and the drying process in the processing vessel. Naturally, the chemical liquid treatment process, the rinsing process, the final rinsing process and the drying process may be carried out by separate processing apparatuses, respectively, and the wafers W may be carried sequentially to those apparatuses.

The cleaning apparatus 190 is capable of successively carrying out the process using ozone and the rinsing process and can be formed in small construction. The wafers W do not need to be taken out of the cleaning apparatus 190 throughout the time from the start of the process using ozone and completion of the rinsing process. Therefore, exposure of the wafers W to the atmosphere after the process using ozone can be avoided. Consequently, it is possible to avoid formation of oxide films on the surfaces of the wafers W by natural oxidation, and hardening and alteration of the water-soluble films 160a (FIG. 10) into insoluble films due to exposure of the wafers W to the atmosphere. Furthermore, it is possible to prevent the alteration of various reaction products formed on the surfaces of the wafers W by the process using ozone into different substances, such as contaminants, due to exposure to the atmosphere. Consequently, the rinsing process can be satisfactorily achieved. The wafers W can be subjected to the rinsing process immediately after the completion of the process using ozone by quickly lowering and raising the wafers W and hence the cleaning apparatus 190 processes the wafers W at a high throughput. The cleaning apparatus 190, similarly to the cleaning apparatuses 100 and 170, is capable of drying the wafer boat 6.

Although the ozone-processing chamber 115 and the rinsing chamber 193 of the cleaning apparatus 190 are disposed in vertical arrangement, the ozone-processing chamber 115 and the rinsing chamber 193 may be disposed in horizontal arrangement for the same effect.

A cleaning apparatus 270 in still another embodiment of the present invention will be described hereafter with reference to FIG. 14. The cleaning apparatus 270, similarly to the cleaning apparatus 170 shown in FIG. 11, has a discharge pipe 123 provided with a flow controller 171, and a processing vessel 102 provided with a pressure sensor 172. A control unit 121 controls the flow controller 171 on the basis of a pressure signal provided by the pressure sensor 172 to regulate the flow rate of a gas discharged through the discharge pipe 123.

The atmosphere in an ozone-processing chamber 115 of the cleaning apparatus 270 can be pressurized. The cleaning apparatus 270, similarly the cleaning apparatus 170, is capable of mixing an increased amount of ozone molecules 162 into a water molecule layer of water molecules 161 and of enabling processing in high-temperature atmosphere to enhance processing ability. The cleaning apparatus 270, similarly to the cleaning apparatuses 100, 170 and 190, is able to dry a wafer boat 6.

A small amount of catalyst gas, such as $NO_x$ gas, may be supplied into the processing vessel to promote the production of hydroxyl radicals to activate oxidation reaction.

EXAMPLE 2

Results of experimental operation of the cleaning apparatus 270 in the above embodiment will be explained.

Wafers coated with a film of an organic material (BARC) was subjected to a cleaning process. The dependence of film removal rate on the ozone concentration of ozone gas was examined. Measurement results were similar to those shown in FIG. 7, in which ozone concentration ($g/m^3$ (normal)) is measured on the horizontal axis and film removal rate (nm/s) is measured on the vertical axis. As obvious from FIG. 7, the film removal rate increased with increase of the ozone concentration.

Figure 15:
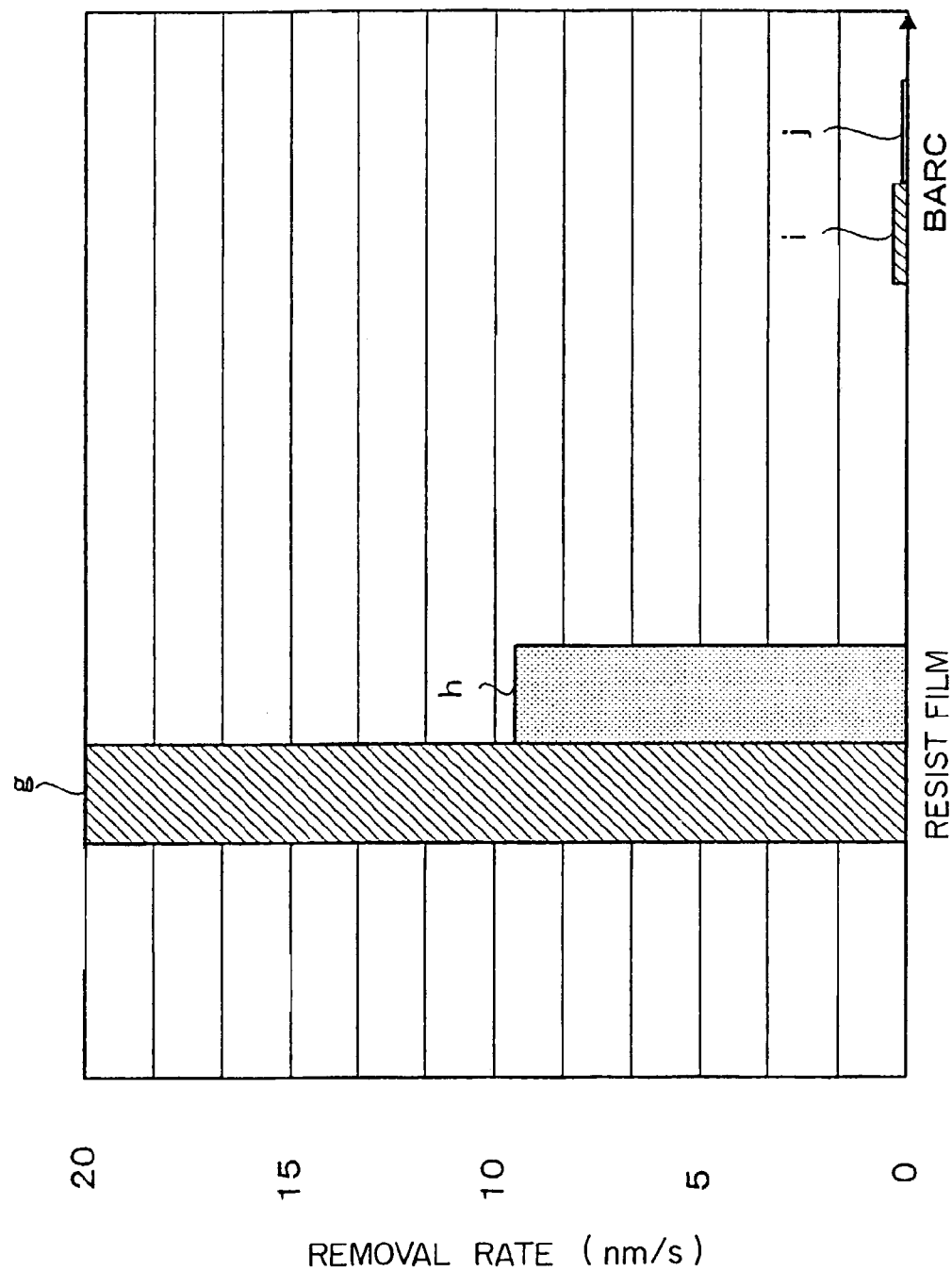
FIG. 15 is a graph comparatively showing removal rate of a process of processing wafers using ozone in a pressurized atmosphere and removal rate of a process of chemically processing wafers using SPM.

FIG. 15 comparatively shows removal rate achieved by a process using ozone carried out to process wafers in a pressurized atmosphere and removal rate achieved by a conventional chemical liquid treatment process using a chemical liquid called SPM (an $H_2SO_4/H_2O_2$ mixed liquid). The processes were carried out to remove a resist film and a film of an organic material. The atmosphere around the wafers was pressurized at 196 kPa, the wafers were heated at 110° C. and steam of 120° C. was applied to the wafers. In FIG. 15, bars g and i indicate film removal rates achieved by the process using ozone carried out in a pressurized atmosphere and bars h and j indicate film removal rates achieved by the chemical liquid treatment process using SPM. As shown in FIG. 15, the film removal rate of the process using ozone carried out in the pressurized atmosphere to remove the resist film was 20 nm/s as indicated by the bar g, the film removal rate of the chemical liquid treatment process using SPM carried out to remove the resist film was about 9.5 nm/s as indicated by the bar g, the film removal rate of the process using ozone carried out in the pressurized atmosphere to remove the BARC film was about 0.2 nm/s as indicated by the bar i and the film removal rate of the chemical liquid treatment process using SPM carried out to remove the BARC film was about 0.05 nm/s as indicated by the bar j. It is known from FIG. 15 that films can be removed at a high film removal rate by the process using ozone in a pressurized atmosphere.

Figure 11:
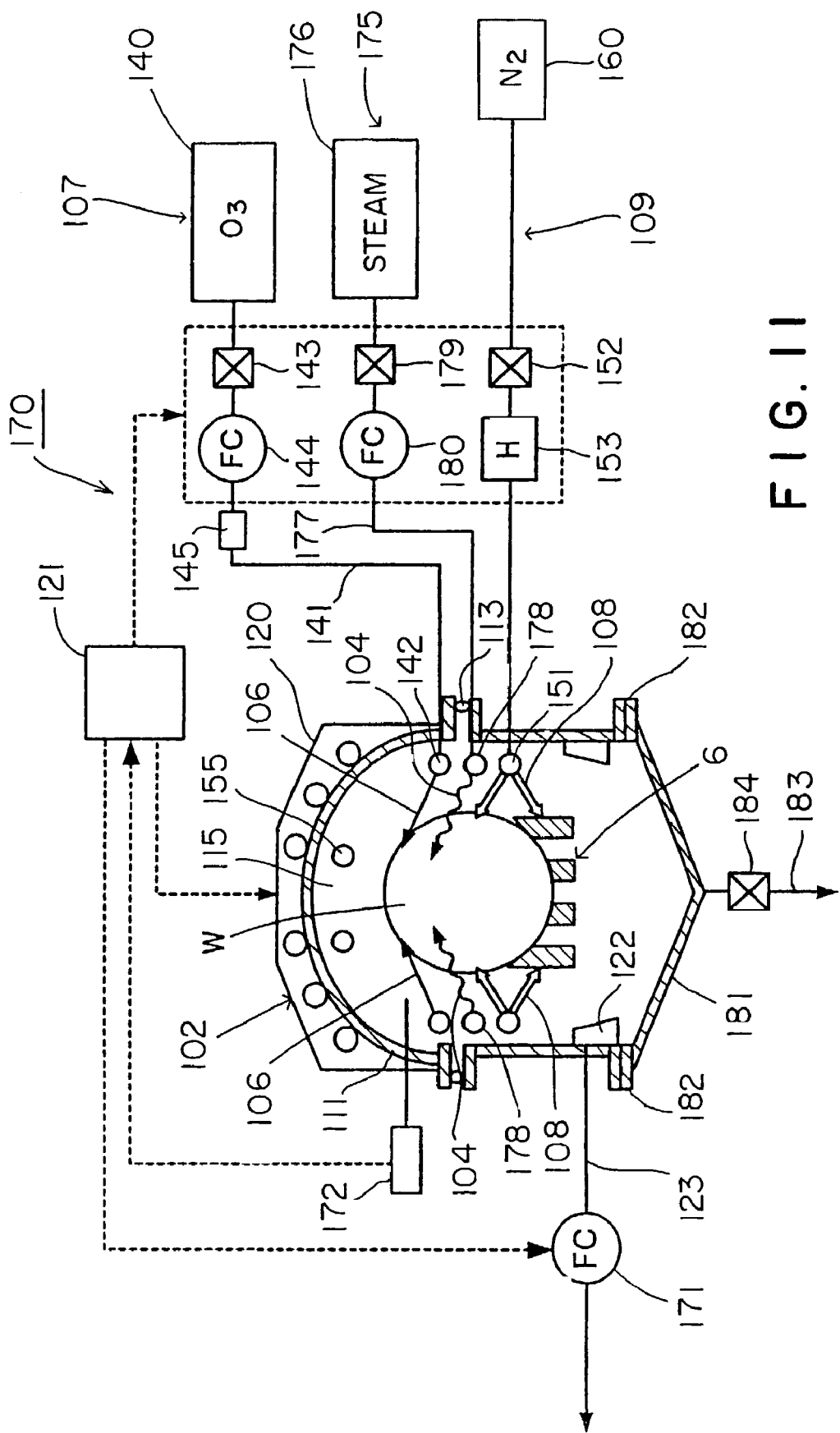
FIG. 11 is a schematic vertical sectional view of a cleaning apparatus in a still further embodiment of the present invention.
Figure 14:
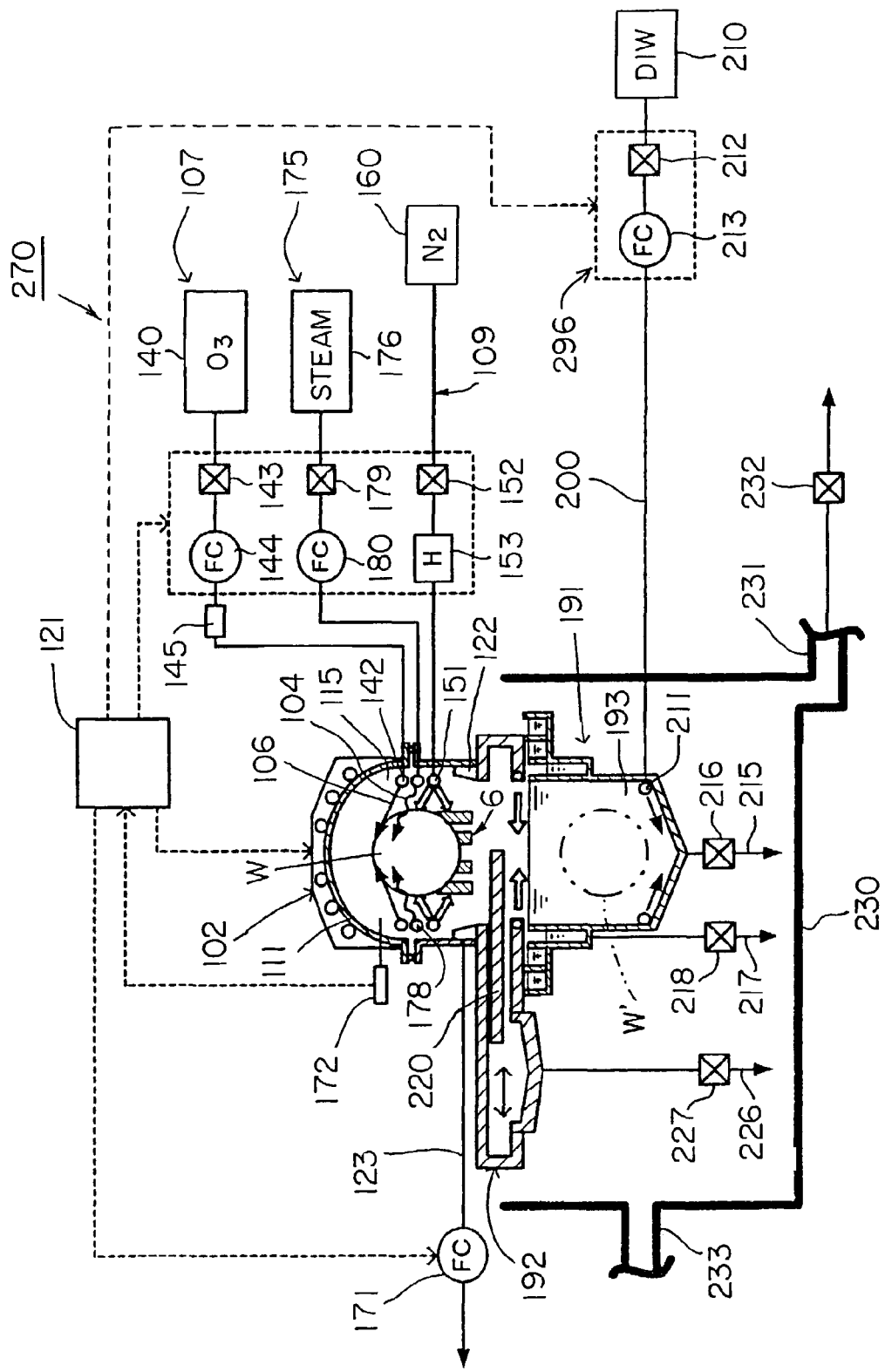
FIG. 14 is a schematic vertical sectional view of a cleaning apparatus in a further embodiment of the present invention.

Since the cleaning apparatuses shown in FIGS. 11, 12 and 14 use the reactive substance produced immediately before starting the cleaning process before the reactive substance disappears, the cleaning apparatuses are able to exercise high processing ability and to process wafers effectively.

The cleaning process of the present invention is capable of being carried out in an atmosphere of a temperature higher than that of an atmosphere in which the cleaning process that uses a working liquid film formed by dissolving a process gas in a film of a solvent is carried out. Thus, the cleaning method of the present invention is capable of thoroughly removing deposits including organic impurities, metallic impurities, particles and oxide films formed by natural oxidation from the wafers. Since the reactive substance produced in a mixed gas-liquid molecular layer containing molecules of the solvent and those of the process gas is used for processing the wafers and the solvent vapor does not condense in liquid drops on the surfaces of the wafers, a high-density solvent molecular layer can be easily formed on the surfaces of the wafers. The solvent molecules and the gas molecules contained in the gas solvent molecular layer interact actively to produce a large amount of the reactive substance. Therefore, the process can be quickly carried out. Since the capacity of the solvent molecule layer to contain gas molecules does not decrease significantly even if the temperature of the atmosphere surrounding the wafers is high, the process can be carried out in a high-temperature atmosphere to promote the production of the reactive substance and the reaction of the reactive substance with matters adhering to the wafers.

Figure 16:
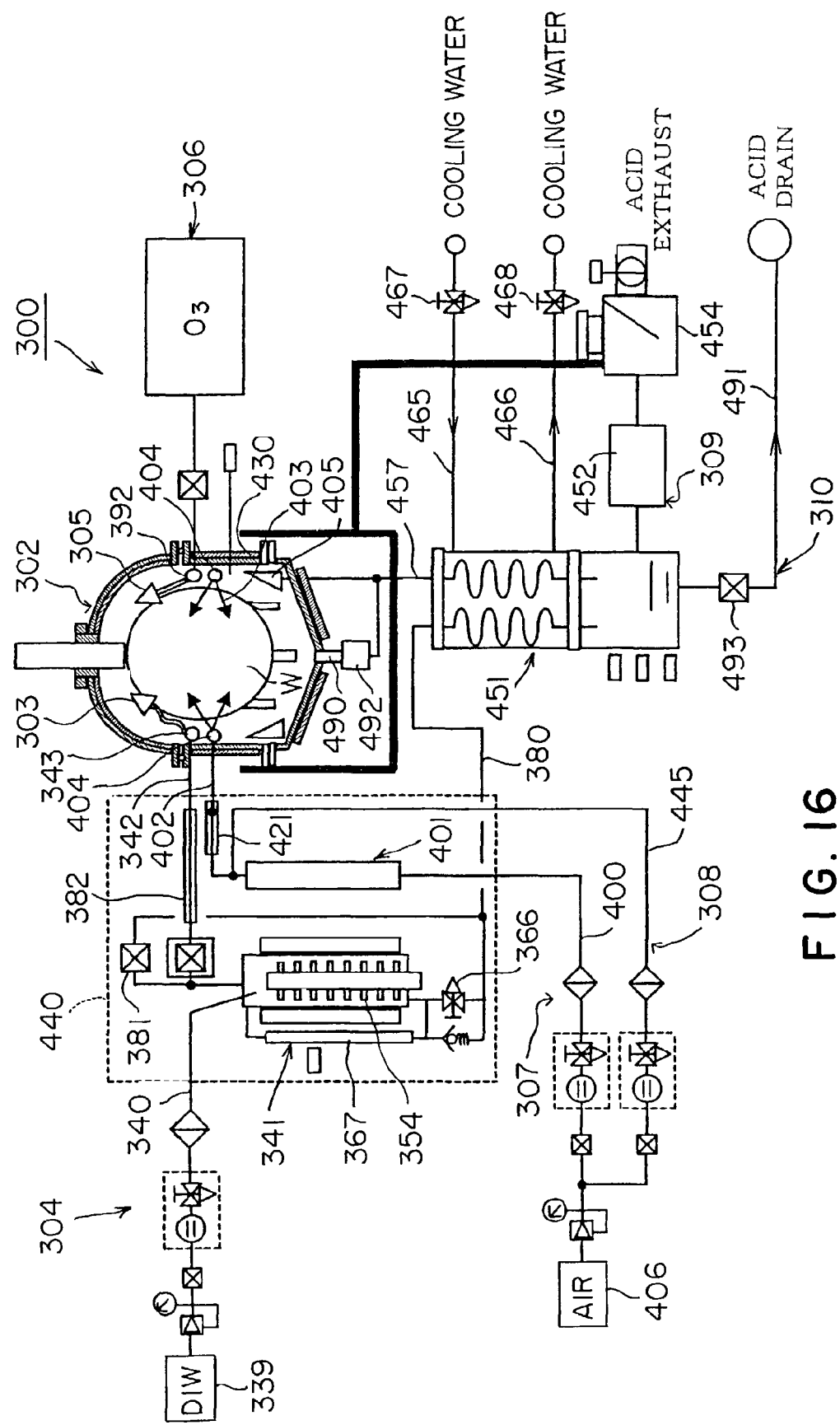
FIG. 16 is a schematic vertical sectional view of a cleaning apparatus in a further embodiment of the present invention.

A cleaning apparatus 300 in a more practical embodiment of the present invention will be described with reference to FIG. 16. Referring to FIG. 16, the cleaning apparatus 300 includes a processing vessel 302 in which wafers W are processed, a steam supply unit 304, i.e., a solvent vapor supply system, for supplying steam 303 into the processing vessel 302, an ozone gas supply unit 306, i.e., a process gas supply system, for supplying ozone gas 305 into the processing vessel 302, a hot air supply unit 307 including a hot air supply device for heating wafers W placed in the processing vessel 302, a cool air supply unit 308, i.e., cool gas supply system, for supplying cool air (gas) into the processing vessel 302, an exhaust system 309 for discharging the atmosphere in the processing vessel 302, and a draining system 310 for draining liquids from the processing vessel 302.

Figure 17:
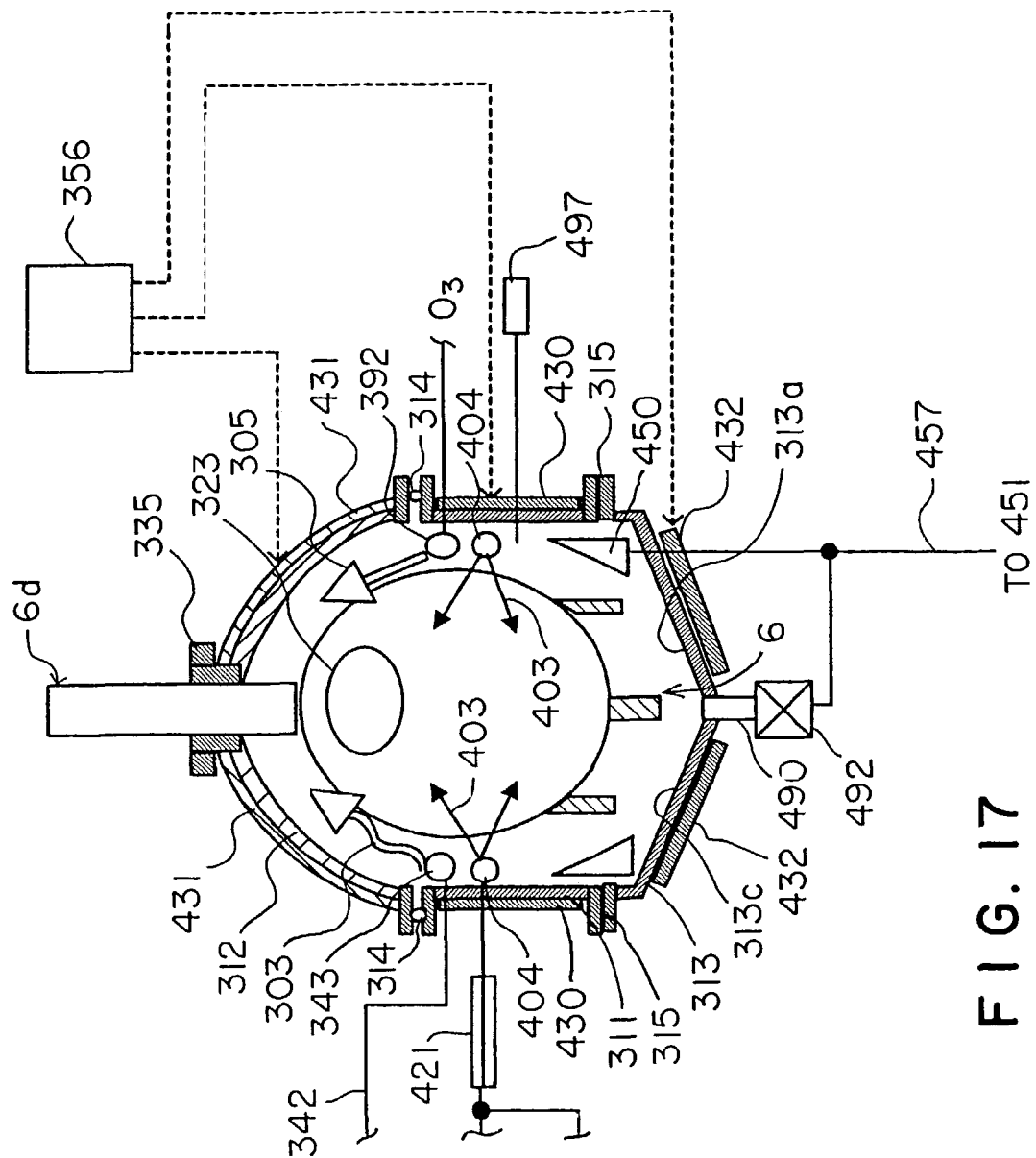
FIG. 17 is an enlarged schematic vertical sectional view of a processing vessel shown in FIG. 16.

As shown in FIG. 17, the processing vessel 302 includes a vessel body 311 having a capacity to contain, for example, fifty wafers W, a top cover 312 separably joined to the upper end of the vessel body 311 so as to cover the open upper end of the vessel body 311, and a bottom wall 313 joined to the lower end of the vessel body 311. A lip O ring is interposed between the open upper end of the vessel body 311 and the top cover 312 to seal the gap between the vessel body 311 and the top cover 312. A gasket 315 is interposed between the vessel body 311 and the bottom wall 313 to seal the gap between the vessel body 311 and the bottom wall 313. The processing vessel 302 is thus sealed to prevent the leakage of an atmosphere in the processing vessel 302 from the processing vessel 302. The vessel body 311, the top cover 312 and the bottom wall 313 are formed by processing plates of a stainless steel, such as SUS 316L specified in JIS, or the like. Plates having the smallest permissible thickness are used for forming the vessel body 311, the top cover 312 and the bottom wall 313 so that the processing vessel 302 has a small heat capacity. The inner surface of the processing vessel 302 is finished by a chemical resistance enhancing process to protect the processing vessel 302 from a process gas.

Figure 18:
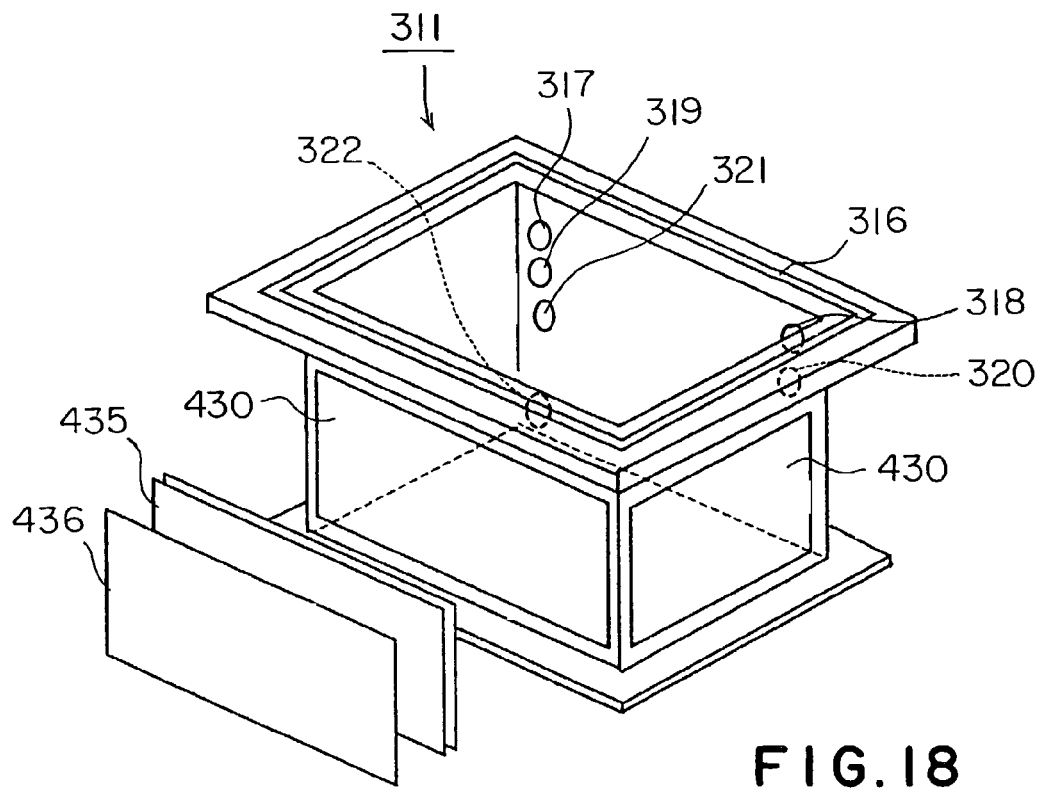
FIG. 18 is a perspective view of a body member of the processing vessel.

Referring to FIG. 18, an O ring groove 316 is formed in a flange formed on the upper end of the vessel body 311.

Formed in the side walls of the vessel body 311 are a steam supplying nozzle receiving hole 317, an ozone gas supplying nozzle receiving hole 318, gas supplying nozzle receiving holes 319 and 320, a gas sampling port 321 and a discharge header connecting opening 322. A steam supplying nozzle 343, an ozone gas supplying nozzle 392, air supplying nozzles 404 and 404 disposed in the vessel body 311 are inserted in the steam supplying nozzle receiving hole 317, the ozone gas supplying nozzle receiving hole 318 and the air supplying nozzle receiving holes 319 and 320, respectively. A sampling pipe, not shown, is connected from outside to the gas sampling port 321 to sample the atmosphere in the processing vessel 302. A first discharge line 457 is extended through the discharge header connecting hole 322 into the processing vessel 302 and is connected to discharge headers 450 disposed in the processing vessel 302. Rubber heaters 430 are applied to the outer side surfaces of the vessel body 311.

As shown in FIG. 17, a rubber heater 431 is applied to the outer surface (top surface) of the top cover 312. The top cover 312 is provided with a window 323 of a glass plate resistant to heat and chemicals, such as a Pyrex plate.

Figure 19:
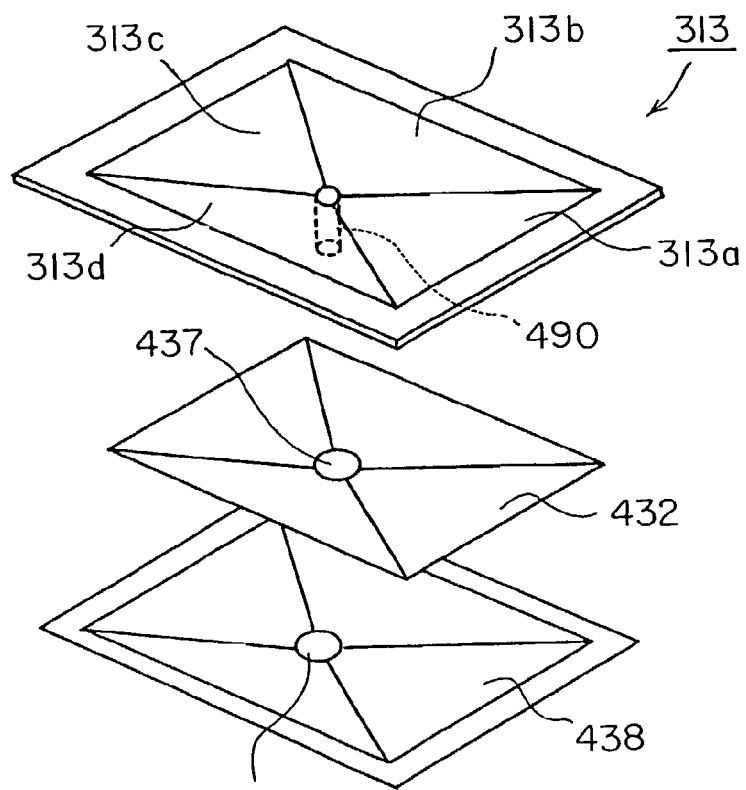
FIG. 19 is a perspective view showing the bottom of the processing vessel.

As shown in FIGS. 17 and 19, the bottom wall 313 has four sections 313$a$, 313$b$, 313$c$ and 313$d$ declining from the peripheral part toward the central part of the bottom wall 313. A first drain line 490 is connected to the central part of the bottom wall 313 to drain liquids from the processing vessel 302. When the inclination of the sections 313$a$ to 313$d$ is 15° or greater, liquids flow smoothly into the drain line 490. The first drain line 490 is connected to the first discharge line 457 (FIG. 17). Liquids drained from the processing vessel 302 are collected in a mist trap 451 (FIG. 17). A rubber heater 432 is applied to the outer surface of the bottom wall 313 as shown in FIG. 19.

As shown in FIG. 17, a wafer boat 6 similar to that shown in FIG. 2 can be placed and supported in the processing vessel 302. The wafer boat 6 has a shaft 6$d$ formed by inserting a stainless steel pipe in a polypropylene pipe to secure chemical resistance and rigidity, and holding members 6$a$, 6$b$ and 6$c$ each formed by coating a stainless steel core with PCTFE (polychlorotrifluoroethylene).

The shaft 6$d$ is extended through the top cover 312 so as to project upward from the processing vessel 302. A gap between the shaft 6$d$ and the top cover 312 is sealed by an air grip seal 335. Air is supplied into the air grip seal 335 through an air supply line, not shown, connected to the air grip seal 335 to expand the air grip seal 335. Consequently, the gap between the shaft 6$d$ and the top cover 312 is sealed.

Figure 20:
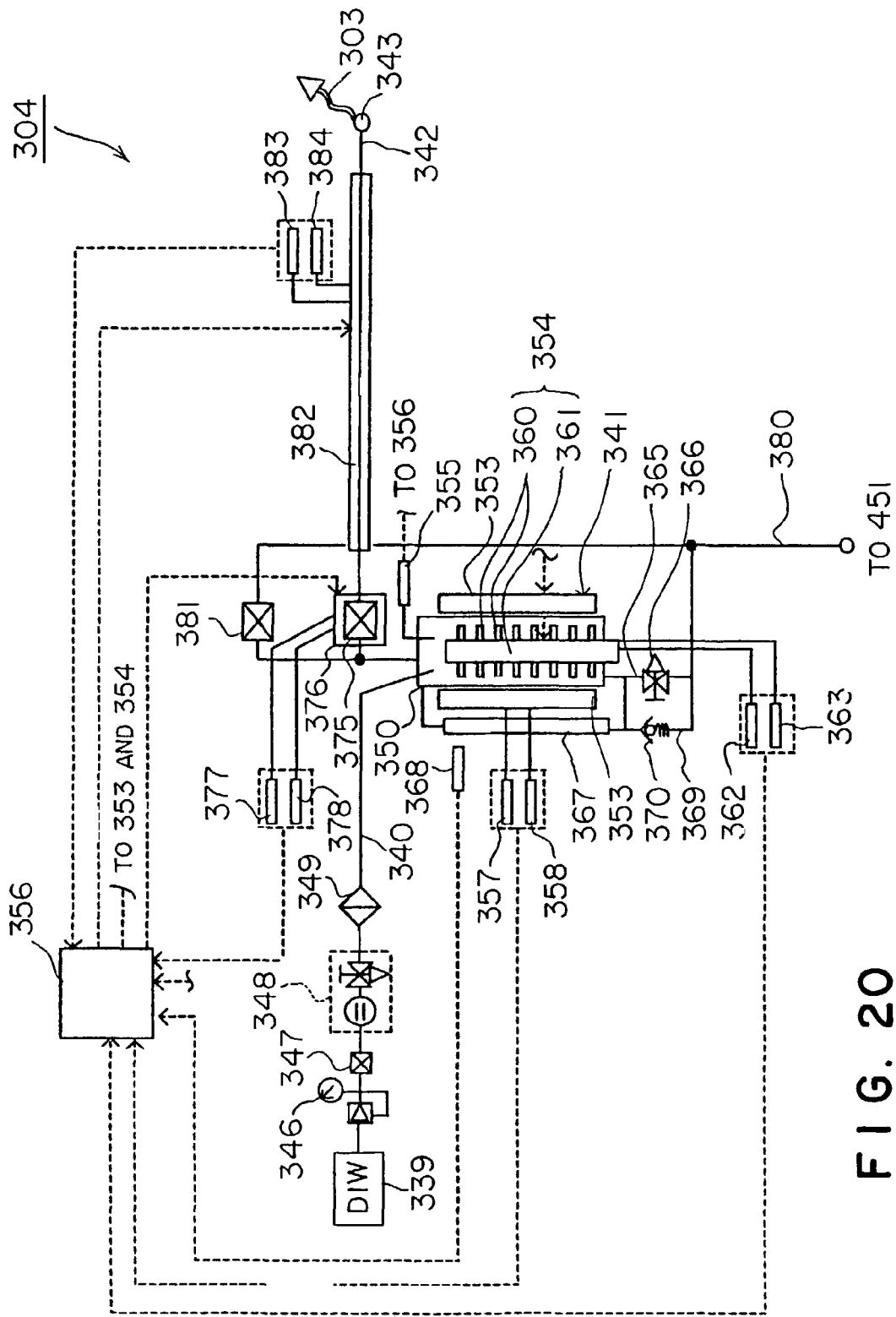
FIG. 20 is a piping diagram of a steam supply unit.

Referring to FIG. 20, the steam supply unit 304 has a pure water supply line 340 for carrying pure water or distilled water(DIW), a steam generator 341 for generating the steam 303 by vaporizing pure water supplied thereto through the pure water supply line 340, a steam supply line 342 for carrying the steam 303 generated by the steam generator 341, and the steam supplying nozzle 343 for ejecting the steam 303 into the processing vessel 302.

A pure water source 339 is connected to an inlet end of the pure water supply line 340 to supply pure water at, for example, about 20 cm$^3$/min (50 cm$^3$/min at a maximum). The pure water supply line 340 is provided with a pressure gauge 346, a shutoff valve 347, a flow controller 348 and a filter 349 arranged sequentially in that order. The pure water supply line 340 has an outlet end connected to an upper part of the steam generator 341.

Figure 21:
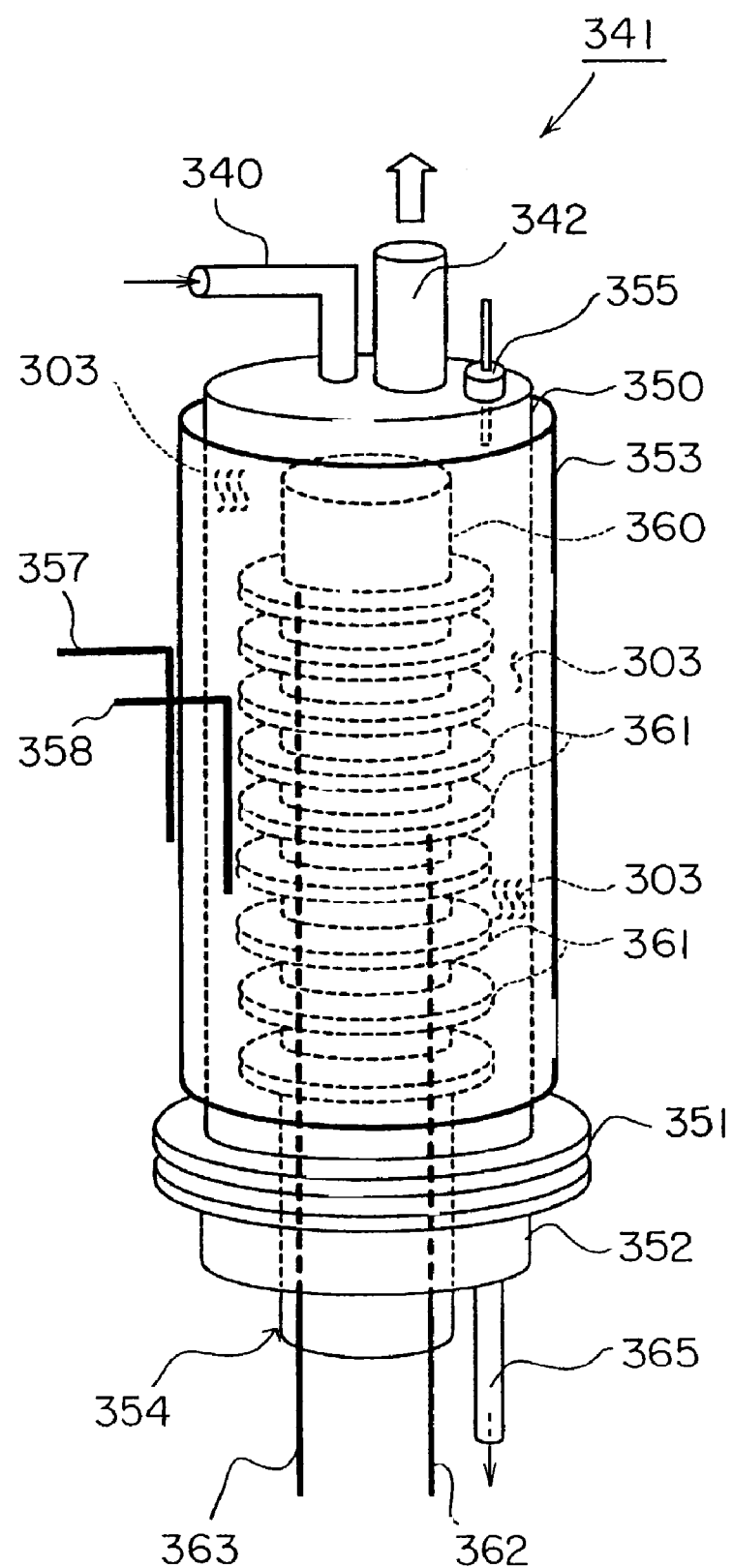
FIG. 21 is a perspective view of a steam generator.

As shown in FIGS. 20 and 21, the steam generator 341 has a tubular body 350, a bottom tube 352 connected to the tubular body 350 by fastening together flanges 351, a rubber heater 353 applied to the outer side surface of the tubular body 350, and a cartridge heater 354 disposed in the tubular body 350 coaxially with the latter.

An temperature sensor 355 is attached to the tubular body 350 to measure temperature in the tubular body 350. The temperature sensor 355 gives a temperature signal representing a temperature in the tubular body 350 to a control unit 356. The temperature sensor 355 is, for example, a K-type thermocouple.

The rubber heater 353 is controlled by the control unit 356. The rubber heater 353 is provided with a temperature sensor 357 and an overheat monitoring sensor 358. The temperature sensor 357 and the overheat monitoring sensor 358 are connected to the control unit 356. The control unit 356 receive a temperature signal representing the temperature of the rubber heater 353 from the temperature sensor 347 and controls the rubber heater 353 on the basis of the temperature signal. The control unit 356 receives a temperature signal from the overheat monitoring sensor 358 to monitor the condition of the rubber heater 353 so that the rubber heater 353 may not overheat the tubular body 350. The rubber heater 353 has a high output per unit area. The temperature sensor 357 and the overheat monitoring sensor 358 are, for example, K-type thermocouples. The rubber heater 353 is covered with a heat insulating member, not shown, to prevent the thermal influence of the rubber heater 353 on the surroundings. The heat insulating member is formed of a heat-resistant material that withstands heat of a high temperature not lower than 200° C., such as silicone rubber.

The cartridge heater 354 includes a heater pipe 360 and a plurality of heating disks 361 attached to the outer side surface of the heater pipe 360. The cartridge heater 354 is controlled by the control unit 356. Pure water supplied through the pure water supply line 340 into the tubular body 350 drips onto the heater pipe 360 and the heating disks 361 and is converted into the steam 303. A temperature sensor 362 and an overheat monitoring sensor 363 are attached to the cartridge heater 354 and are connected to the control unit 356. The cartridge heater 354, similarly to the rubber heater 353, is controlled properly by the control unit 356.

A pure water drain line 365 is connected to the bottom tube 352 and a steam discharge line 380 (FIG. 20). Pure water not converted into steam by the steam generator 341 is drained through the pure water drain line 365 and the steam discharge line 380 into a mist trap 451. The pure water drain line 365 is provided with a flow control valve 366 to control pure water draining rate properly.

As shown in FIG. 20, the steam generator 341 is provided with a gauge pipe 367 to enable visual inspection of the level of pure water in the tubular body 350. The gauge pipe 367 has one end connected to the pure water drain line 365 and the other end connected to an upper part of the tubular body 350. An upper limit level sensor 368 is connected to the gauge pipe 367. The upper limit level sensor 368 is connected to the control unit 356. If the rate of production of pure water that could not be converted into steam exceeds the draining capacity of the pure water drain line 365, i.e., the draining capacity of the mist strap 451, pure water is accumulated in the steam generator 341, and the level of pure water rises. Upon the reach of the level of pure water in the tubular body 350 to an upper limit level, the upper limit level sensor 368 gives an alarm signal to the control unit 356. The gauge pipe 367 is connected to the pure water drain line 365 by a connecting line 369 provided with a safety valve 370. The safety valve 370 allows pure water to escape from the tubular body 350 at pressure slightly above a predetermined working level of the tubular body 350.

Although the steam 303 is generated by dripping pure water from the pure water supply line 340 in this embodiment, the steam 303 may be generated by heating pure water stored in the tubular body 350 by the cartridge heater 345. Pure water can be stored in the tubular body 350 by closing the flow control valve 366. Upon the detection of rise of water level in the tubular body 350 to the upper limit level, the upper limit level sensor 368 gives a signal to the control unit 356 and the control unit 356 controls a power source to supply power to the rubber heater 353 and the cartridge heater 354.

The steam supply line 342 is connected to an upper part of the steam generator 341 and is provided with a shutoff valve 375. A plate heater 376 is combined with the shutoff valve 375. The plate heater 376 is controlled by the control unit 356 for heat generation. A maximum heating temperature that can be achieved by the plate heater 376 is, for example, 150° C. A temperature sensor 377 and an overheat monitoring sensor 378 are connected to the plate heater 376. The temperature sensor 377 and the overheat monitoring sensor 378 are connected to the control unit 356. The heating operation of the plate heater 376 is controlled by the control unit 356.

The steam discharge line 380 provided with a shutoff valve 381 is connected to the steam supply line 342. The shutoff valve 381 is kept open until the temperature and the steam generating operation of the steam generator 341 are stabilized to discharge the steam 303 into the mist trap 451.

A ribbon heater 382 is combined with the steam supply line 342. The ribbon heater 382 is controlled by the control unit 356 for heat generation. A heating temperature that can be achieved by the ribbon heater 382 is in the range of, for example, 90 to 120° C. A temperature sensor 383 and an overheat monitoring sensor 384 are connected to the ribbon heater 382. The temperature sensor 383 and the overheat monitoring sensor 383 are connected to the control unit 356. The ribbon heater 382 is controlled by the control unit 356 for heat generation. The plate heater 376 and the ribbon heater 382 heat the steam 303 being carried by the steam supply line 342 to prevent the condensation of the steam 303 in the steam supply line 342.

Figure 22:
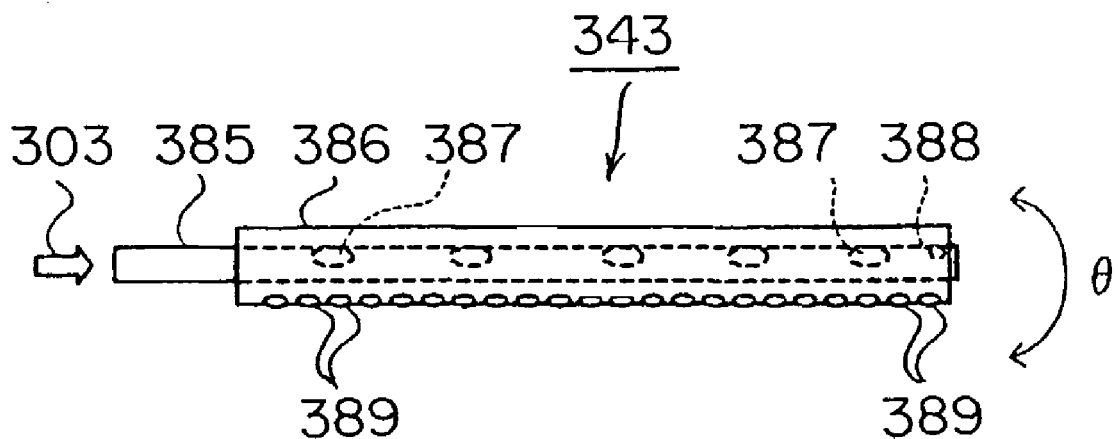
FIG. 22 is a side elevation of a steam nozzle.

As shown in FIG. 22, the steam supplying nozzle 343 has an inner pipe 385 and an outer pipe 386 coaxially surrounding the inner pipe 385. A section of the inner pipe 385 inserted in the outer pipe 386 is provided with five holes 387 arranged at equal intervals, and a 0.8 mm diameter hole 388 in its extremity, by way of example. The outer pipe 386 is provided with holes 389 at equal intervals equal to, for example, the pitches, such as 3.175 mm, of wafers W held in the processing vessel 302. The number of the holes 389 is, for example, fifty-six. The position of the holes 387 of the inner pipe 385 and that of the holes 389 of the outer pipe 386 are diametrically opposite to each other. Steam 303 carried by the inner pipe 385 is distributed evenly in the outer pipe 386 and is ejected uniformly through the holes 389 of the outer pipe 386.

The steam supplying nozzle 343 is inserted in the steam supplying nozzle receiving hole 317 (FIG. 18) so as to be turnable about its horizontal axis in an angular range of 90° as indicated by the arrows θ in FIG. 22. Thus, the steam ejecting direction of the steam supplying nozzle 343 is variable in an angular range of 90°. In this embodiment, the steam supplying nozzle 343 is set in a position to eject the steam 303 upward in the processing vessel 302. Consequently, the steam 303 ejected upward flows downward onto the wafers W.

Figure 23:
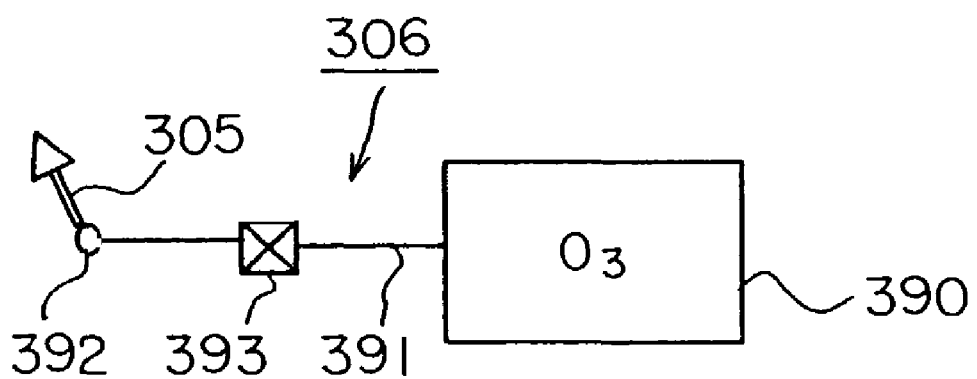
FIG. 23 is a piping diagram of an ozone gas supply unit.

As shown in FIG. 23, the ozone gas supply unit 306 has an ozonizer 390 that produces ozone gas 305, an ozone gas supply line 391 for carrying the ozone gas 305 produced by the ozonizer 390, and the ozone gas supplying nozzle 392 for ejecting the ozone gas 305 carried by the ozone gas supply line 391 into the processing vessel 302. The ozone gas 305 produced by the ozonizer 390 has an ozone concentration of about 141 g/m$^3$ (normal), i.e., about 6.6% by volume. The ozone gas 305 is supplied through the ozone gas supply line 391 at a flow rate of about 40 l/min. The ozone gas supply line 391 is provided with a shutoff valve 393.

The ozone gas supplying, nozzle 392 is similar in construction as the steam supplying nozzle 343 and hence the description thereof will be omitted. The ozone gas supplying nozzle 392 is inserted in the ozone gas ejecting nozzle receiving hole 318 so as to be turnable about its horizontal axis in an angular range of 90°. Thus, the ozone gas ejecting direction of the ozone gas supplying nozzle 392 is variable. In this embodiment, the ozone gas supplying nozzle 392 is set in a position to eject the ozone gas 305 upward in the processing vessel 302. Consequently, the ozone gas 305 ejected upward flows downward onto the wafers W. The ozone gas 305 and the steam 303 are mixed in an upper region of the interior of the processing vessel 302 in a mixed gas, and the mixed gas flows down toward the wafers W.

Figure 24:
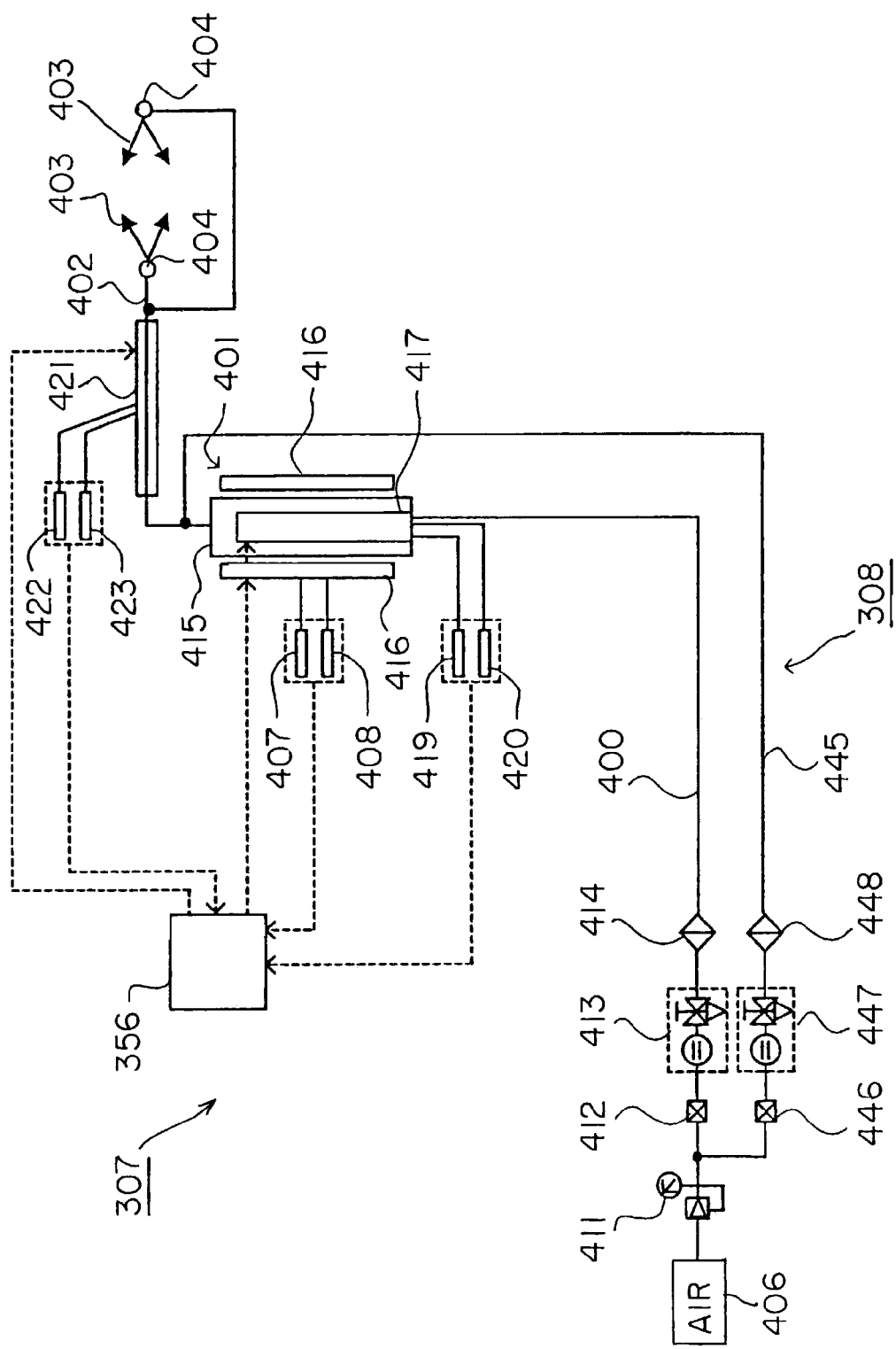
FIG. 24 is a piping diagram of a hot air supply unit and a cool air supply unit.

Referring to FIG. 24, the hot air supply unit 307 includes an air supply line 400 for carrying air, a hot air generator 401 that heats air supplied thereto through the air supply line 400 to produce hot air 403, a hot air supply line 402 for carrying the hot air 403 generated by the hot air generator 401 and the air supplying nozzles 404 for ejecting the hot air 403 toward the wafers W.

The inlet end of the air supply line 400 is connected to an air source 406 that supplies cool air at a flow rate of, for example, about 500 l/min. The air supply line 400 is provided with a pressure gauge 411, a shutoff valve 412, a flow controller 413 and a filter 414 sequentially arranged in that order. The outlet end of the air supply line 400 is connected to a lower part of the hot air generator 401.

Figure 25:
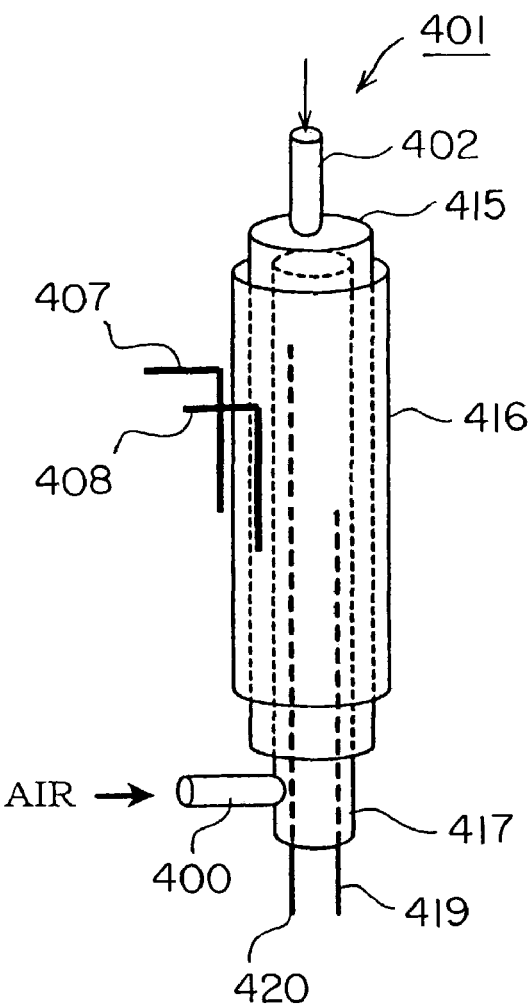
FIG. 25 is a perspective view of a hot air generator.

As shown in FIGS. 24 and 25, the hot air generator 401 has a tubular body 415, a rubber heater 416 applied to the outer side surface of the tubular body 415, and a cartridge heater 417 inserted in the tubular body 415. The rubber heater 416 is controlled by the control unit 356 for heat generation. A temperature sensor 407 and an overheat monitoring sensor 408 are connected to the rubber heater 416. The temperature sensor 407 and the overheat monitoring sensor 408 are connected to the control unit 356. The control unit 356 controls the rubber heater 416 properly for heating. The rubber heater 416 is covered with a heat insulating member, not shown.

The cartridge heater 417 is connected to and controlled by the control unit 356 for heating. Cool air supplied through the air supply line 400 into the tubular body 415 is heated by the cartridge heater 417. A temperature sensor 419 and an overheat monitoring sensor 420 attached to the cartridge heater 417 are connected to the control unit 356. The control unit 356 controls the cartridge heater 417 properly for heating.

The hot air supply line 402 is connected to the upper part of the hot air generator 401. A ribbon heater 421 is combined with the hot air supply line 402. The ribbon heater 421 is controlled by the control unit 356 for heat generation. A heating temperature that can be achieved by the ribbon heater 421 is in the range of, for example, 100 to 200° C. A temperature sensor 422 and an overheat monitoring sensor 423 are connected to the ribbon heater 421. The temperature sensor 422 and the overheat monitoring sensor 423 are connected to the control unit 356. The ribbon heater 421 is controlled by the control unit 356 for heat generation. The ribbon heater 421 heats the hot air supply line 402 to prevent the drop of the temperature of the hot air 403 being supplied through the hot air supply line 402.

The air supplying nozzles 404 are similar in construction to the steam supplying nozzle 343 and the ozone gas supplying nozzle 392 and hence the description thereof will be omitted. The air supplying nozzles 404 are inserted in the gas supplying nozzle receiving holes 319 and 320, respectively, so as to be turnable about their horizontal axes in an angular range of 90°. Thus, the air ejecting directions of the air supplying nozzles 404 are variable. The air ejecting directions of the air supplying nozzle 404 are not fixed. When jetting the hot air 403, the air supplying nozzles are turned alternately in opposite directions to jet the hot air 403 uniformly all over the wafers W.

Figure 26:
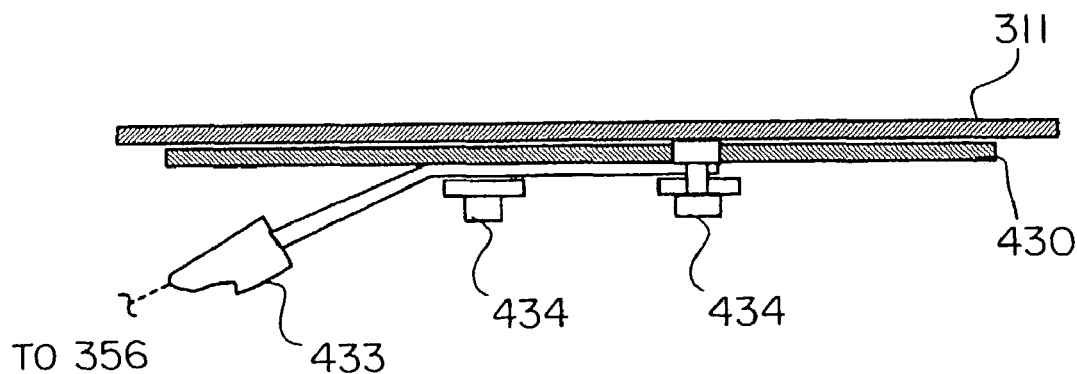
FIG. 26 is a sectional view of a rubber heater provided with a temperature sensor.

As shown in FIGS. 17, 18 and 19, the hot air supply unit 307 includes the rubber heaters 430, 431 and 432. The rubber heaters 430, 431 and 432 are controlled for heat generation by the control unit 356. As shown in FIGS. 18 and 19, the four rubber heaters 430 are attached to the outer side surfaces of the vessel body 311 and are connected in series. The rubber heaters 430 have a heat generating capacity capable of heating the vessel body 311 having a heat capacity to 120° C. in twenty minutes. In an normal operating state, the temperature of heat generated by the rubber heaters 430 is 80° C. As shown in FIG. 26, a temperature sensor 433 is fastened to the rubber heater 430 with screws 434. The control unit 356 is connected to the temperature sensor 433 to control the rubber heaters 430 for heat generation. As shown in FIG. 18, each rubber heater 430 is covered with a heat insulating member 435. The heat insulating member 435 is held on the outer surface of the rubber heater 430 with a cover 436. The heat insulating member 435 is formed of a heat insulating material that withstands heat of 150° C. or above, such as silicone rubber. The cover 436 is a plate of a stainless steel or the like.

The outer surface of the rubber heater 431 is covered with an insulating member, not shown, so that heat generated by the rubber heater 431 may not be dissipated into the atmosphere. Silicone sponge is a preferable material for the heat insulating member. As shown in FIG. 19, the rubber heater 432 is applied to the outer surface (lower surface) of the bottom wall 313. The first drain line 490 is passed through an opening 437 formed in the rubber heater 432. The rubber heater 432 is covered with a heat insulating cover 438 provided with an opening 539. The heat insulating cover 438 is a 1.5 mm thick stainless steel plate.

Figure 27:
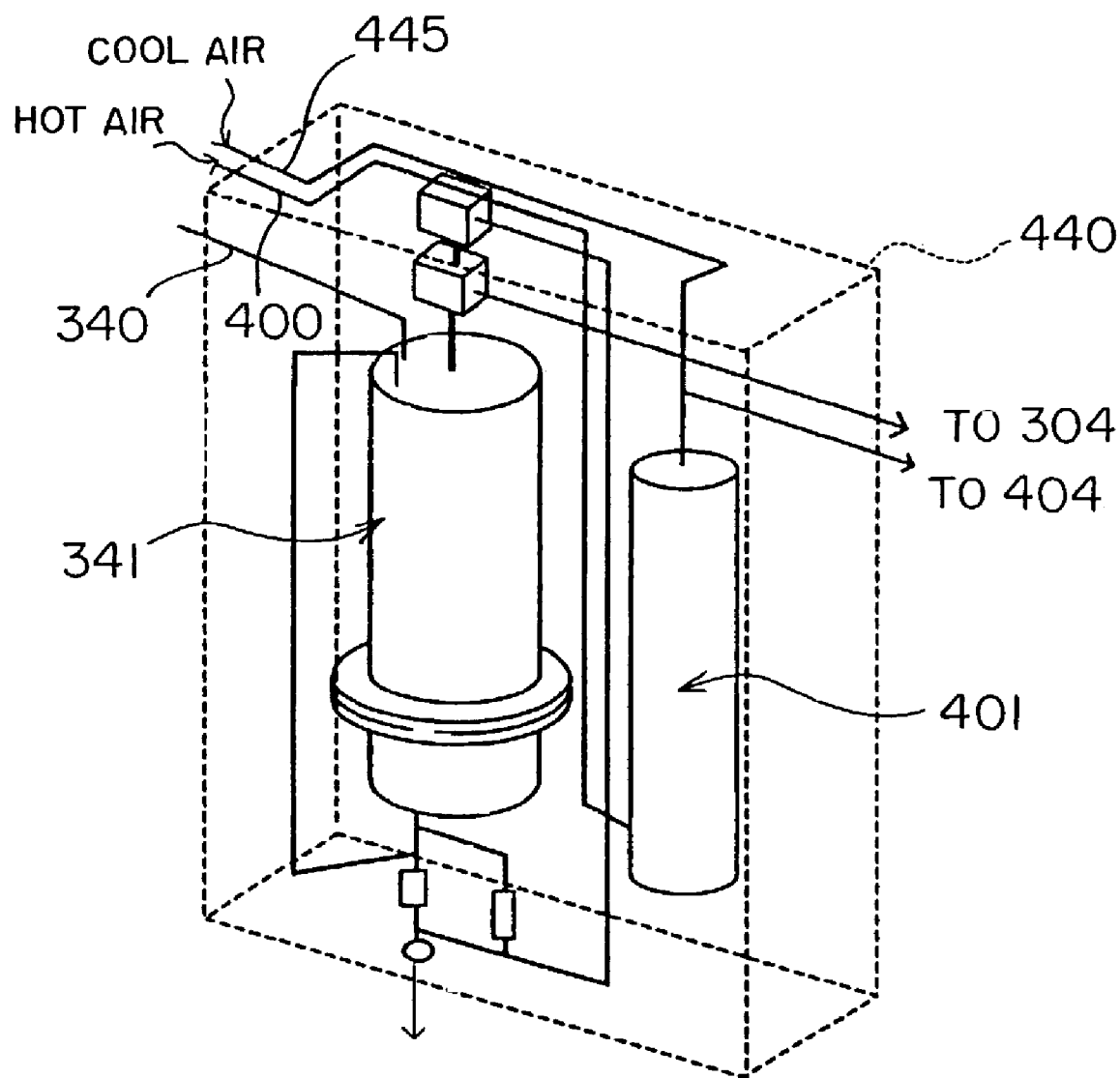
FIG. 27 is a perspective view of the steam generator, the hot air generator and piping devices contained in a box.

Referring to FIG. 27, the steam generator 341, the hot air generator 401 and the associated piping are encased in a box 440 to install those components in a limited space and to facilitate maintenance work. The box 440 is formed by processing stainless steel plates and is lined with an insulating member to prevent the dissipation of heat from the box 440 into the surroundings.

Referring to FIG. 24, the cool air supply unit 308 has a cool air supply line 445. The cool air supply line 445 has one end connected to a part of the air supply line 400 between the pressure gage 411 and the shutoff valve 412 and the other end connected to the hot air supply line 402. The cool air supply line 445 is provided with a shutoff valve 446, a flow controller 447 and a filter 448 sequentially arranged in that order. When supplying cool air to the processing vessel 302, the shutoff valve 412 is closed, the shutoff valve 446 is opened and power supply to the ribbon heater 421 is stopped. Cool air supplied by air source 406 flows through the cool air supply unit 308 bypassing the hot air generator 401, and flows through the hot air supply line 402 and the air supplying nozzles 404 into the processing vessel 302. The air source 406 is used both for supplying hot air and for supplying cool air, and the air supplying nozzles 404 are used both for ejecting hot air and for ejecting cool air in this embodiment. The cool air supply unit 308 may be provided with a separate air source and separate air supplying nozzles.

Figure 28:
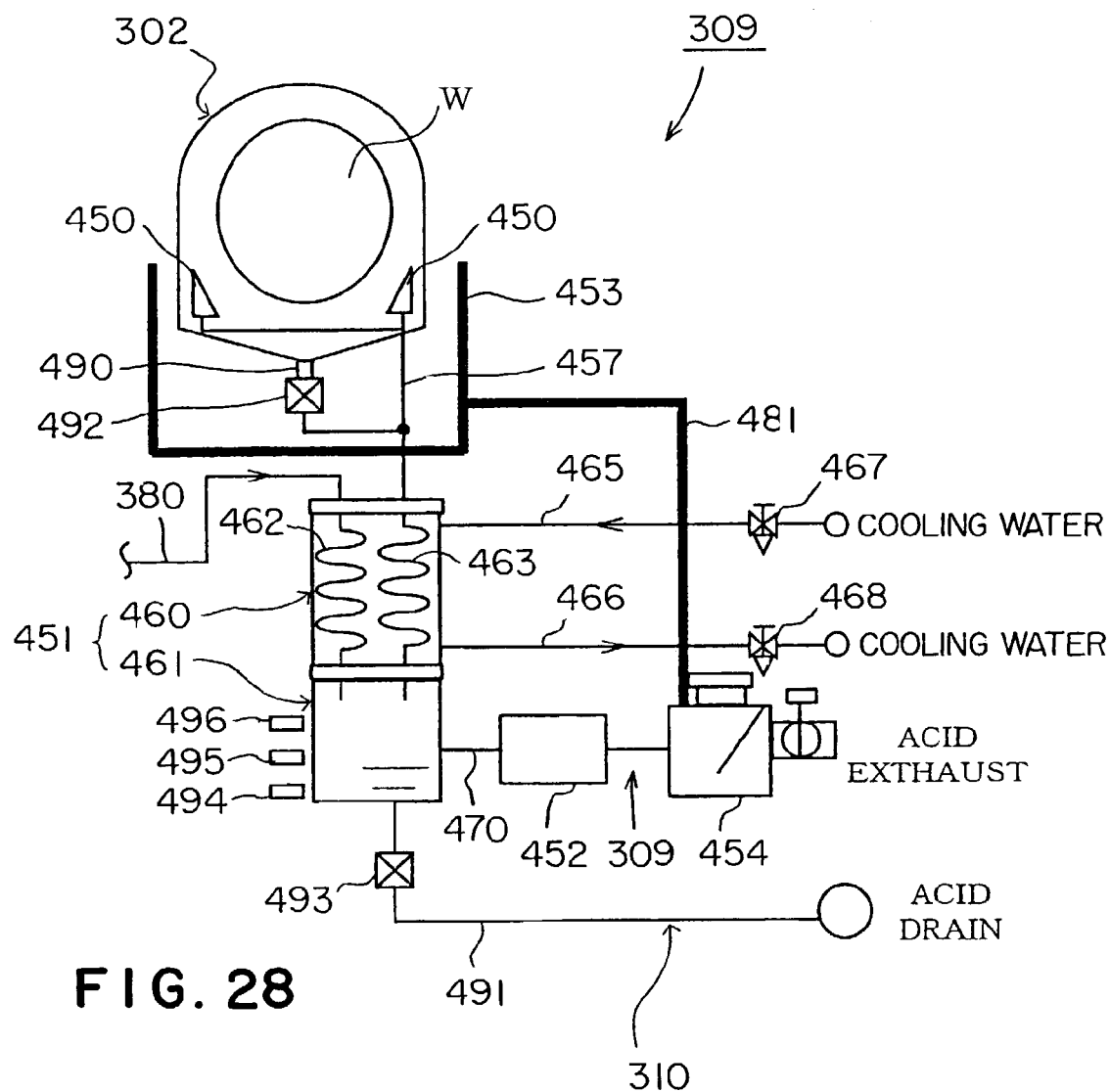
FIG. 28 is a piping diagram of a discharging unit and a draining unit.

As shown in FIG. 28, a discharge unit 309 includes the discharge headers 450 disposed in the processing vessel 302, the mist trap 451, an ozone killer 452, a sink box 453 containing the processing vessel 302 so as to confine the atmosphere around the processing vessel 302 therein, and a discharge header 454 that collects and discharges gases discharged from the processing vessel 302, the sink box 453 and other parts of the cleaning apparatus 300.

Figure 29:
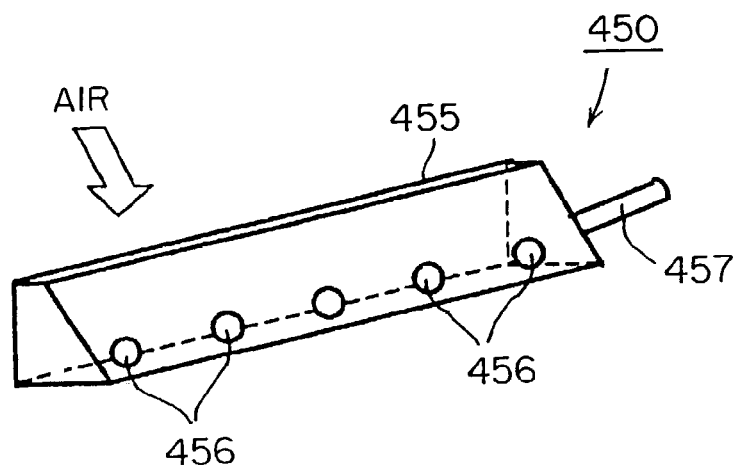
FIG. 29 is a perspective view of a discharge header.

Referring to FIG. 29, each of the discharge headers 450 has an upper wall provided with a slit 455, and a side wall provided with a plurality of openings 456 of, for example, 10 mm in diameter arranged at equal intervals of, for example, 30 mm. The first discharge line 457 is connected to the discharge headers 450. The first discharge line 457 is extended through the discharge header connecting opening 322 (FIG. 18) into the processing vessel 302. The outlet end of the first discharge line 457 is connected to the mist trap 451. The atmosphere in the processing vessel 302 is sucked through the slits 455 and the openings 456 of the discharge headers 450 into the discharge headers 450 and is discharged into the mist trap 451. The discharge headers 450 are formed of stainless steel plates having surfaces treated for chemical resistance enhancement.

Figure 30:
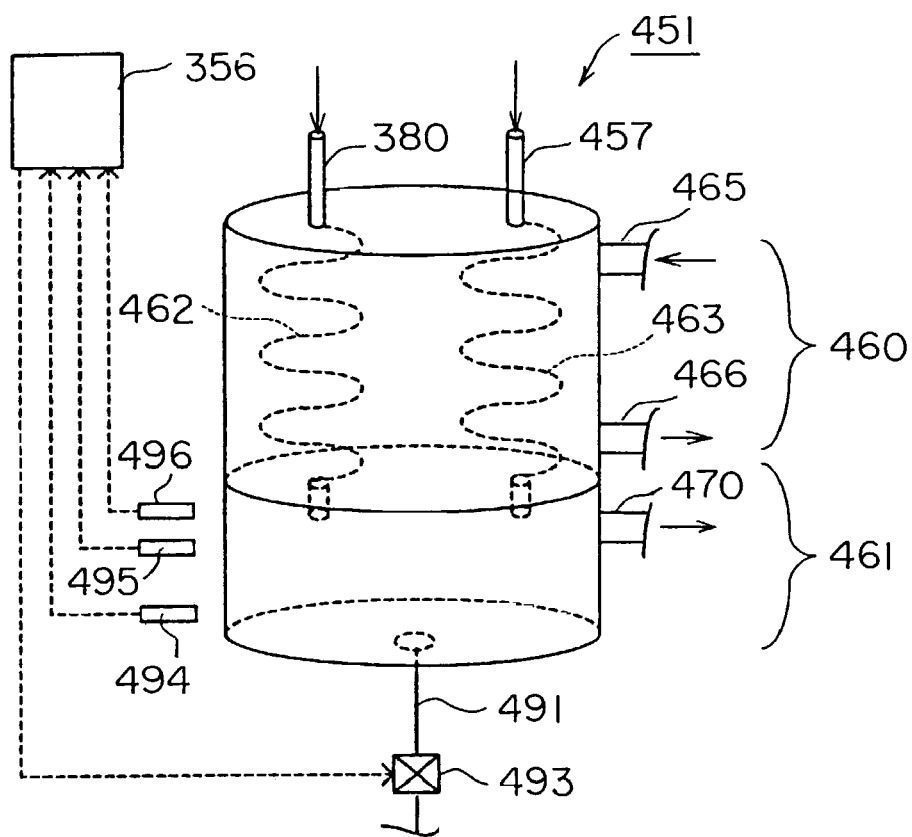
FIG. 30 is a perspective view of a mist trap.

The mist trap cools the steam 303 discharged from the steam generator 341 and the gas discharged from the processing vessel 302 to condense the same, separates gases from liquids and discharges the gases and the liquids separately. Referring to FIGS. 28 and 30, the mist trap 451 is divided generally into a cooling unit (gas-liquid separating unit) 460 and a discharge unit 461. The steam discharge line 380 and the first discharge line 457 are connected to an upper part of the mist trap 451. A first pipe 462 and a second pipe 463 are extended through the cooling unit 460 of the mist trap 451. The first pipe 462 is connected to the steam discharge line 380 and the second pipe 463 is connected to the first discharge line 457. The pipes 462 and 463 open into the discharge unit 461. The pipes 462 and 463 are wound in a spiral shape in the cooling unit 460. The components of the mist trap 451 and the pipes 462 and 463 are formed of a corrosion-resistant material, such as PFA (a copolymer of perfluoroalcoxyalkane and perphloroalkylvinylether).

A cooling water supply line 465 for carrying cooling water and a cooling water discharge line 466 are connected to the cooling unit 460. As shown in FIG. 28, the cooling water supply line 465 is provided with a flow control valve 467, and the cooling water discharge line 466 is provided with a flow control valve 468.

A second discharge line 470 for discharging gases is connected to the discharge unit 461. Since the atmosphere in the processing vessel 302 contains the ozone gas 305, the second discharge line 470 is provided with the ozone killer 452. The ozone killer 452 kills the ozone gas having a high ozone concentration and contained in the gas discharged through the second discharge line 470 by a catalytic reaction.

Cooling water is supplied through the cooling water supply line 465 into the cooling unit 460 of the mist trap 451.

The steam 303 and the pure water discharged from the steam generator 341 flow through the steam discharge line 380 into the mist trap 451. The pure water flows through the first pipe 462 into the discharge unit 461. The steam is cooled and condensed by the cooling water while the same flows through the first pipe 462. Since the first pipe 462 is wound in a spiral shape, the steam takes a sufficient time for cooling by the cooling water to flow through the first pipe 462. Water drops formed by the condensation of the steam drops into the discharge unit 461. Liquid drops and the gas discharged from the processing vessel 302 flow through the first discharge line 457 into the mist trap 451. The liquid drops discharged from the processing vessel 302 flows through the second pipe 463 into the discharge unit 461. The gas discharged from the processing vessel 302 is cooled and condensed by the cooling water while the same flows through the second pipe 463. The gas takes sufficient time for cooling to flow through the second pipe 463. Thus, the gas discharged from the processing vessel 302 can be satisfactorily divided into ozone gas and liquid drops. The gas collected in the discharge unit 461 is discharged through the second discharge line 470. Ozone contained in the gas discharged from the discharge unit 461 is killed by the ozone killer 452. Preferably, the cooling water is supplied continuously through the cooling water supply line 465 and is discharged through the cooling water discharge line 466 to fill up the cooling unit 460 at all times.

Figure 31:
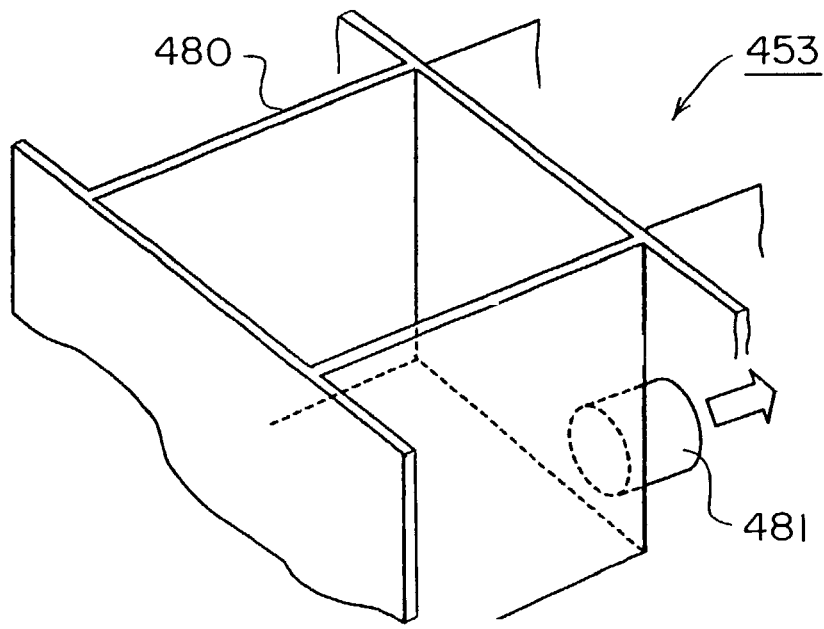
FIG. 31 is a perspective view of a sink box.

Referring to FIG. 31, the sink box 453 has a case 480 that contains the processing vessel 302. A discharge pipe 481 is connected to the case 480 of the sink box 453. The sink box 535 is evacuated to prevent the leakage of the atmosphere containing ozone gas outside the cleaning apparatus 300 when the processing vessel 302 is opened. The sink box is formed of, for example, PVC (polyvinyl chloride).

As shown in FIGS. 28 and 32, the second discharge line 470 and the discharge pipe 481 are connected to the discharge header 454. A plurality of pipes 482 for sucking the atmosphere in a space behind the cleaning apparatus 300 into the discharge header 454 are provided for the double prevention of the diffusion of ozone gas. The discharge header 454 is connected to an acid discharging system of the plant. Discharged gases and liquids are collected in the discharge header 454 before being discharged into the exhaust system. Thus, the diffusion of the ozone gas is prevented and the discharged gases are controlled strictly.

As shown in FIGS. 28 and 30, the draining system 310 includes the first drain line 490 connected to the bottom part of the processing vessel 302 and a second drain line 491 connected to the bottom part of the discharge unit 461. The first drain line 490 is provided with a shutoff valve 492. As mentioned above, the first drain line 490 is connected to the first discharge line 457 to make liquid drops formed in the processing vessel 302 flow into the first discharge line 457. The second drain line 491 is provided with a shutoff valve 493. Sometimes ozone remains in the drain. Therefore, the second drain line 491 is connected to an acid drain system of the plant. The draining system 310 is provided with a lower limit level sensor 494, draining level sensor 495 and an upper limit level sensor 496, which are arranged vertically upward in that order. The sensors 494, 45 and 496 are connected to the control unit 356.

As mentioned above, liquid drops produced in the processing vessel 302 flow through the first drain line 490 and the first discharge line 457 into the mist trap 451. After a certain amount of the liquid has been collected in the discharge unit 461, the liquid is drained through the drain line 491; that is, the shutoff valve 493 is kept closed at least until the level of the liquid collected in the discharge unit 461 reaches the level of the lower limit level sensor 494. If the shutoff valve 493 is opened while only a little liquid is collected in the discharge unit 461, the discharge unit 461 will immediately becomes empty and ozone gas will be discharged through the second drain line 491 into the acid drain system of the plant. Since the acid drain system of the plant is not designed to deal with gases, ozone gas harmful to the human body will leak into the surroundings. When the level of the collected liquid drops below the level of the lower limit level sensor 494, the shutoff valve 493 is closed to prevent the discharge unit 461 from becoming empty, so that the leakage of ozone gas into the surroundings can be prevented. Upon the rise of the level of the collected liquid to the level of the draining level sensor 495, the draining level sensor 495 gives a signal to the control unit 356 and the control unit 356 opens the shutoff valve 493 to start draining the collected liquid. Upon the rise of the level of the collected liquid to the level of the upper limit level sensor 496, the upper limit level sensor 496 gives a warning signal to the control unit 356. Naturally, pure water drained from the steam generator 341 and water drops produced by the condensation of steam are drained through the second drain line 491.

As shown in FIG. 17, the processing vessel 302 is provided with an internal temperature monitoring sensor 497 to measure the temperature in the processing vessel 302. The internal temperature monitoring sensor 497 is disposed above the discharge header 450 so that the same may not interfere with the wafers W and the wafer boat 6 and may be able to measure temperature at a position near a reaction space.

A cleaning method to be carried out by the cleaning apparatus 300 will be described with reference to FIGS. 3 to 5 and the flow chart shown in FIG. 33. For example, twenty-five wafers W each having a surface coated with, for example, a resist film 30 are put in the processing vessel 302 (start of the cleaning method).

Subsequently, the hot air supply unit 307 supplies hot air and ejects the same through the air supplying nozzles 404 into the processing vessel 302 and the rubber heaters 430, 431 and 432 are energized to heat the wafers W at a predetermined temperature in step S1. The predetermined temperature of the wafers W is lower than the dew point of the steam 303 supplied into the processing vessel 302 and is in a temperature range suitable for properly processing the wafers W.

The control unit, 356 controls the respective heat generating rates of the rubber heaters 430, 431 and 432, the rubber heater 416 of the hot air generator 401, and the cartridge heater 417 to create a heating atmosphere of, for example, 80° C. suitable for heating the wafers W in the processing vessel 302 and to make the hot air generator 401 generate the hot air 403 of a proper temperature. The air supplying nozzles 404 are turned alternately in opposite directions in a vertical plane to eject the hot air 403 alternately upward and downward so that the hot air 403 is applied uniformly to the wafers W to heat the wafers W uniformly. Since the hot air 403 is applied directly to the wafers W, the wafers W can be rapidly heated at the predetermined temperature.

After the passage of a predetermined heating time, ejection of the hot air 403 is stopped and then the steam 303 is supplied into the processing vessel 302 by the steam supply unit 304 in step S2. The control unit 356 controls the temperature of the steam 303 and steam generating rate of the cartridge heater 354. The steam supplying nozzle 343 is set so as to eject the steam 303 toward an upper region in the processing vessel 302. The steam 303 ejected into the processing vessel 302 flows downward from the upper region in the processing vessel 302 and, consequently, the steam 303 can be satisfactorily applied to the wafers W.

Since the wafers W are heated at the temperature lower than the dew point of the steam 303, the steam 303 is condensed properly on the surfaces of the wafers W and a thin pure water film 31 can be formed on the surfaces of each wafer W as shown in FIG. 4. Then, the ozone gas 305 is supplied into the processing vessel 302 by the ozone gas supply unit 306 through the ozone gas supplying nozzle 392. The ozone gas 305 is ejected toward the upper region in the processing vessel 302 and flows downward from the upper region. Thus, the ozone gas 305 can be satisfactorily applied to the wafers W.

Thus the ozone gas 305 dissolves in the pure water films 31 to produce ozonic water films containing many oxygen radicals and hydrogen radicals on the surfaces of the wafers W. The oxygen radicals and the hydrogen radicals produced on the surfaces of the wafers W cause an oxidation reaction before the same disappear, whereby the resist forming the resist films 30 is decomposed into a carboxylic acid, carbon dioxide, water and such. Then, as shown in FIG. 5, the resist films 30 are oxidized and the resist forming the resist film is decomposed thoroughly by the ozonic water films and the resist films 30 are altered into water-soluble films 32. The water-soluble films 32 can be easily removed by a subsequent rinsing step using pure water.

After a predetermined processing time has passed, the supply of the steam 303 and the ozone gas 305 is stopped and cool air is ejected through the air supplying nozzle 404 into the processing vessel 302 in step S3. Consequently, the interior of the processing vessel 302 is cooled to an ordinary temperature to ensure a safe state for working. Then, the top cover 312 is removed and the wafers W are taken out of the processing vessel 302 to complete the process. Since the atmosphere around the processing vessel 302 is evacuated through the sink box 453, the ozone gas 305 does not diffuse into the surroundings when the processing vessel 302 is opened.

Subsequently, the wafers W are delivered to a rinsing apparatus to rinse the wafers W with pure water. Since the resist films 30 (FIG. 3) have been altered into water-soluble films 32, the water-soluble films 32 can be easily removed from the wafers W by rinsing. Then, the wafers W are transferred to a drying apparatus to dry the clean wafers W.

The steam 303 condenses excessively if the temperature of the wafers W is excessively lower than the dew point of the steam 303 and a large amount of water drops form on the surfaces of the wafers W. In this embodiment, the control unit 356 controls the hot air supply unit 307 to heat the wafers W at the predetermined temperature and controls the steam supply unit 304 to supply the steam 303 of the predetermined temperature at a predetermined flow rate so that the temperature of the wafers W is lower than the dew point of the steam 303 by an optimum difference. Consequently, the steam 303 condenses properly in thin pure water films on the wafers W. The ozone gas 305 is able to dissolve uniformly in the thin pure water films and a condition in which the ozone gas 305 dissolves only in a surface layers of thick pure water films can be avoided. Since the hot air supply unit 307 heats the wafers W at the temperature lower than the dew point of the steam 303 and in a temperature range suitable for active oxidation reaction, the process using ozone can be promoted.

Since the steam 303 is supplied into the processing vessel 302 after the wafers W have been heated at the predetermined temperature, a condition in which the steam 303 is applied to the wafers W of an ordinary temperature and a large amount of pure water drops forms on the wafers W can be avoided, the formation of thin pure water films can be ensured, the reduction of the processing ability can be prevented and the pure water films can be quickly and easily formed.

The steam supply unit 304 supplies the steam 30 continuously and the ozone gas supply unit 306 supplies the ozone gas 305 continuously during the cleaning process. Consequently, the ozone gas 305 dissolves in the pure water film continuously. Thus, the thin pure water film is replenished with ozone as ozone is consumed for reaction and sufficient ozone is applied quickly to the resist film through the thin pure water film to maintain a high reaction rate. Thus, the cleaning process can be actively carried out. Preferably the pure water film and the ozone-water film are formed in a thickness that will not form water drops.

After the wafers W have been carried out of the cleaning apparatus 300, liquids are drained from the processing vessel 302 through the first drain line 490 and the atmosphere in the processing vessel 302 is discharged through the discharge headers 450. Then, the cool air supply unit 308 supplies cool air into the processing vessel 302 to purge the processing vessel 302 of the ozone gas 305 and the steam 303. After thus drying the interior of the processing vessel 302, wafers W of an ordinary temperature to be cleaned by the next cleaning cycle are carried into the processing vessel 302. Since the steam supply unit 304 is separate from the processing vessel 302, the steam 303 does not remain in the processing vessel 302, the moisture content of the atmosphere in the cleaning vessel 302 can be adjusted and the interior of the cleaning vessel can be easily dried. Consequently, it is possible to prevent the condensation of the steam 303 remaining in the processing vessel 302 in many water drops on the wafers W of an ordinary temperature to be cleaned by the next cleaning cycle. The wafers W placed in the processing vessel 302 are not affected by the heat of the cartridge heater 354 of the steam supply unit 304 and hence the wafers W are not heated excessively beyond a desired temperature. Therefore, it is possible to prevent, for example, an undesirable condition in which the wafers W are heated at an excessively high temperature above the dew point of the steam 303, the steam 303 has difficulty in condensing on the surfaces of the wafers W, pure water films cannot be formed on the surfaces of the wafers W and a cleaning process using ozone cannot be achieved.

The present invention is not limited in its practical application to the foregoing embodiment and, various modifications are possible. For example, the steam 303 and the ozone gas 305 may be simultaneously supplied into the processing vessel 302 instead of supplying the ozone gas 305 after supplying the steam into the processing vessel 302. When the steam 303 and the ozone 305 are supplied simultaneously into the processing vessel 302, the steam 303 and the ozone gas 305 are mixed in an upper region of the interior of the processing vessel 302 to produce a steam-ozone mixed gas containing a large amount of oxygen and hydrogen radicals. When the steam-ozone mixed gas touches the wafers W, the radicals, similarly to the ozonic water films, cause an oxidation reaction, whereby the resist forming the resist films is decomposed into a carboxylic acid, carbon dioxide, water and such. Thus, the radicals produced in the steam-ozone mixed gas are used immediately and react directly with the resist films before the same disappear and hence the steam-ozone mixed gas is able to exercise a high cleaning ability. The steam-ozone mixed gas may be supplied so as to flow downward from an upper region of the interior of the processing vessel 302. When the steam-ozone mixed gas is thus supplied, the steam-ozone mixed gas can be sufficiently and uniformly applied to the wafers W, which further enhances the cleaning ability of the steam-ozone mixed gas. Since the steam-ozone gas is produced continuously in the upper region of the interior of the processing vessel 302 and the steam-ozone mixed gas is applied quickly to the wafers W, the cleaning process can be actively carried out. The steam-ozone mixed gas condenses properly on the surfaces of the wafers W and ozonic water films containing a large amount of oxygen and hydrogen radicals can be immediately formed on the surfaces of the wafers W. Therefore, the resist films can be sufficiently oxidized, decomposed and converted into water-soluble films.

Although the discharge unit 309 of this embodiment discharges the atmosphere in the processing vessel 302 through the discharge headers 450 and the first discharge line 457, discharge rate at which the atmosphere in the processing vessel 302 is discharged through the first discharge line 457 may be adjusted. An discharge unit 510 shown in FIG. 34 may be used instead of the discharge unit 309. As shown in FIG. 34, the discharge unit 510 has a first discharge line 457 provided with a flow control valve 511. The flow control valve 511 is controlled by the control unit 356. The processing vessel 302 is provided with a pressure sensor 512 connected to the control unit 356. The control unit 356 controls the opening of the flow control valve 511 on the basis of a signal given thereto by the pressure sensor 512.

During the cleaning process, the opening of the flow control valve 511 is adjusted to adjust the flow rate of the gas flowing through the first discharge line 457 so that the pressure of the atmosphere in the processing vessel 302 is adjusted to, for example, 196 kPa to increase the ozone concentration of the atmosphere in the processing vessel 302 to increase the dissolution of the ozone gas 305 into the pure water films. Thus, pure water films of a very high ozone concentration can be formed on the wafers W, which further enhances the processing ability.

It is preferable to supply a small amount of catalyst gas, such as $NO_x$ gas, into the processing vessel 302 to promote the production of oxygen radicals in the liquid films for the activation of oxidation reaction.

The cleaning apparatus described with reference to FIGS. 16 to 34 is capable of properly condensing steam on the wafers W in thin pure water films, of dissolving the ozone gas in the pure water films to form liquid films having a high processing ability on the wafers W immediately before using the liquid film.

Figure 37:
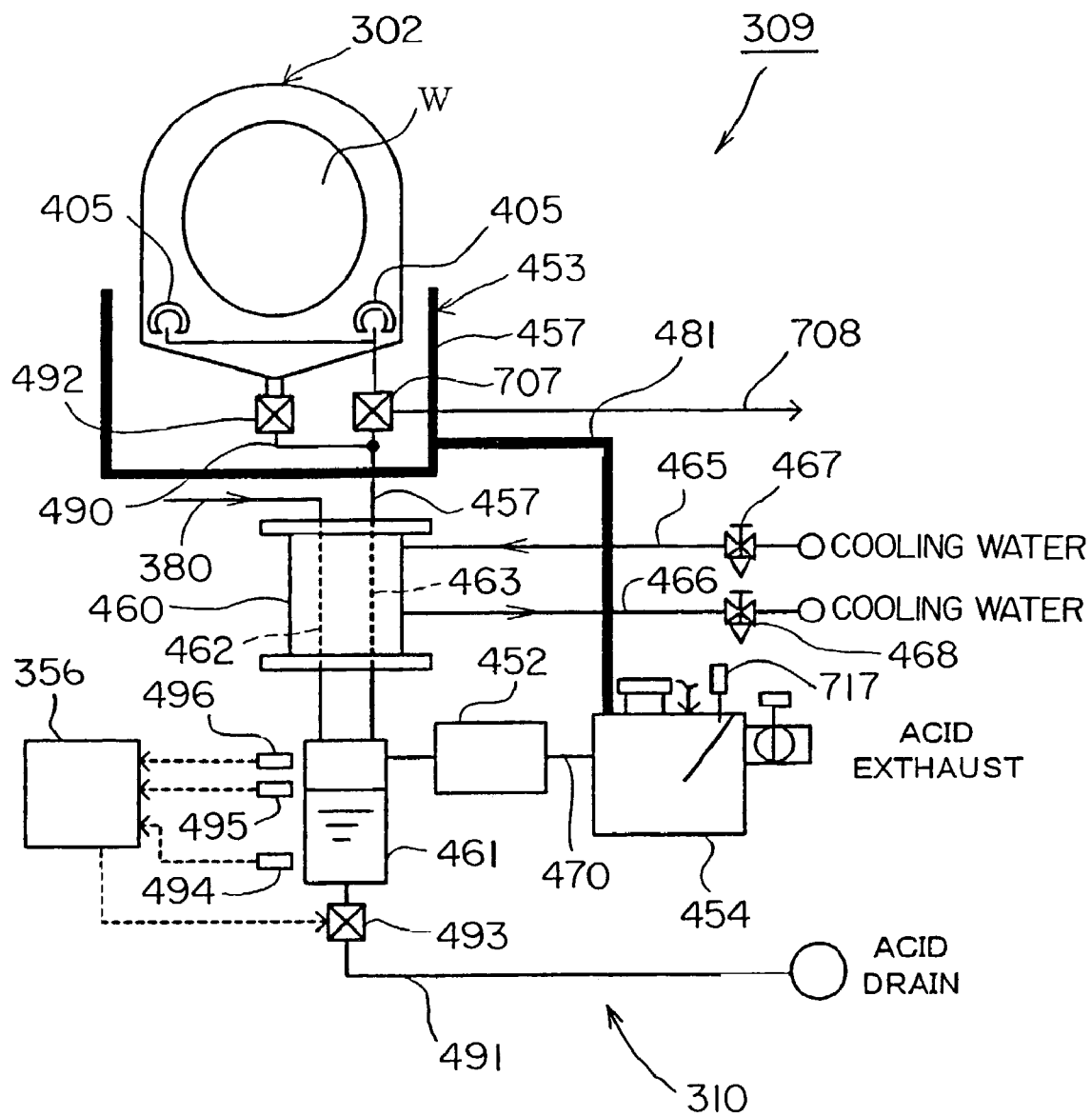
FIG. 37 is a piping diagram of modifications of the hot air supply unit and the cool air supply unit of the cleaning apparatus shown in FIG. 16.

FIGS. 35 to 37 show modifications of components of the cleaning apparatus previously described with reference to FIGS. 16 to 34. FIG. 35 shows a steam supply unit in a modification of the steam supply unit 304 shown in FIG. 20. The steam supply unit 304 shown in FIG. 35 differs from that shown in FIG. 20 in that a temperature sensor 657 is placed between the shutoff valve 376 in the steam supply line 342 and the shutoff valve 381. The temperature sensor 657 measures the temperature of steam generated by the steam generator 341, the shutoff valve 381 is kept open to discharge steam into the mist trap 451 until the operating condition of the steam generator 341 is stabilized.

FIG. 36 shows modifications of the hot air supply unit and the cool air supply unit shown in FIG. 24. A hot air supply unit and a cool air supply unit shown in FIG. 36 differ from the hot air supply unit and the cool air supply unit shown in FIG. 24 in that the cool air supply line 445 is provided with a temperature sensor 694. When supplying air into the processing vessel 302, the shutoff valve 412 is closed and the shutoff valve 446 is opened. Air supplied from the air source 406 flows through the cool air supply line 445 bypassing the hot air generator 401 into the hot air supply line 402 and is ejected through the air supplying nozzles 404 into the processing vessel 302. An air discharge line 695 provided with a shutoff valve 696 is connected to the cool air supply line 445 to discharge air into the discharge header 454.

Figure 38:
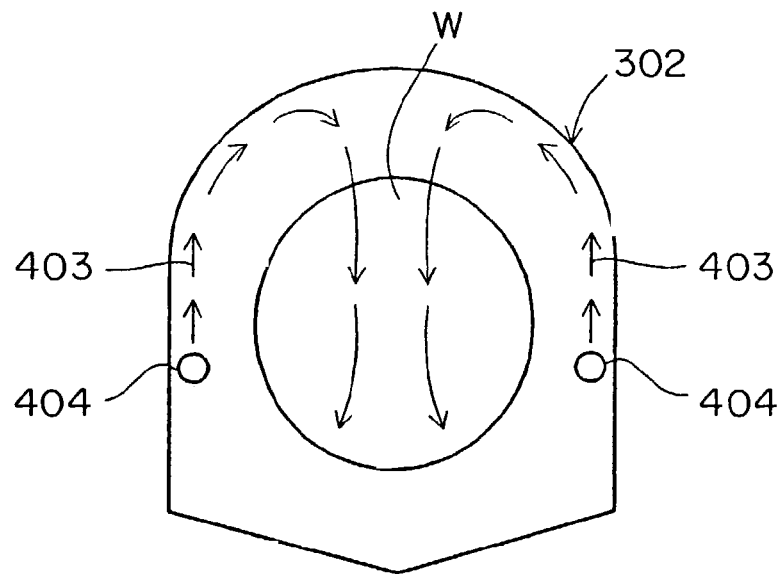
FIG. 38 is a diagrammatic view for explaining down flow of hot air along a wafer.

As shown in FIG. 38, the air supplying nozzles 404 eject air upward along the inner surface of the processing vessel 302. Hot air 403 ejected through the air supplying nozzles 404 flows toward an upper region of the interior of the processing vessel 302 along the inner surface of the processing vessel 302, and then flows downward toward the wafers W to heat the wafers W uniformly.

FIG. 37 shows a discharge unit 309 in a modification of the discharge unit 309 shown in FIG. 28. The discharge unit shown in FIG. 37 differs from that shown in FIG. 28 in that the first discharge line 457, i.e., a gas discharge line for discharging the steam and the ozone gas supplied into the processing vessel 302 from the processing vessel 302, is provided with a three-way valve 707, and a hot air discharge line 708 is connected to the three-way valve 707. The discharge header 454 connected to the second discharge line 470 connected to the discharge unit 461 of the mist trap 451 is provided with an ozone concentration measuring device 717 for measuring the ozone concentration of the gas discharged into the discharge header 454. The ozone removing ability of the ozone killer 452 is estimated on the basis of ozone concentration measured by the ozone concentration measuring device 717. Thus, the ozone removing ability of the ozone killer 452 is monitored to prevent discharge of a gas having a high ozone concentration due to the malfunction of the ozone killer 452.

A cleaning method to be carried out by the cleaning apparatus 300 employing the foregoing modifications will be described. First, the three-way valve 707 (FIG. 37) is set so as to connect the processing vessel 302 to the hot air discharge line 708, and then the hot air 403 is ejected into the processing vessel 302 to heat the wafers W. Since the hot air 403 is harmless to the human body, any special harmful substance removing device does not need to be placed in the hot air discharge line 708. Therefore, the hot air-discharge line 708 consists of only pipes to reduce pressure loss in the hot air 403 flowing through the hot air discharge line 708 to the least possible extent.

When processing the wafers W by using the steam 303 and the ozone gas 305 and when purging the atmosphere in the processing vessel 302 after the completion of the cleaning process, the three-way valve 707 is set so as to connect the processing vessel 302 to the mist trap 451 (460, 461) to discharge the steam 303 and the ozone gas 305 from the processing vessel 302 through the discharge headers 405 and the first discharge line 457 into the discharge unit 461 of the mist trap 451. Since cooling water is supplied through the cooling water supply line 465 to the cooling unit 460 of the mist trap 451, the steam 303 discharged from the processing vessel 302 into the mist trap 451 is cooled and made to condense in water drops and the water drops are collected in the discharge unit 461 The ozone gas 305 flows into the discharge unit 461. The gas discharged from the processing vessel 302 is thus divided into the ozone gas and water drops. The ozone killer 452 removes ozone from the gas discharged into the discharge unit 461 of the mist trap 451 while the gas is flowing through the gas discharge line 470 to discharge a harmless gas outside. When processing the wafers W by using the steam and the ozone gas, a pressurized atmosphere can be created in the processing vessel 302 by controlling the position of the three-way valve 707, the shutoff valve 492 and a flow control valve placed in the gas discharge line 457.

Steam and pure water discharged from the steam generator 341 flow through the steam discharge line 380 into the discharge unit 461 of the mist trap 451; the water drips into the discharge unit 461, the steam is cooled and condenses in water drops while the same is flowing through the cooling unit 460, and the water drops drip into the discharge unit 461.

The cleaning method to be carried out by the cleaning apparatus 300 will be described with reference to FIGS. 3, 4 and 5, a flow chart shown in FIG. 39 and a graph shown in FIG. 40. A predetermined temperature referred to in the following description is supposed to be in the range of, for example, 80 to 120° C.

As shown in FIG. 3, fifty wafers W each provided with a resist film 30 are transferred by a carrying mechanism, not shown, to the wafer boat 6, the wafer boat 6 holding the wafers W is placed in the processing vessel 302, and top cover 312 is put on the processing vessel 302. Then, the control unit. 356 energizes the rubber heaters 430, 431 and 432 to heat the walls of the processing vessel 302 so as to heat the atmosphere in the processing vessel 302 at 80° C. Meanwhile, air heated at a temperature in the range of, for example, 200 to 300° C. is ejected through the air supplying nozzles 404 into the processing chamber 302 at an ejection rate of, for example, 100 l/min to heat the wafers W in step S1 (FIG. 39) for a time interval between times T1 and T2 (FIG. 40). Desirably, the rubber heaters 430, 431 and 432 are energized to heat the walls of the processing vessel 302 before carrying the wafers W into the processing vessel 302.

As shown in FIG. 38, the air supplying nozzles 404 eject hot air 302 upward along the inner surface of the processing vessel 302. The hot air 403 ejected through the air supplying nozzles 404 flows toward an upper region of the interior of the processing vessel 302 along the inner surface of the processing vessel 302, and then flows downward toward a bottom region of the interior, of the processing vessel 302 heating the wafers W. Thus, the wafers W can be quickly and uniformly heated. The hot air 403 is circulated by convection in the processing vessel 302. All the fifty wafers W can be uniformly heated at 80° C. by the circulating hot air 403.

Since the wafers W can be intensively heated with the hot air 403, the wafers W can be heated to the predetermined temperature in a short heating time of, for example, 2 min. If the wafers W are heated rapidly to the predetermined temperature by using only the rubber heaters 430, 431 and 432, the walls of the processing vessel 302 are heated to an excessively high temperature above the predetermined temperature. Since the walls of the processing vessel 302 have a large heat capacity, it takes a long time to stabilize the walls of the processing vessel 302 heated to an excessively high temperature at the predetermined temperature. Thus use of the hot air 403 for heating the wafers W prevents heating the walls of the processing vessel 302 to an excessively high temperature and omits time and work necessary for stabilizing the temperature of the processing vessel 302.

During the wafer heating operation, the three-way valve 707 (FIG. 37) is set so as to connect the processing vessel 302 to the hot air discharge line 708 to discharge the atmosphere in the processing vessel 302 outside through the hot air discharge line 708. As mentioned above, the hot air must be supplied into the processing vessel 302 at 100 l/min to heat the wafers quickly. The pressure in the processing vessel 302 does not rise excessively even if the hot air is supplied at such a high flow rate into the processing vessel 302 because the atmosphere in the processing vessel 302 is discharged through the hot air discharge line 708. Consequently, it is possible to prevent a dangerous accident, such as the breakage of the window 323 (FIG. 17) of the top cover 312.

Figure 39:
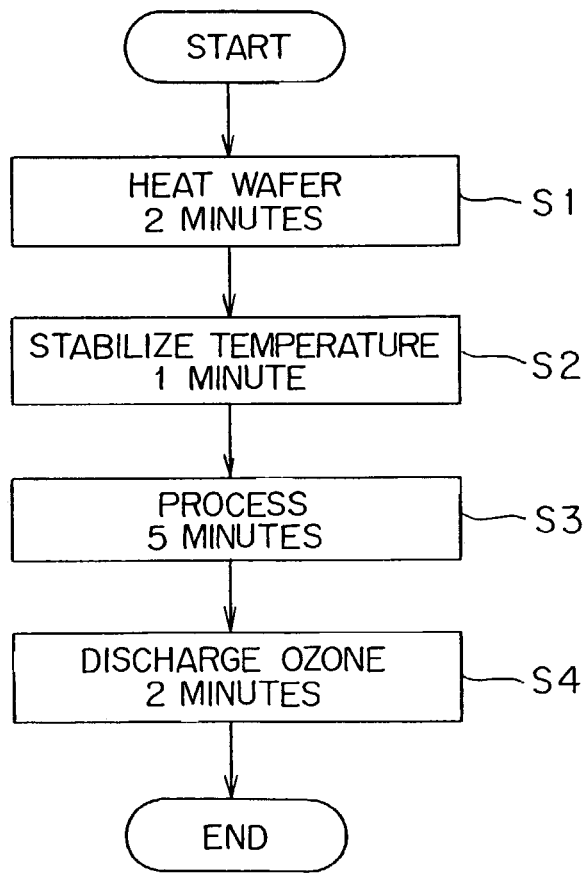
FIG. 39 is flow chart of a cleaning method to be carried out by a cleaning apparatus in a modification of the cleaning apparatus shown in FIG. 16.
Figure 40:
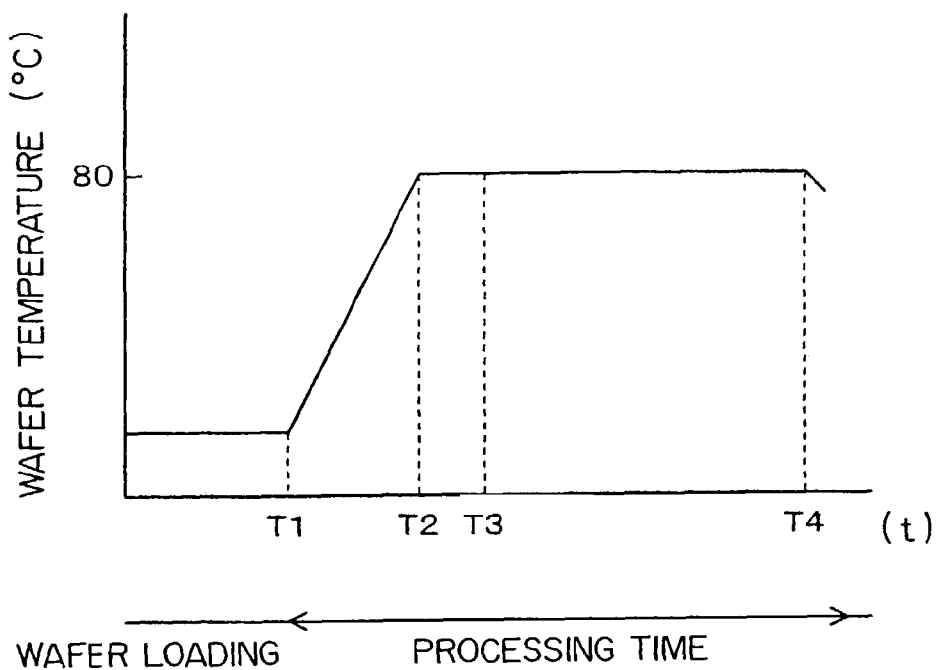
FIG. 40 is a graph for explaining a cleaning method to be carried out by the cleaning apparatus in the modification of the cleaning apparatus shown in FIG. 16.

The supply of the hot air 403 is stopped after the wafers W have been heated at 80° C., the processing vessel 302 is left as it is for, for example, 1 min, i.e., a time interval between times T2 and T3 in FIG. 40, to stabilize the temperature of the wafers W in step S2 (FIG. 39). The control unit 356 continues to energize the rubber heaters 430, 431 and 432 to maintain the atmosphere in the processing vessel 302 at 80° C. after the supply of the hot air 403 has been stopped. In the time interval between the times T2 and T3, the atmosphere in the processing vessel 302 surrounding the wafers W is maintained uniformly at the predetermined temperature to improve temperature distribution in the surface of each wafer W. The hot air 403 is discharged through the hot air discharge line 708. Since air has a high heat conductivity, the energy of the hot air 403 is not accumulated in the processing vessel 302 and is dissipated outside immediately and hence the wafers W will not be excessively heated when the supply of the hot air 403 is stopped. Since the hot air 403 is used for heating the wafers W, the wafers W are not heated at temperatures beyond the predetermined temperature and the wafers W can be quickly heated.

In step S3, the steam 303 and the ozone gas 305 are supplied into the processing vessel 302 to subject the wafers W to the cleaning process using ozone for 5 min between times T3 and T4 in FIG. 40. As mentioned previously in the description made in connection with FIG. 10, an ozone-water molecular layer containing water molecules 161 and ozone molecules 162 is formed on the surface of each wafer W. The water molecules 161 and the ozone molecules 162 interact in the ozone-water molecular layer to produce a large amount of reactive substances, such as oxygen radicals and hydroxyl radicals. The hydroxyl radicals thus produced on the surfaces of the wafers W do not disappear, cause an oxidation reaction immediately, and decompose the resist forming the resist films into a carboxylic acid, carbon dioxide, water and such. Consequently, the resist forming the resist films is thoroughly oxidized and decomposed and the resist films are altered into water-soluble films. The water-soluble films can be easily removed by rinsing using pure water. During the process using ozone, the three-way valve 707 may be set so as to connect the processing vessel 302 to the hot air discharge line 708 to discharge the atmosphere in the processing vessel 302.

Subsequently, in step S4 (FIG. 39), the supply of the steam 303 and the ozone gas 305 is stopped and the processing vessel 302 is purged of ozone for 2 min after the time T4 (FIG. 40). The three-way valve 707 is set so as to connect the processing vessel 302 to the first discharge line 457, air of an ordinary temperature is ejected through the air supplying nozzles 404 into the processing vessel 302 to purge the processing vessel 302 of the steam 303 and the ozone gas 305. The atmosphere in the processing vessel 302 discharged from the processing vessel 302 is cooled by the cooling unit 460 of the mist trap 451 to condense the steam 303 in pure water. The pure water drips into the discharge unit 461. The ozone gas 305 is discharged through the discharge unit 461 of the mist trap 451 and the second discharge line 470. The ozone killer 452 removes ozone from the gas discharged into the discharge unit 461 of the mist trap 451 while the gas is flowing through the gas discharge line 470 to discharge a harmless gas outside. Thus, one cleaning cycle, i.e., steps S1 to S4, of the cleaning process takes 10 min. The shutoff valve 492 is opened to drain the liquid collected in the processing vessel 302 through the first drain line 490. The steam 303 and the ozone gas 305 may be removed from the processing vessel 302 by evacuation instead of by purging.

Then, the top cover 312 is removed and the wafers W are taken out of the processing vessel 302 to complete the cleaning process. The wafers W are carried to a rinsing apparatus by a wafer carrying mechanism and the wafers W are rinsed with pure water. Since the resist films of the wafers W are altered into water-soluble films, the water-soluble films can be easily removed from the wafers W by the rinsing apparatus. Then, the wafers W are carried from the rinsing apparatus to a drying apparatus by the wafer carrying mechanism to subject the wafers W to a drying process.

The wafers W can be quickly heated at 80° C. by heating the walls of the processing vessel 302 and the atmosphere in the processing vessel 302. The heating of the atmosphere in the processing vessel 302 is stopped and the walls of the processing vessel 302 are still heated after the temperature of the wafers W has reached 80° C. to prevent the excessive heating of the wafers W and to maintain the atmosphere in the processing vessel 302 and the wafers W at 80° C. After the passage of a predetermined time necessary to make temperature distribution in the processing vessel 302 uniform, the steam 303 and the ozone gas 305 are supplied into the processing vessel 302 and the process using ozone is carried out.

This cleaning method heats the walls of the processing vessel 302 and the atmosphere in the processing vessel 302 by the rubber heaters 430, 431 and 432, and heats the atmosphere in the processing vessel 302 and the wafers W by the hot air supply unit 307 using hot air instead of heating the walls of the processing vessel 302, the atmosphere in the processing vessel 302 and the wafers W by a single heating means. Therefore, the cleaning method is able to heat the wafers W quickly at 80° C., a sufficient processing time can be used without reducing throughput, and yield and productivity can be improved.

Since hot air is harmless to the human body, the hot air discharge line 708 does not need to be provided with any device that causes pressure loss, such as an ozone killer. The ozone gas is discharged through the first discharge line 457, and the second discharge line 470 provided with the ozone killer 452, and the hot air is discharged through the hot air discharge line 708. Therefore, the ozone gas can be safely discharged and the hot air used for heating the wafers can be quickly discharged. If the hot air is discharged at a high discharge rate through the second discharge line 470, the ozone killer 452 needs to be formed in large dimensions to avoid pressure loss, which increases the manufacturing cost of the cleaning apparatus. Since the hot air is discharged through the hot air discharge line 708, the ozone killer 452 may be formed in minimum dimensions necessary only for removing ozone, which keeps the manufacturing cost of the cleaning apparatus on a low level.

The air supplying nozzles 404 are disposed so that the hot air 403 flows upward along the inner surface of the processing vessel 302 and flows downward toward the wafers W, and the processing vessel 302 is left as it is for the predetermined time for stabilizing the temperature of the atmosphere in the processing vessel 302 at 80° C. Consequently, the atmosphere in the processing vessel 302 is maintained uniformly at the predetermined temperature even if fifty wafers are placed in the processing vessel 302 to improve temperature distribution in the surface of each wafer W and the process using ozone can be properly carried out.

The present invention is not limited in its application to the foregoing embodiments and various modifications are possible therein. For example, a small amount of air may be supplied into the processing vessel 302 to stir the atmosphere in the processing vessel 302 when making the atmosphere in the processing vessel 302 uniform. The supply of air into the processing vessel 302 to stir the atmosphere in the processing vessel 302 improves the uniformity of temperature distribution in the processing vessel 302. The atmosphere in the processing vessel 302 may be stirred by a stirring machine, such as a vane wheel. The processing vessel 302 may be internally provided with a vane wheel and the vane wheel may be operated to make temperature distribution in the processing vessel 302 uniform when stabilizing the atmosphere in the processing vessel 302.

Figure 41:
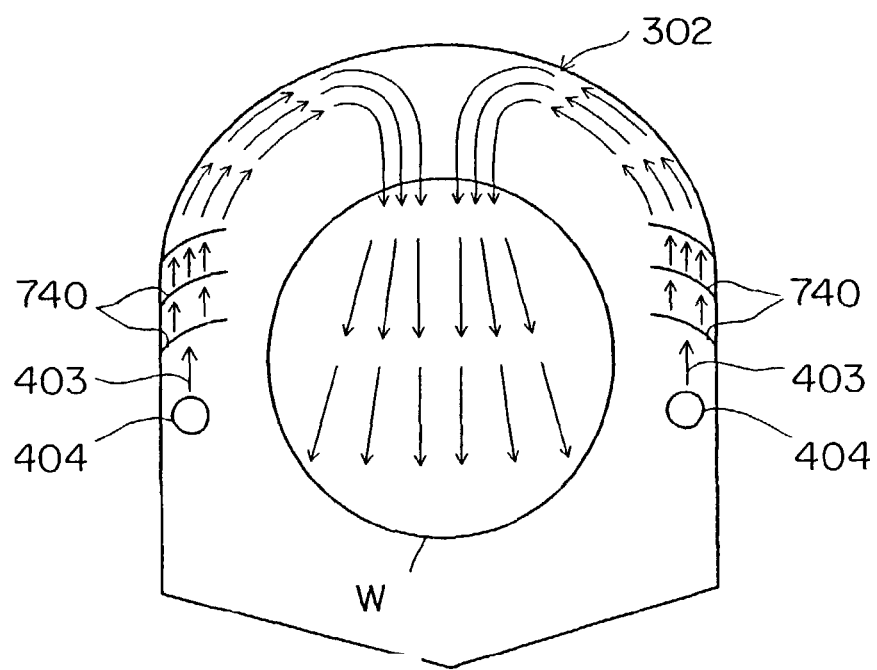
FIG. 41 is a diagrammatic view of assistance in explaining the down flow of hot air along a wafer when a processing vessel is provided with baffle plates on its inner surface.

The processing vessel 302 may be provided on its inner surface with baffle plates 740 as shown in FIG. 41 to diffuse the hot air 403. The baffle plates 740 diffuse the hot air 403 jetted upward through the air supplying nozzles 404 in the processing vessel 302, so that the hot air 403 can be more uniformly applied to the wafers W.

A gas having an appropriate specific heat, such as argon gas or helium gas, or an inert gas, such as nitrogen gas, may be used instead of the hot air. A lamp heater or the like may be employed instead of the hot air supply unit 307 to shorten the time necessary to heat the wafers W to the predetermined temperature by applying thermal energy intensively to the wafers W.

Although the invention has been described as applied to removing the resist films from the wafers by using ozone gas, the present invention is applicable to removing films other than the resist films. For example, the present invention is applicable to removing an organic film, such as BARC (bottom antireflective coating), that is formed under the resist film to improve resolution. The present invention may be applied to removing various deposits adhering to the surfaces of wafers by using a process gas other than ozone gas.

For example, metallic impurities and particles can be removed from wafers by using chlorine radicals produced in a hydrochloric acid film (HCl film) formed on the surfaces of the wafers by dissolving chlorine gas ($Cl_2$ gas) in pure water films. Particles and oxide films formed by natural oxidation can be removed from wafers by using fluorine radicals produced in a hydrofluoric acid film (HF film) formed on the surfaces of the wafers by dissolving fluorine gas ($F_2$) in pure water films.

Radicals may be produced in a process gas by exciting the process gas. Ozone gas containing oxygen radicals, chlorine gas containing chlorine radicals, hydrogen gas containing hydrogen radicals and fluorine gas containing fluorine radicals may be used to promote the cleaning process.

The present invention is applicable not only to cleaning wafers, but also to applying a predetermined processing liquid to the surfaces of wafers. The present invention is applicable not only to a batch processing system that processes a plurality of wafers in a batch, but also to a single-wafer processing system that processes wafers one at a time. The objects to be processed are not limited to wafers and may be LCD substrates, CDs, printed wiring boards, ceramic substrates or the like.

What is claimed is:

1. A substrate processing apparatus comprising:
   a processing vessel for processing a substrate therein, the substrate having a resist film on a surface thereof;
   a substrate holding member for holding the substrate in the processing vessel;
   a process gas supply section for supplying a process gas into the processing vessel;
   a solvent vapor supply section having a solvent heater for generating and heating the solvent vapor, a vapor supply line for supplying the solvent vapor into the processing vessel, a vapor heater for heating the solvent vapor flowing through the supply line, a temperature sensor for measuring a temperature of the vapor heater, and an overheat monitoring sensor for monitoring the overheat of the vapor heater;
   a main heater for heating the processing vessel; and
   means for controlling the solvent heater, the vapor heater based on the temperature measured by the temperature sensor while monitoring the overheat of the vapor heater through the monitoring sensor and the main heater, to heat the solvent vapor and the substrate within respective temperature ranges in which a mixed gas molecular layer of a mixture of molecules of the solvent vapor and molecules of the process gas is formed on the substrate to alter the resist film into a water-soluble substance.

2. The substrate processing apparatus according to claim 1, further comprising:
   a gas flow controller for controlling a supply rate of the process gas into the processing vessel; and
   a vapor flow controller for controlling a supply rate of the solvent vapor into the processing vessel.

3. The substrate processing apparatus according to claim 2, wherein the gas flow controller and the vapor flow controller are controlled by said means for controlling.

4. The substrate processing apparatus according to claim 2, further comprising a discharge flow controller for controlling a discharge rate from the processing vessel to maintain a pressurized atmosphere in the processing vessel.

5. The substrate processing apparatus according to claim 1, further comprising a purge gas supply section for supplying a purge gas into the processing vessel to purge the processing vessel of the remaining process gas and solvent vapor.

6. The substrate processing apparatus according to claim 1, further comprising a hot gas supply section for supplying a hot gas into the processing vessel to heat an atmosphere in the processing vessel.

7. The substrate processing apparatus according to claim 1, wherein the process gas is an ozone gas and the solvent vapor is a water vapor.

8. The substrate processing apparatus according to claim 7, further comprising:
   a gas flow controller for controlling a supply rate of the ozone gas into the processing vessel; and
   a vapor flow controller for controlling a supply rate of the water vapor into the processing vessel.

9. The substrate processing apparatus according to claim 8, wherein the gas flow controller and the vapor flow controller are controlled by said means for controlling.

10. The substrate processing apparatus according to claim 8, further comprising a discharge flow controller for controlling a discharge rate from the processing vessel to maintain a pressurized atmosphere in the processing vessel.

11. The substrate processing apparatus according to claim 7, further comprising a mist trap connected to the processing vessel, the mist trap including:
    a cooling unit for cooling the discharged ozone gas and water vapor from the processing vessel to condense the discharged water vapor into a liquid water; and
    a discharge unit for receiving and discharging the ozone gas and the liquid water.

12. The substrate processing apparatus according to claim 11, wherein an ozone killer for killing the discharged ozone gas is connected to the discharge unit, and a drain for the liquid water is provided on a bottom of the discharge unit.

13. The substrate processing apparatus according to claim 7, further comprising a purge gas supply section for supplying a purge gas into the processing vessel to purge the processing vessel of the remaining ozone gas and water vapor.

14. The substrate processing apparatus according to claim 7, further comprising a hot gas supply section for supplying a hot gas into the processing vessel to heat an atmosphere in the processing vessel.

* * * * *